US012677535B2

(12) United States Patent
Eguchi et al.

(10) Patent No.: US 12,677,535 B2
(45) Date of Patent: Jul. 7, 2026

(54) METHOD FOR FABRICATING DISPLAY DEVICE INCLUDING A PLURALITY OF ELECTROLUMINESCENCE (EL) LAYERS WITH ORGANIC EL MATERIAL

(71) Applicant: Semiconductor Energy Laboratory Co., Ltd., Atsugi (JP)

(72) Inventors: Shingo Eguchi, Atsugi (JP); Hideki Uochi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 362 days.

(21) Appl. No.: 18/279,942

(22) PCT Filed: Mar. 1, 2022

(86) PCT No.: PCT/IB2022/051764
§ 371 (c)(1),
(2) Date: Sep. 1, 2023

(87) PCT Pub. No.: WO2022/189890
PCT Pub. Date: Sep. 15, 2022

(65) Prior Publication Data
US 2024/0155869 A1 May 9, 2024

(30) Foreign Application Priority Data
Mar. 11, 2021 (JP) ................................. 2021-039551

(51) Int. Cl.
*H10K 59/12* (2023.01)
*H10K 71/16* (2023.01)
*H10K 71/60* (2023.01)
(52) U.S. Cl.
CPC ....... *H10K 59/1201* (2023.02); *H10K 71/166* (2023.02); *H10K 71/60* (2023.02)

(58) Field of Classification Search
CPC .. H10K 59/1201; H10K 71/166; H10K 71/60; H05B 33/10
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001653855 A 8/2005
JP 2000-036385 A 2/2000
(Continued)

OTHER PUBLICATIONS

International Search Report (Application No. PCT/IB2022/051764) Dated May 31, 2022.
(Continued)

*Primary Examiner* — Changhyun Yi
(74) *Attorney, Agent, or Firm* — Eric J. Robinson; Robinson Intellectual Property Law Office, P.C.

(57) ABSTRACT

A method for fabricating a novel display device is provided. The method for fabricating the display device includes a step of forming an anode, a first EL layer, a first cathode, and a first layer in this order; a step of forming a first resist mask over the first layer; a step of selectively removing parts of the anode, the first EL layer, the first cathode, and the first layer; a step of removing part of the first resist mask; a step of selectively removing other parts of the first EL layer, the first cathode, and the first layer; and a step of removing the first resist mask. The first resist mask is formed using a multi-tone mask.

7 Claims, 33 Drawing Sheets

(56) References Cited

U.S. PATENT DOCUMENTS

| | | | |
|---|---|---|---|
| 7,534,557 B2 | 5/2009 | Tachikawa et al. | |
| 7,914,976 B2 | 3/2011 | Tachikawa et al. | |
| 9,716,208 B2 | 7/2017 | Dozen et al. | |
| 2002/0072139 A1 | 6/2002 | Kashiwabara | |
| 2003/0232563 A1 | 12/2003 | Kamiyama et al. | |
| 2005/0153058 A1 | 7/2005 | Tachikawa et al. | |
| 2008/0238297 A1* | 10/2008 | Oota | H10K 71/164 |
| | | | 313/500 |
| 2009/0191486 A1 | 7/2009 | Tachikawa et al. | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1* | 4/2013 | Hamaguchi | H10K 71/233 |
| | | | 430/319 |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1* | 9/2017 | Defranco | H10K 85/00 |
| 2018/0190908 A1 | 7/2018 | Ke et al. | |
| 2020/0203662 A1 | 6/2020 | Mollard et al. | |
| 2022/0209162 A1 | 6/2022 | Seo et al. | |

FOREIGN PATENT DOCUMENTS

| | | |
|---|---|---|
| JP | 2000-113982 A | 4/2000 |
| JP | 2003-059663 A | 2/2003 |
| JP | 2003-157973 A | 5/2003 |
| JP | 2003-332051 A | 11/2003 |
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-123527 A | 7/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| KR | 10-0931279 | 12/2009 |
| KR | 2014-0020674 A | 2/2014 |
| KR | 2015-0029997 A | 3/2015 |
| WO | WO-2003/096754 | 11/2003 |

OTHER PUBLICATIONS

Written Opinion (Application No. PCT/IB2022/051764) Dated May 31, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 3

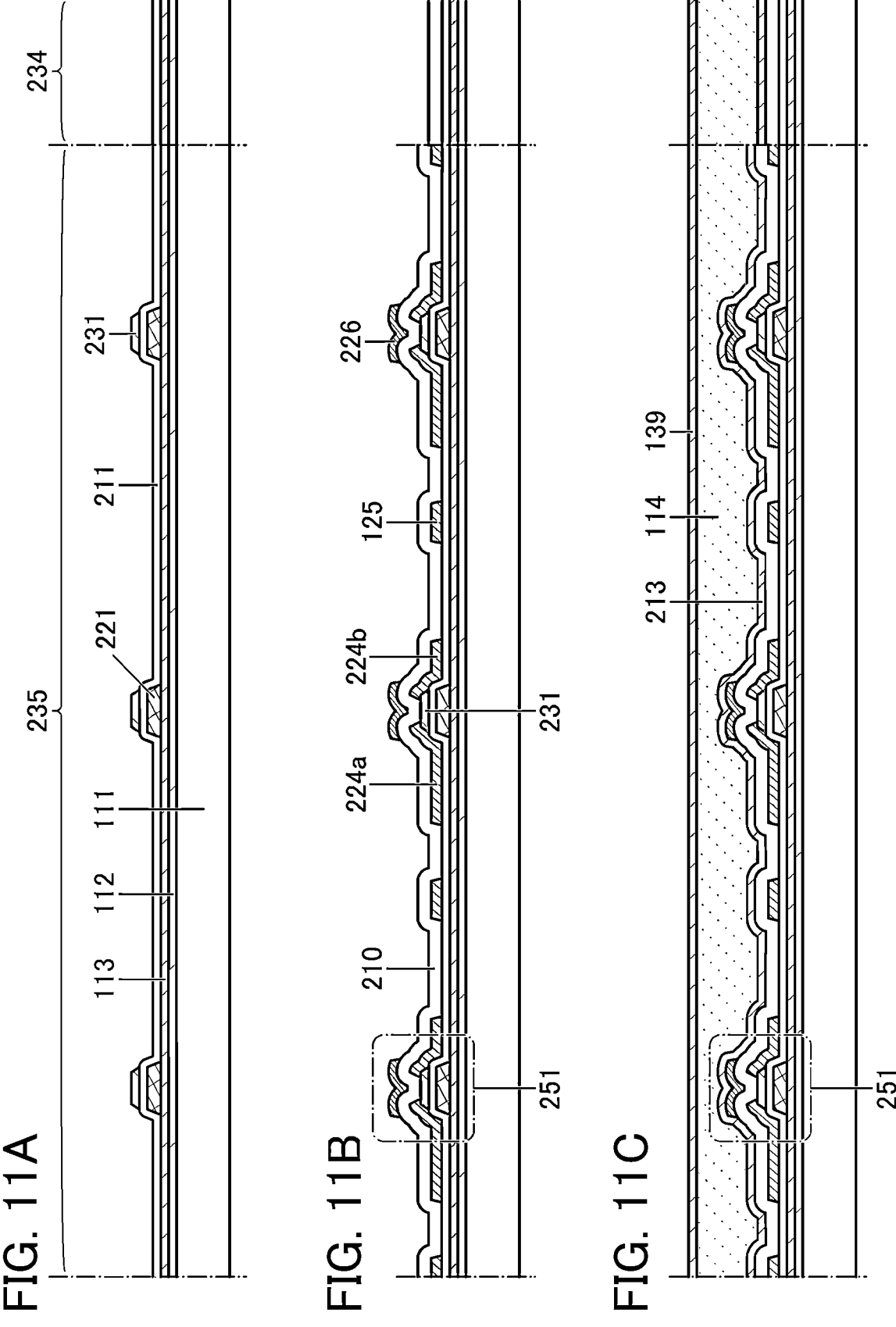

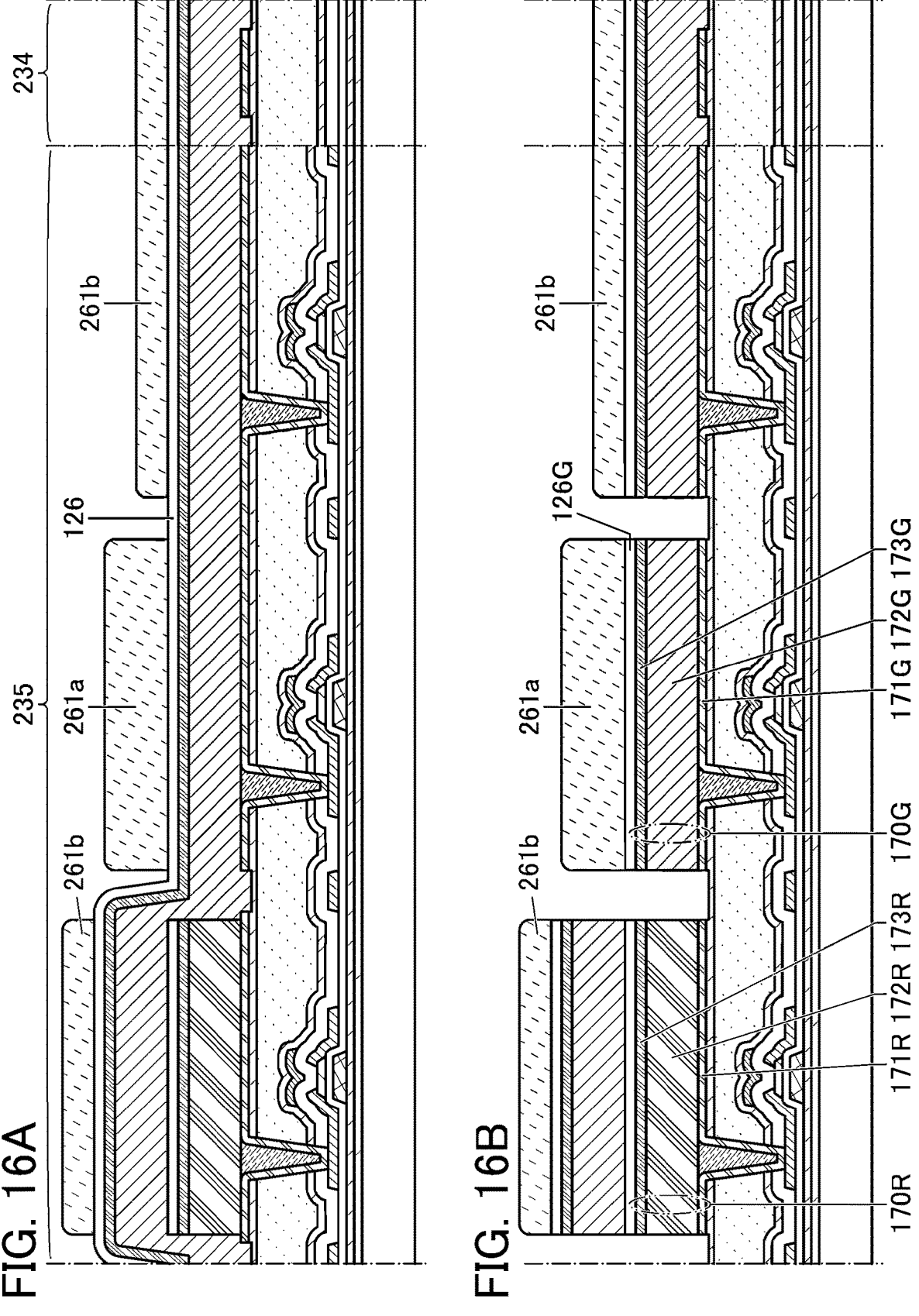

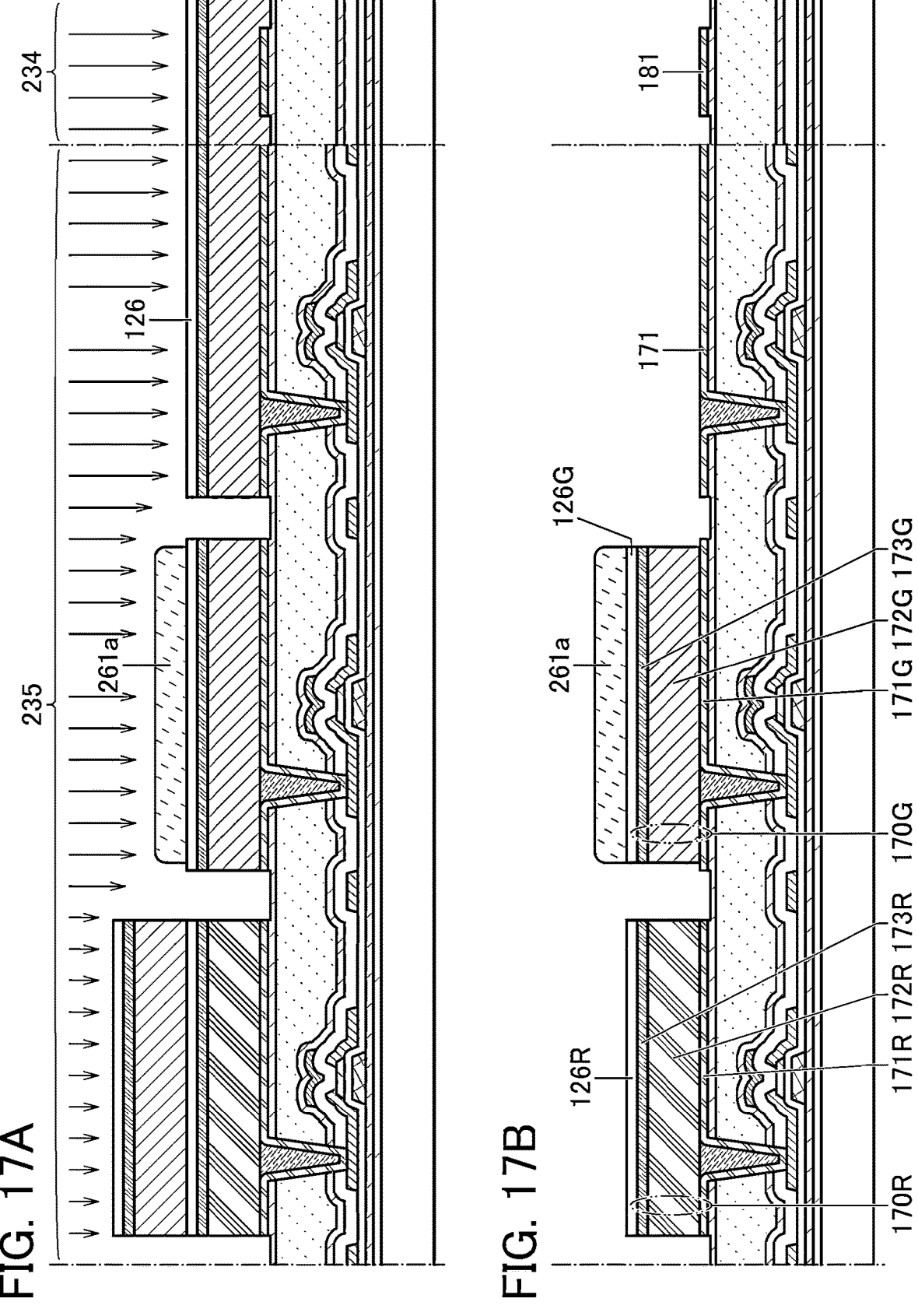

FIG. 23A
Intermediate state
New crystalline phase
| Amorphous | Crystalline | Crystal |
|---|---|---|
| •completely amorphous | •CAAC •nc •CAC excluding single crystal and poly crystal | •single crystal •poly crystal |
FIG. 23B
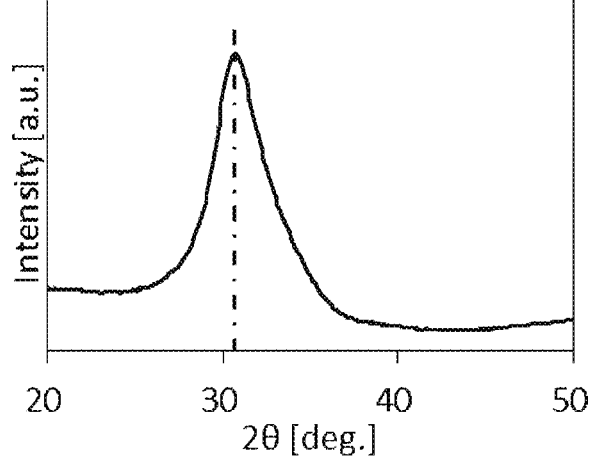
FIG. 23C
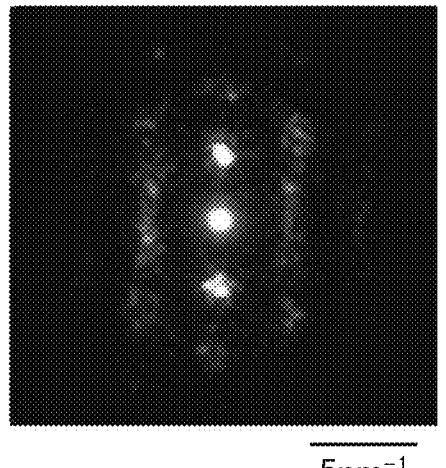
5nm⁻¹

FIG. 24A1
FIG. 24A2
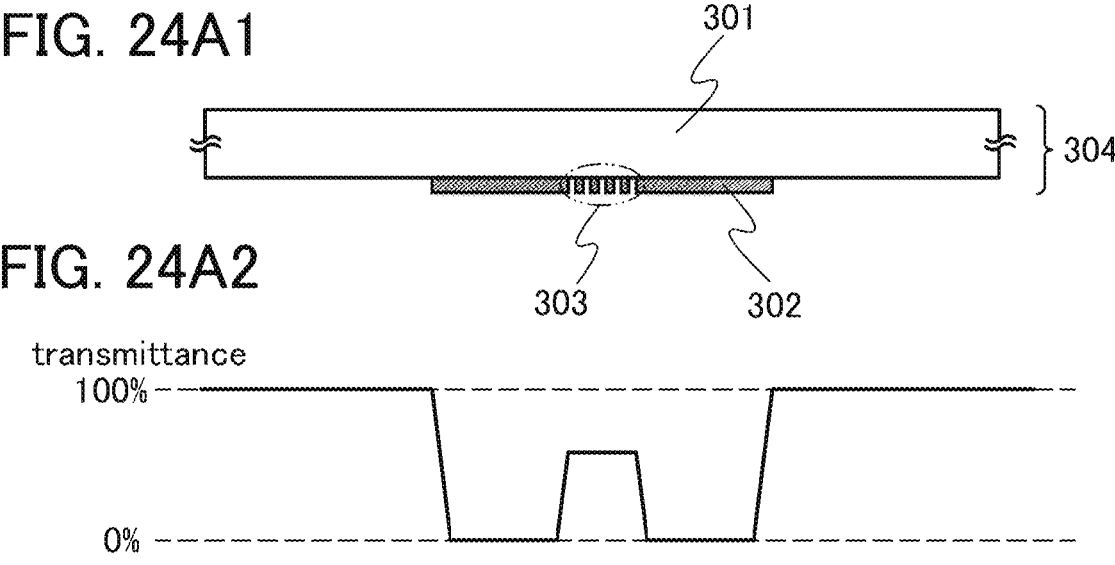
FIG. 24B1
FIG. 24B2
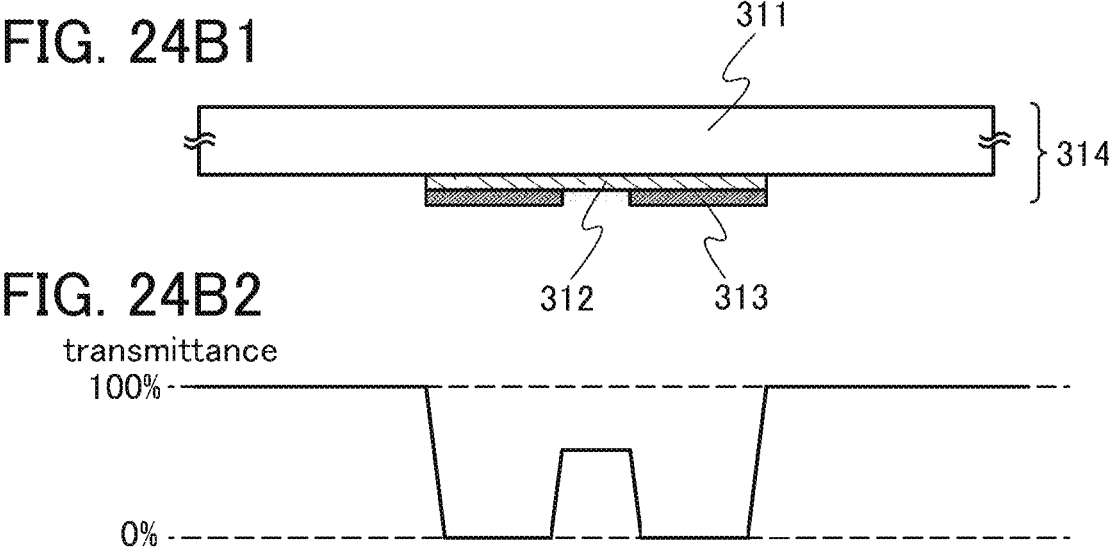

FIG. 25A
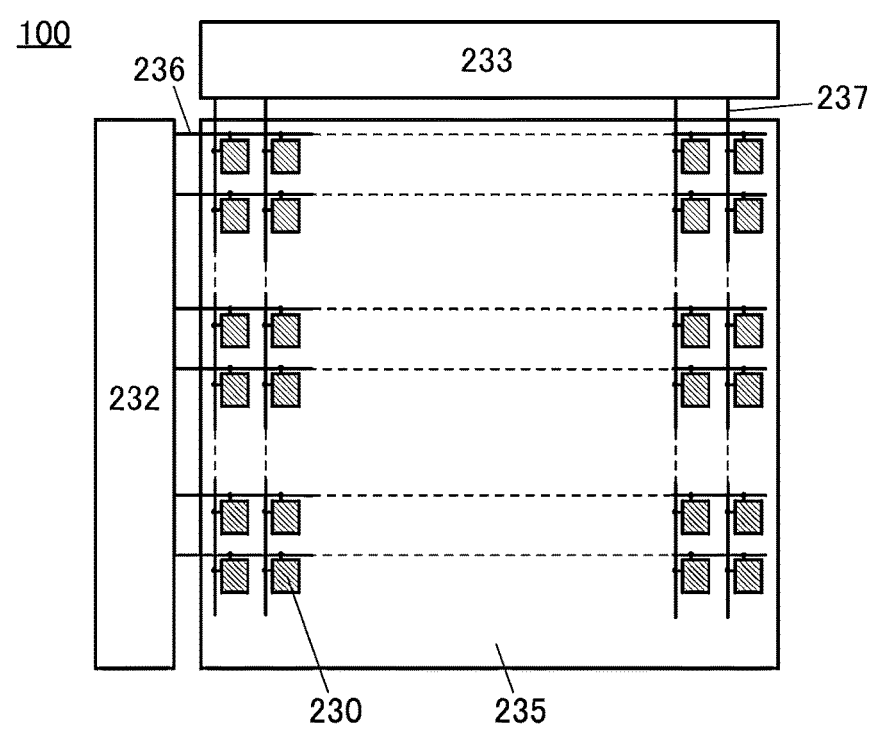
FIG. 25B1   FIG. 25B2   FIG. 25B3   FIG. 25B4
FIG. 25B5   FIG. 25B6   FIG. 25B7
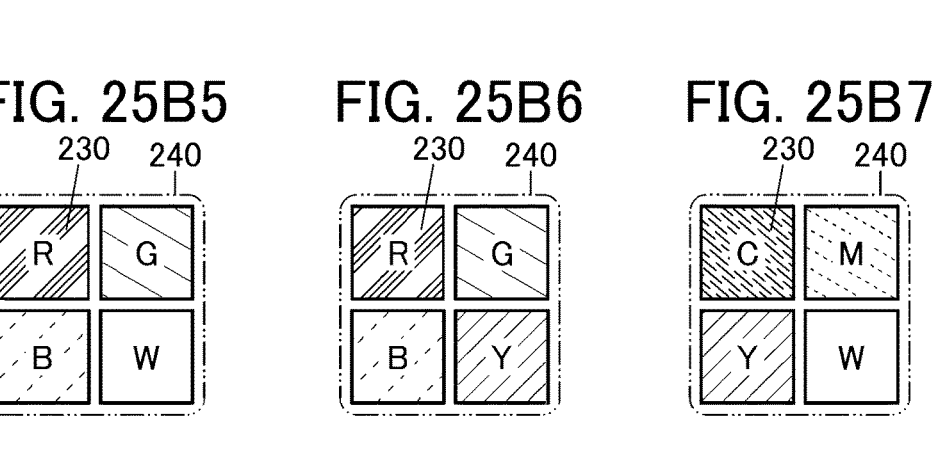

70A

70A

70A

70B

70B

70B

FIG. 32A
7100
FIG. 32B
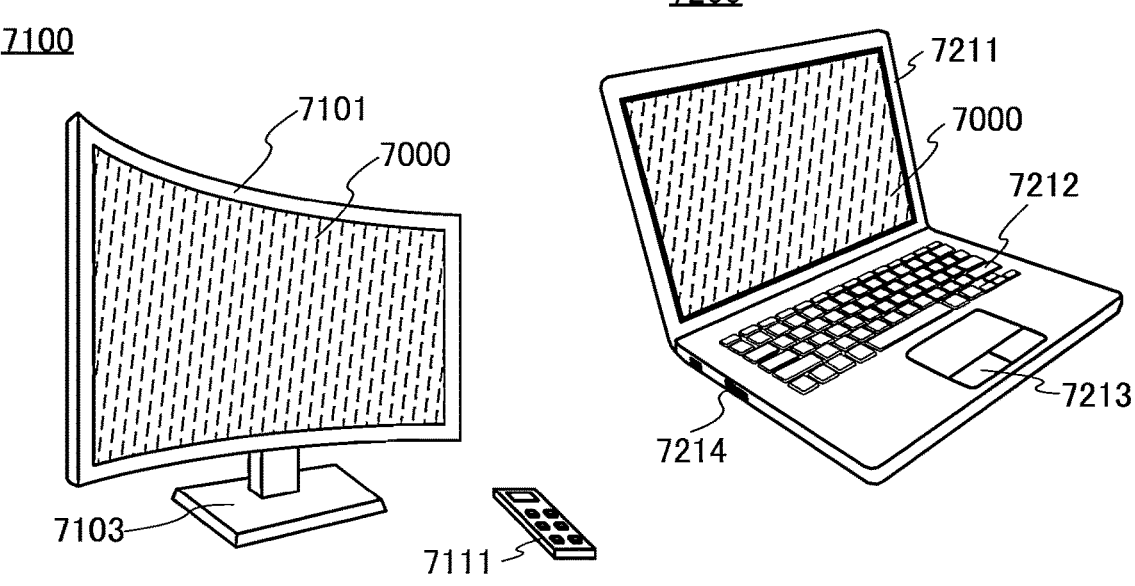
FIG. 32C
FIG. 32D
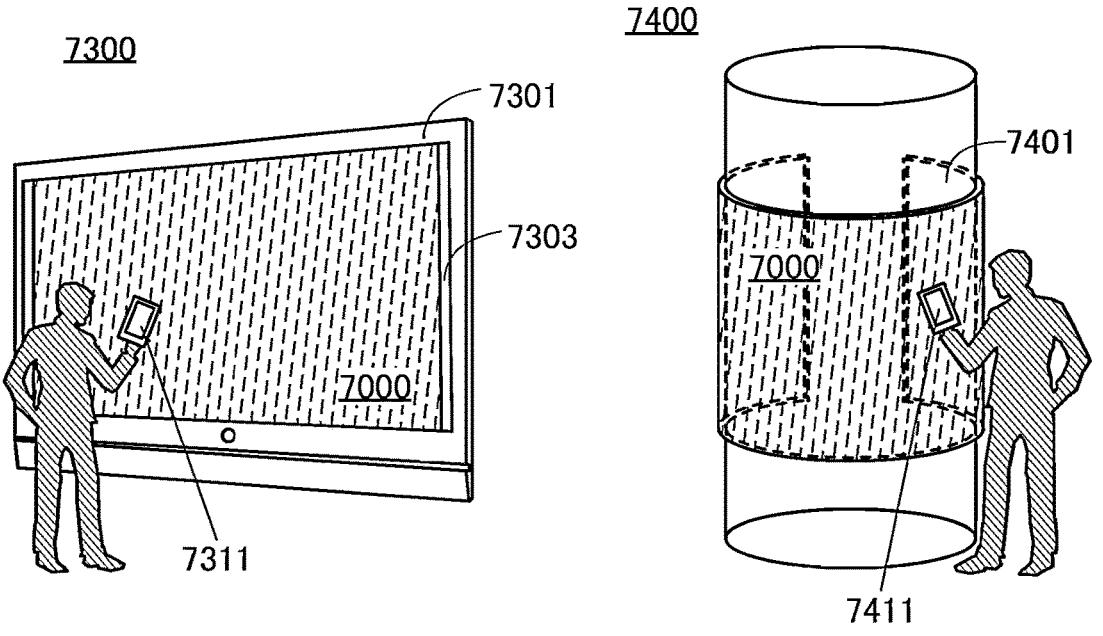

FIG. 33A
9101
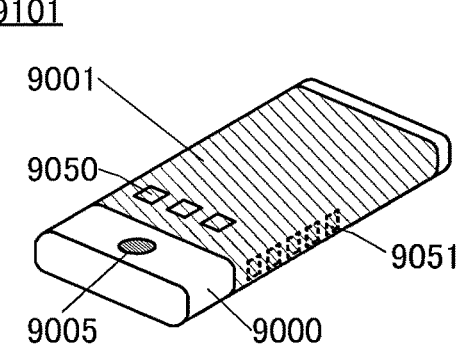
FIG. 33B
9102
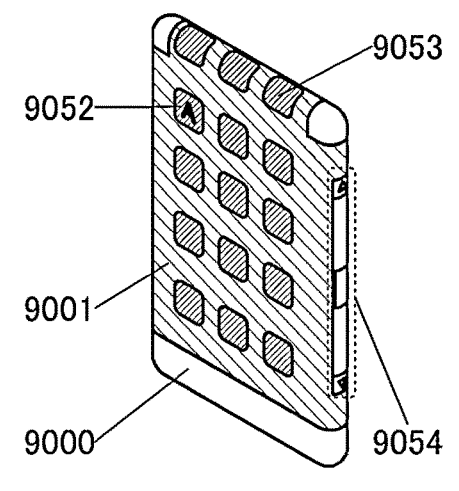
FIG. 33C
9200
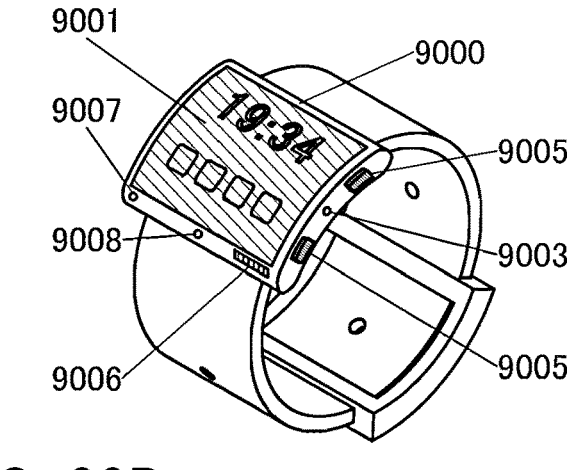
FIG. 33D
9201
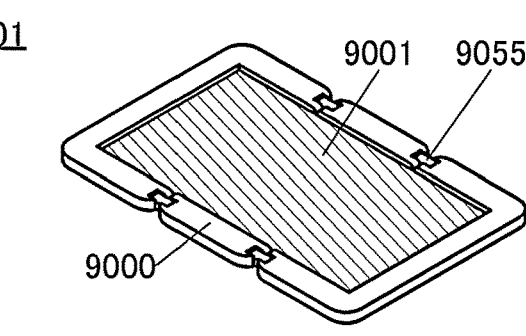
FIG. 33E
9201
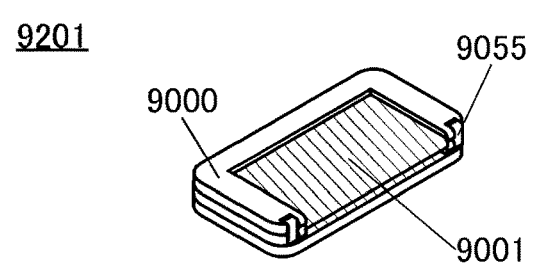
FIG. 33F
9201

METHOD FOR FABRICATING DISPLAY DEVICE INCLUDING A PLURALITY OF ELECTROLUMINESCENCE (EL) LAYERS WITH ORGANIC EL MATERIAL

TECHNICAL FIELD

One embodiment of the present invention relates to a method for fabricating a display device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display device, a light-emitting apparatus, a power storage device, a memory device, a driving method thereof, and a manufacturing method thereof.

BACKGROUND ART

An active-matrix display device where a transistor for driving a display element is provided in each pixel is known as a display device. For example, an active-matrix liquid crystal display device (also referred to as a "liquid crystal display") that uses a liquid crystal element as a display element, an active-matrix light-emitting display device (also referred to as an "organic EL display") that uses a light-emitting element (also referred to as a "light-emitting device") such as an organic EL element as a display element, and the like are known.

An organic EL display is a self-luminous display device, and thus has a wider viewing angle and higher responsiveness than a liquid crystal display. In addition, an organic EL display does not need a backlight, which makes it easy to achieve a reduction in weight, thickness, power consumption, or the like of the display device and leads to an active research in recent years. An organic EL element functioning as a pixel has a structure in which an anode and a cathode overlap with each other with a light-emitting layer therebetween. Furthermore, in an organic EL display, a partition is provided between adjacent pixels to prevent electric interference between adjacent light-emitting layers (Patent Document 1).

In the case where an organic EL layer such as a light-emitting layer is formed using a low molecular material, a method performed by a vacuum evaporation method using a metal mask is known (Patent Document 2).

REFERENCES

Patent Documents

[Patent Document 1] Japanese Published Patent Application No. 2014-123527
[Patent Document 2] Japanese Published Patent Application No. 2003-157973

SUMMARY OF THE INVENTION

Problems to be Solved by the Invention

A partition (also referred to as an "embankment" or a "bank") provided between pixels offers effects such as an improvement in display quality and a reduction in power consumption of a display device. By contrast, a certain amount of partition is needed to obtain a sufficient effect, which has made a reduction in area occupied by the partition difficult, and made an improvement in pixel aperture ratio, an increase in resolution, a reduction in size, and the like difficult.

In addition, a metal mask is inferior to a resist mask in the size accuracy and is easily deformed by the influence of heat generated by an evaporation source, for example; thus, formation of a light-emitting layer for each pixel with the use of a metal mask has had a difficulty in achieving an improvement in pixel aperture ratio, an increase in resolution, and the like.

An object of one embodiment of the present invention is to provide a display device, a semiconductor device, or the like having high display quality. Another object is to provide a highly reliable display device, semiconductor device, or the like. Another object is to provide a display device, a semiconductor device, or the like with low power consumption. Another object is to provide a display device, a semiconductor device, or the like with high productivity. Another object is to provide a novel display device, semiconductor device, or the like. Another object is to provide a method for fabricating a novel display device, a method for fabricating a novel semiconductor device, or the like Note that the description of these objects does not preclude the existence of other objects. One embodiment of the present invention does not need to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention is a method for fabricating a display device including first to third light-emitting elements, and the method includes a first fabrication step of forming the first light-emitting element, a second fabrication step of forming the second light-emitting element, and a third fabrication step of forming the third light-emitting element. The first fabrication step includes a step of forming an anode, a first EL layer, a first cathode, and a first layer in this order; a step of forming a first resist mask over the first layer; a step of selectively removing parts of the anode, the first EL layer, the first cathode, and the first layer; a step of removing part of the first resist mask; a step of selectively removing other parts of the first EL layer, the first cathode, and the first layer; and a step of removing the first resist mask. The second fabrication step includes a step of forming a second EL layer, a second cathode, and a second layer in this order; a step of forming a second resist mask over the second layer; a step of selectively removing parts of the anode, the second EL layer, the second cathode, and the second layer; a step of removing part of the second resist mask; a step of selectively removing other parts of the second EL layer, the second cathode, and the second layer; and a step of removing the second resist mask. The third fabrication step includes a step of forming a third EL layer, a third cathode, and a third layer in this order; a step of forming a third resist mask over the third layer; a step of selectively removing parts of the anode, the third EL layer, the third cathode, and the third layer; a step of removing part of the third resist mask; a step of selectively removing other parts of the third EL layer, the third cathode, and the third layer; and a step of removing the third resist mask.

Each of the first to third resist masks is preferably formed using a multi-tone mask. For example, the second EL layer, the second cathode, and the second layer are formed to cover the first light-emitting element in the second fabrication step. For example, the third EL layer, the third cathode, and the third layer are formed to cover the first light-emitting element and the second light-emitting element in the third fabrication step.

The first to third EL layers each preferably contain an organic EL material. The first light-emitting element to the third light-emitting element are preferably covered with a fourth layer. For the fourth layer, for example, aluminum oxide formed by an ALD method is used. A first conductive layer electrically connected to each of the first cathode to the third cathode is preferably included.

Effect of the Invention

According to one embodiment of the present invention, a display device, a semiconductor device, or the like having high display quality can be provided. Alternatively, a highly reliable display device, semiconductor device, or the like can be provided. Alternatively, a display device, a semiconductor device, or the like with low power consumption can be provided. Alternatively, a display device, a semiconductor device, or the like with high productivity can be provided. Alternatively, a novel display device, semiconductor device, or the like can be provided. Alternatively, a method for fabricating a novel display device, a method for fabricating a novel semiconductor device, or the like can be provided.

Note that the description of these effects does not preclude the existence of other effects. One embodiment of the present invention does not have to have all these effects. Note that other effects will be apparent from the description of the specification, the drawings, the claims, and the like and other effects can be derived from the description of the specification, the drawings, the claims, and the like.

BRIEF DESCRIPTION OF THE DRAWINGS

FIG. 3 is a diagram illustrating a structure example of a display device.

FIG. 11A to FIG. 11C are diagrams illustrating an example of a method for fabricating a display device.

4

Figures 14A, 14B:
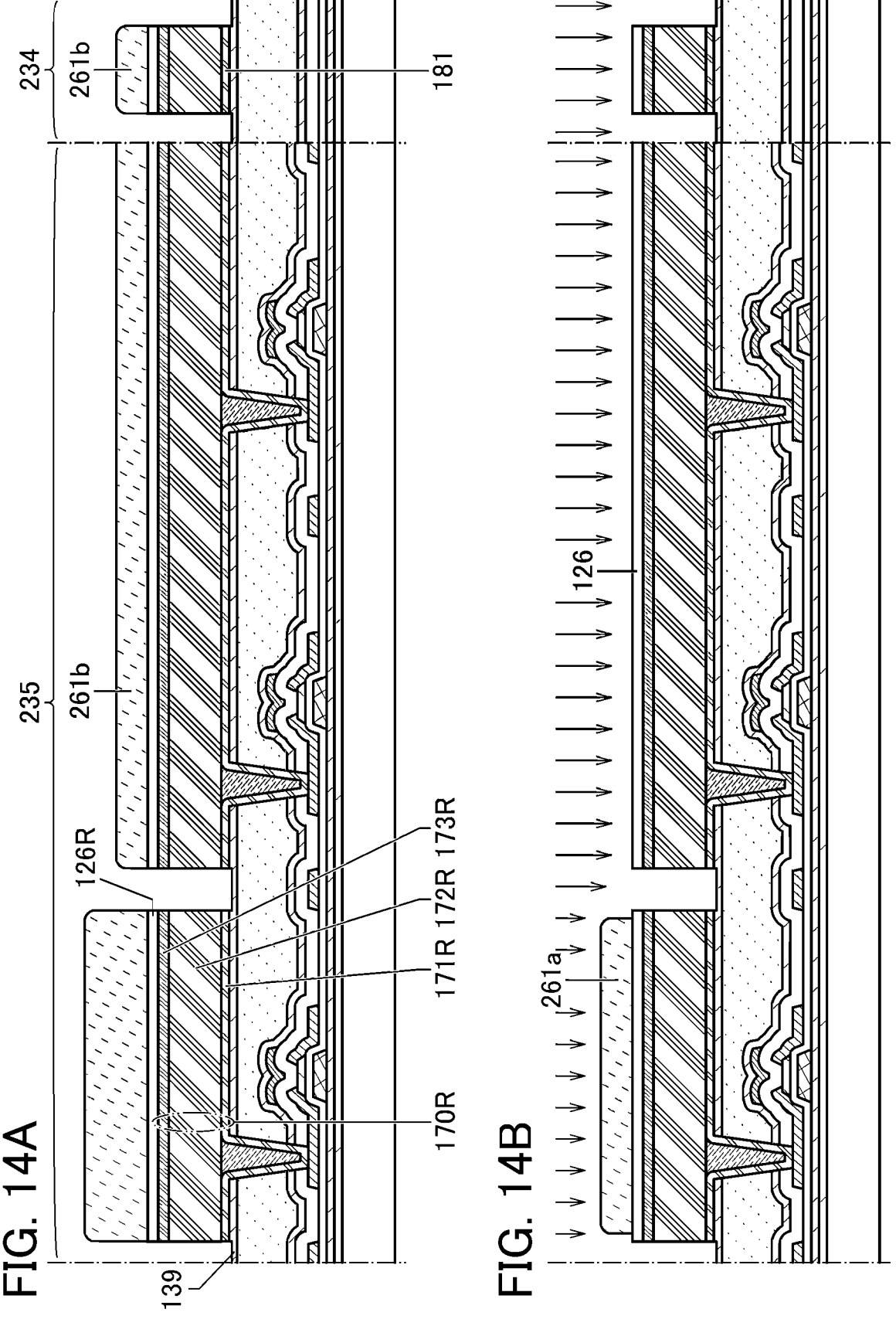

FIG. 14A and FIG. 14B are diagrams illustrating an example of a method for fabricating a display device.

Figures 15A, 15B:
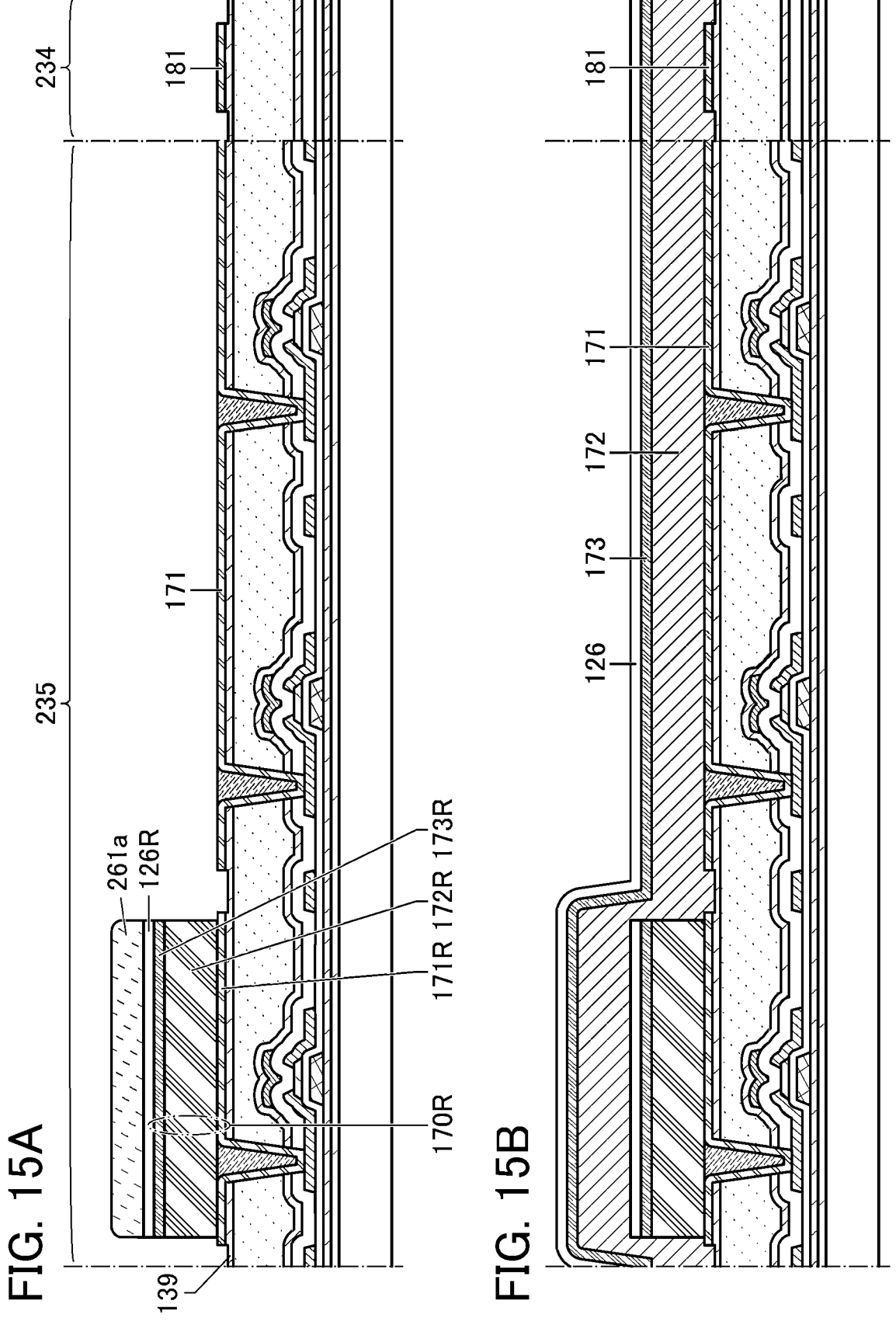

FIG. 15A and FIG. 15B are diagrams illustrating an example of a method for fabricating a display device.

FIG. 16A and FIG. 16B are diagrams illustrating an example of a method for fabricating a display device.

FIG. 17A and FIG. 17B are diagrams illustrating an example of a method for fabricating a display device.

Figures 18A, 18B:
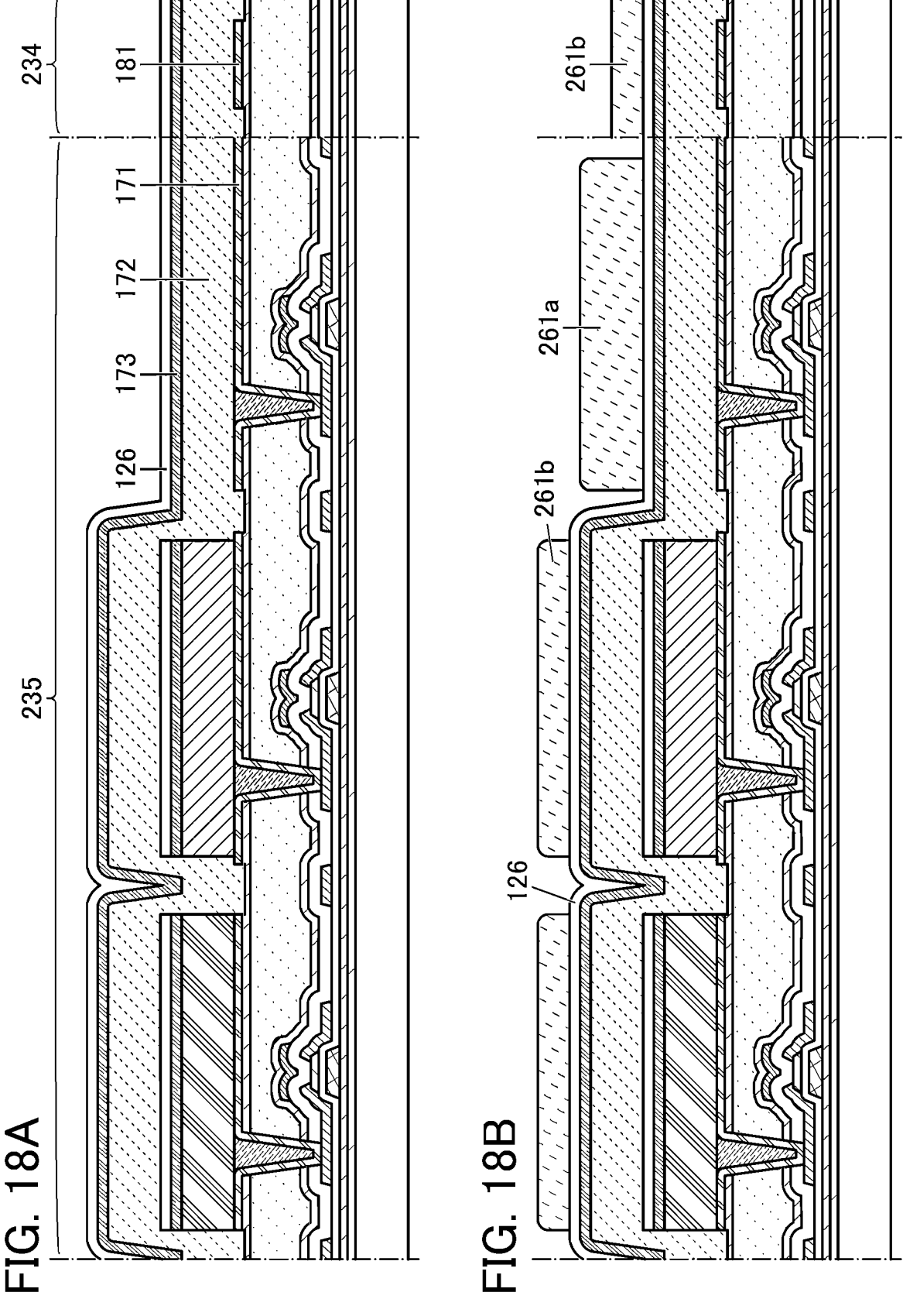

FIG. 18A and FIG. 18B are diagrams illustrating an example of a method for fabricating a display device.

Figures 19A, 19B:
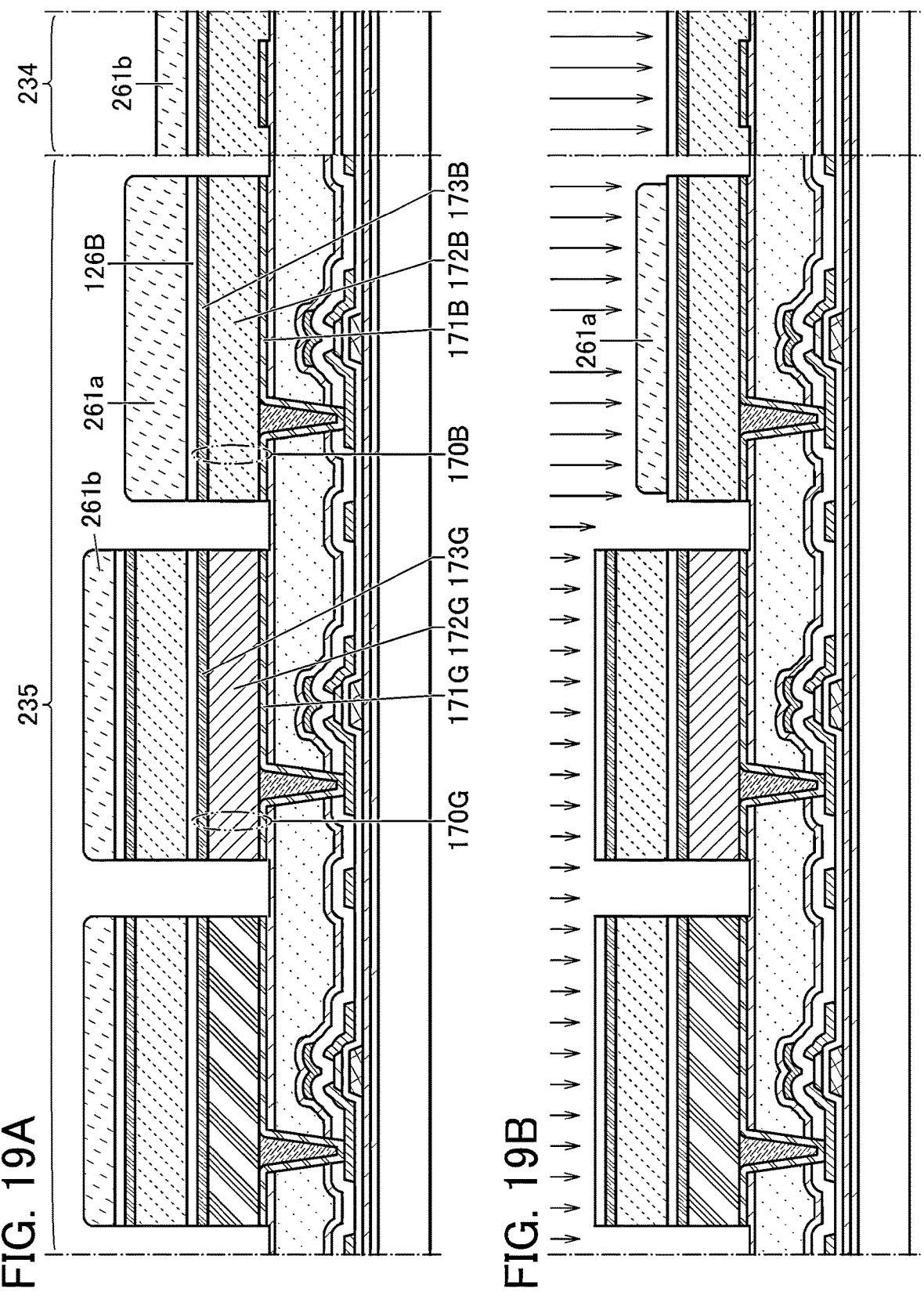

FIG. 19A and FIG. 19B are diagrams illustrating an example of a method for fabricating a display device.

Figures 20A, 20B:
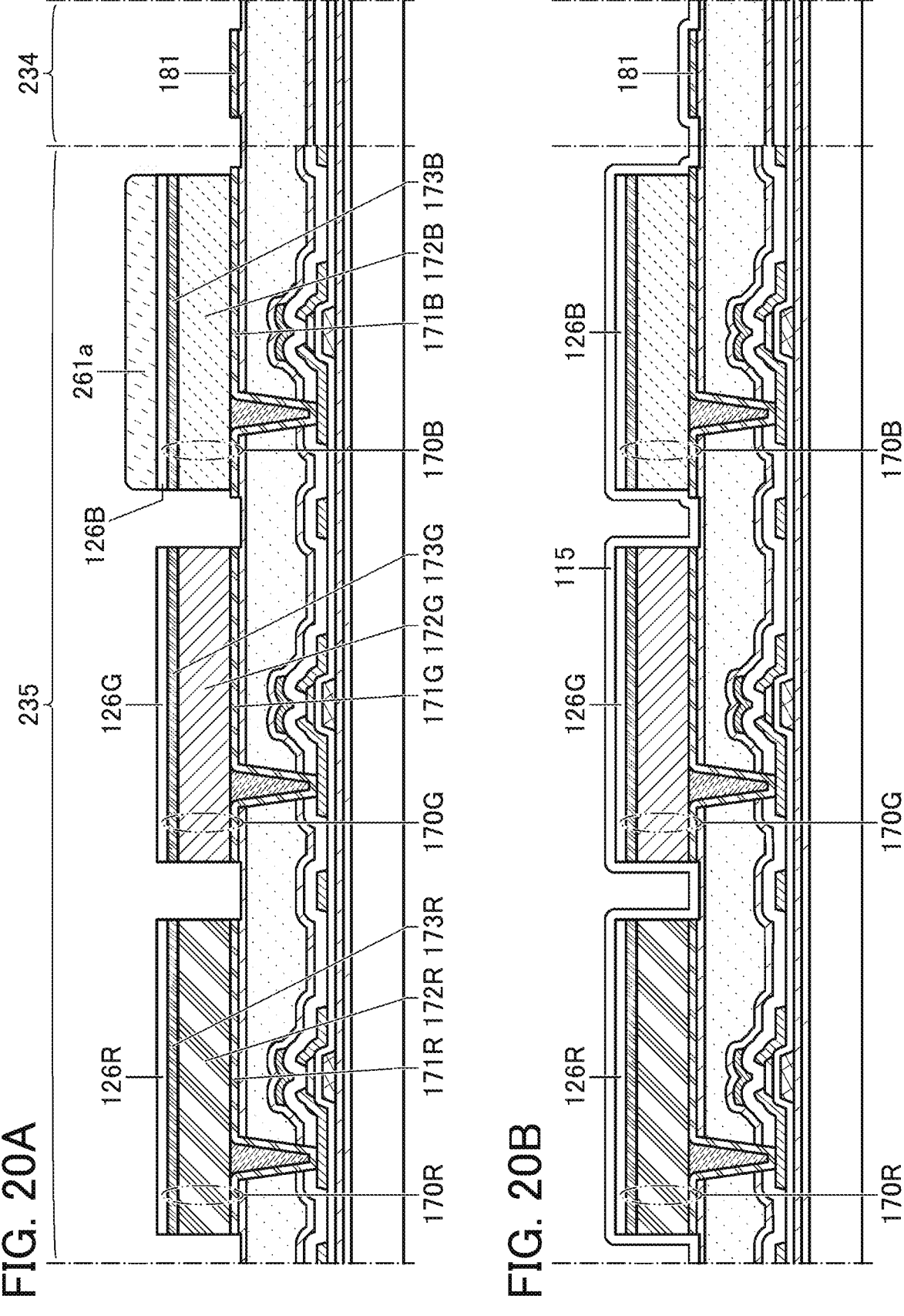

FIG. 20A and FIG. 20B are diagrams illustrating an example of a method for fabricating a display device.

Figures 21A, 21B:
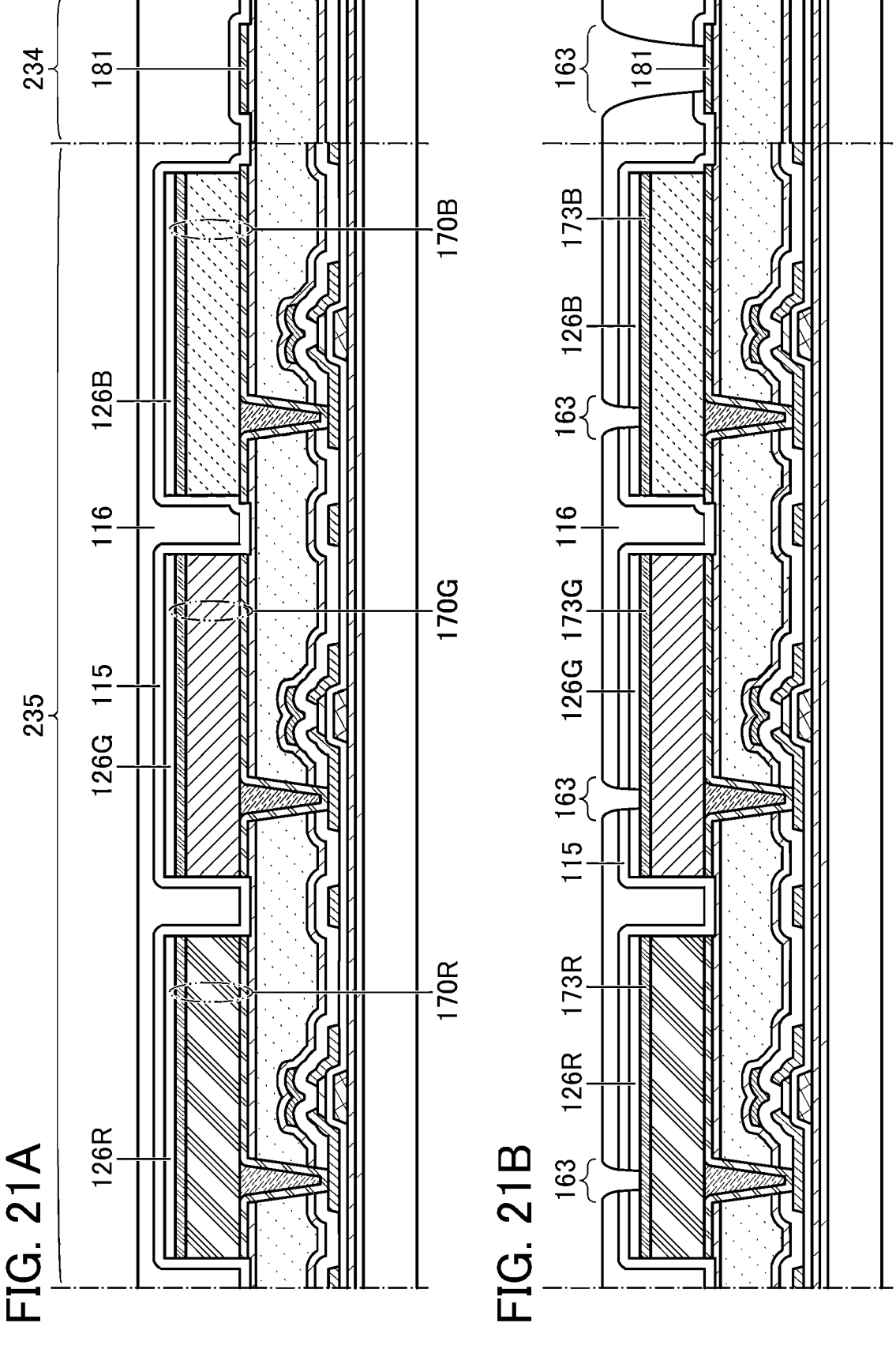

FIG. 21A and FIG. 21B are diagrams illustrating an example of a method for fabricating a display device.

Figures 22A, 22B:
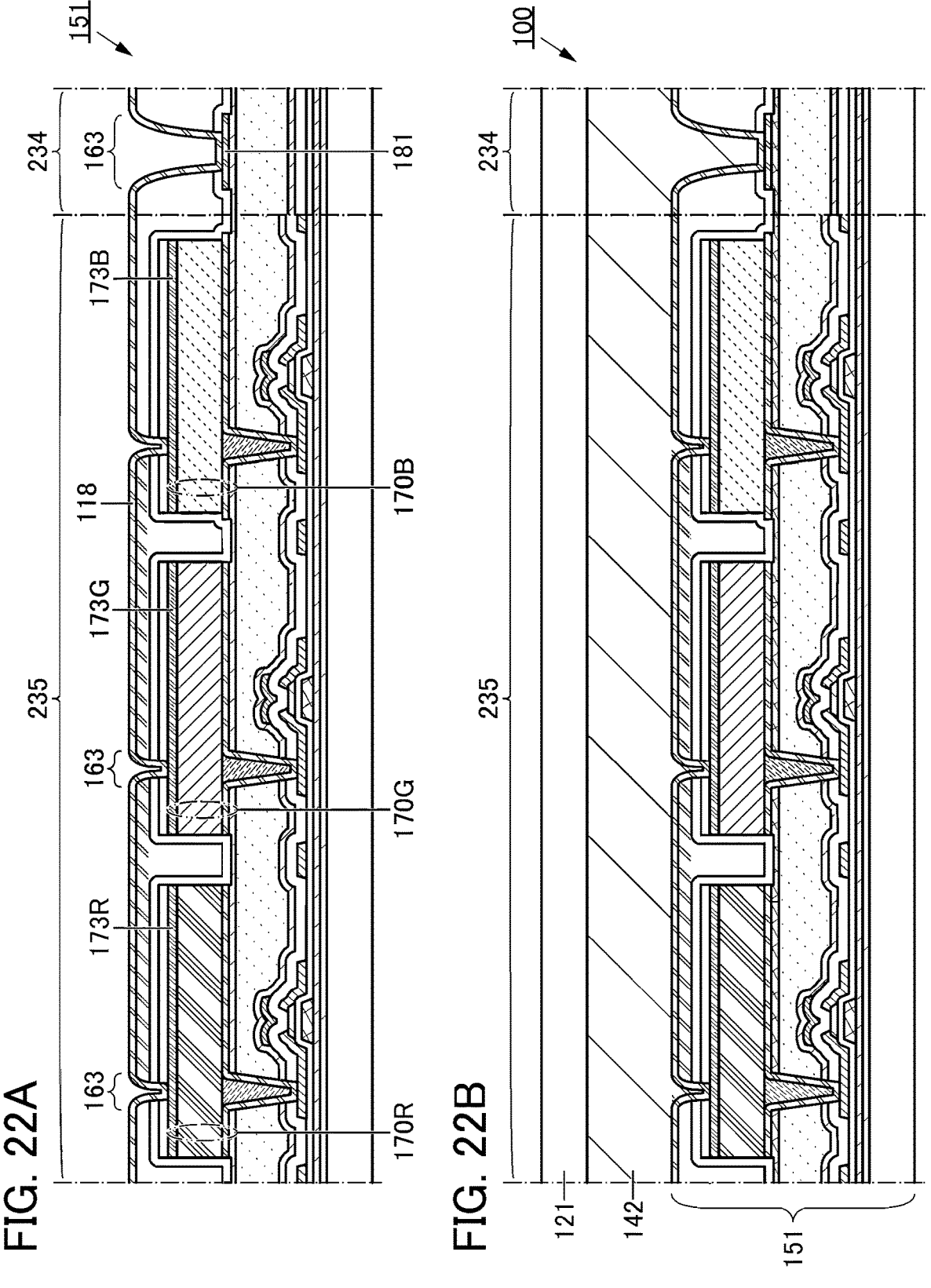

FIG. 22A and FIG. 22B are diagrams illustrating an example of a method for fabricating a display device.

FIG. 23A is a diagram showing classification of crystal structures. FIG. 23B is a diagram showing an XRD spectrum of a CAAC-IGZO film. FIG. 23C is a diagram showing nanobeam electron diffraction patterns of the CAAC-IGZO film.

FIG. 24A1, FIG. 24A2, FIG. 24B1, and FIG. 24B2 are diagrams illustrating multi-tone masks.

FIG. 25A and FIG. 25B1 to FIG. 25B7 are diagrams illustrating structure examples of a display device.

FIG. 26A to FIG. 26D are diagrams illustrating structure examples of a pixel circuit.

FIG. 27A to FIG. 27D are diagrams illustrating structure examples of a light-emitting element.

Figure 28A:
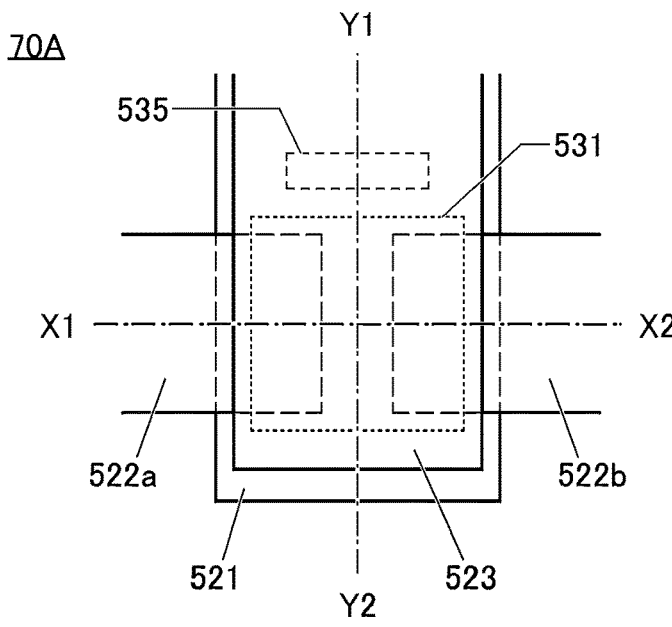
Figure 28B:
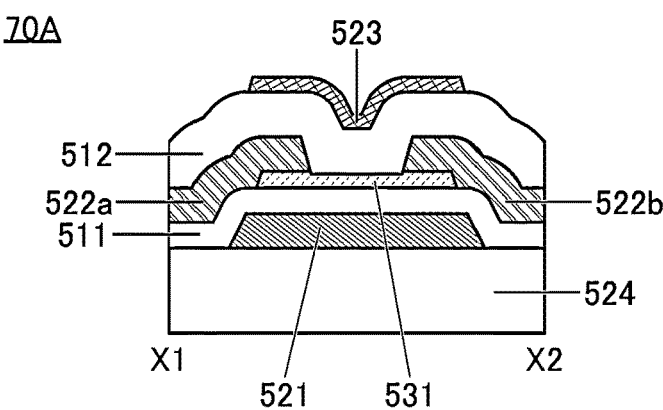
Figure 28C:
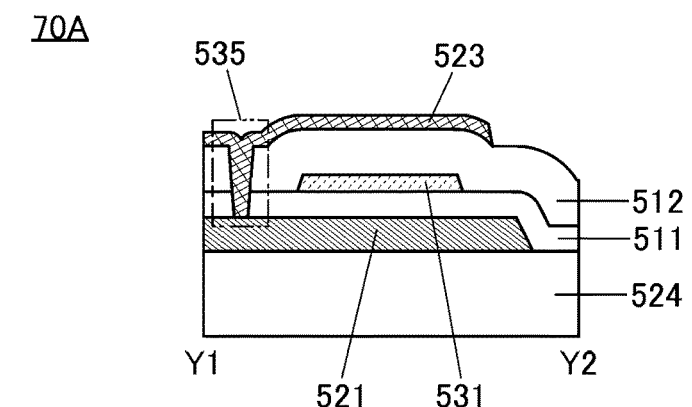

FIG. 28A to FIG. 28C are diagrams illustrating a structure example of a transistor.

Figure 29A:
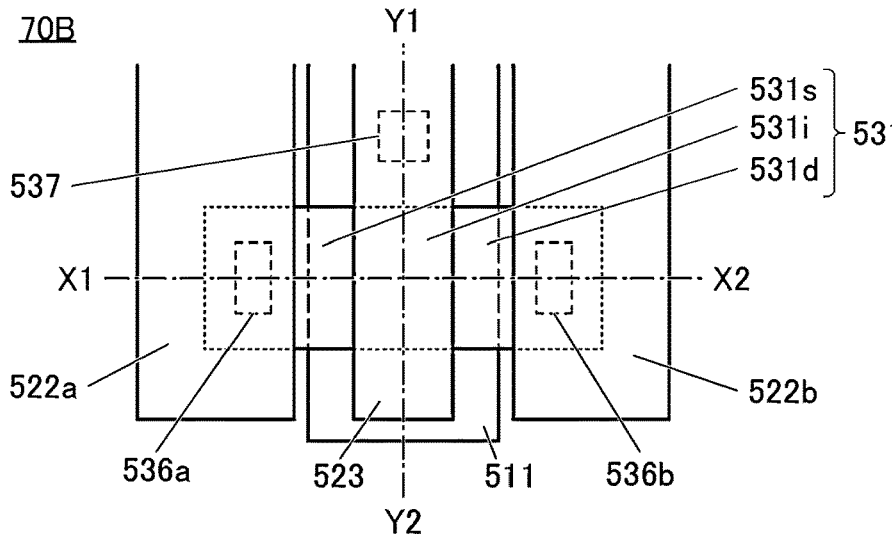
Figure 29B:
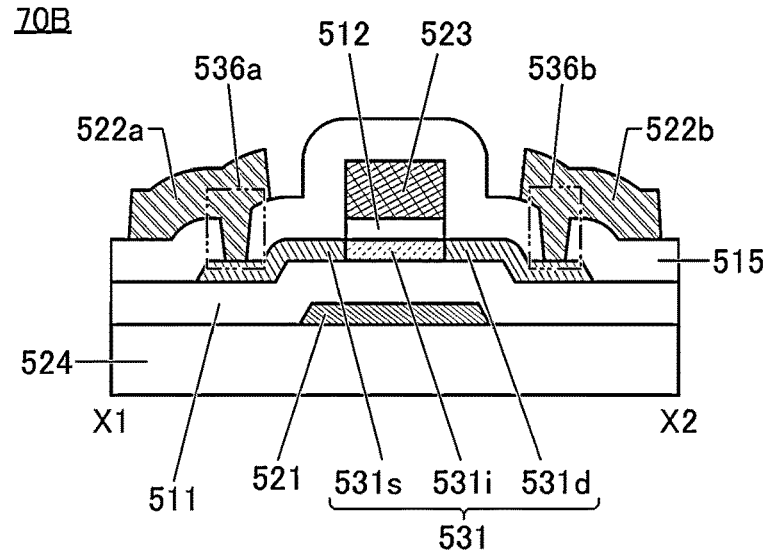
Figure 29C:
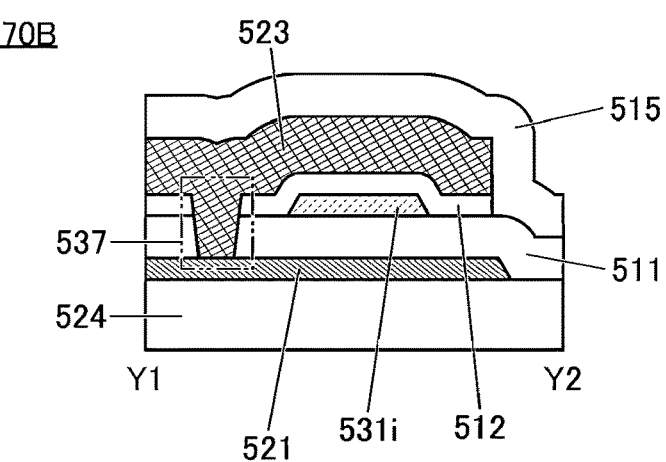

FIG. 29A to FIG. 29C are diagrams illustrating a structure example of a transistor.

Figures 30A, 30B, 30C:
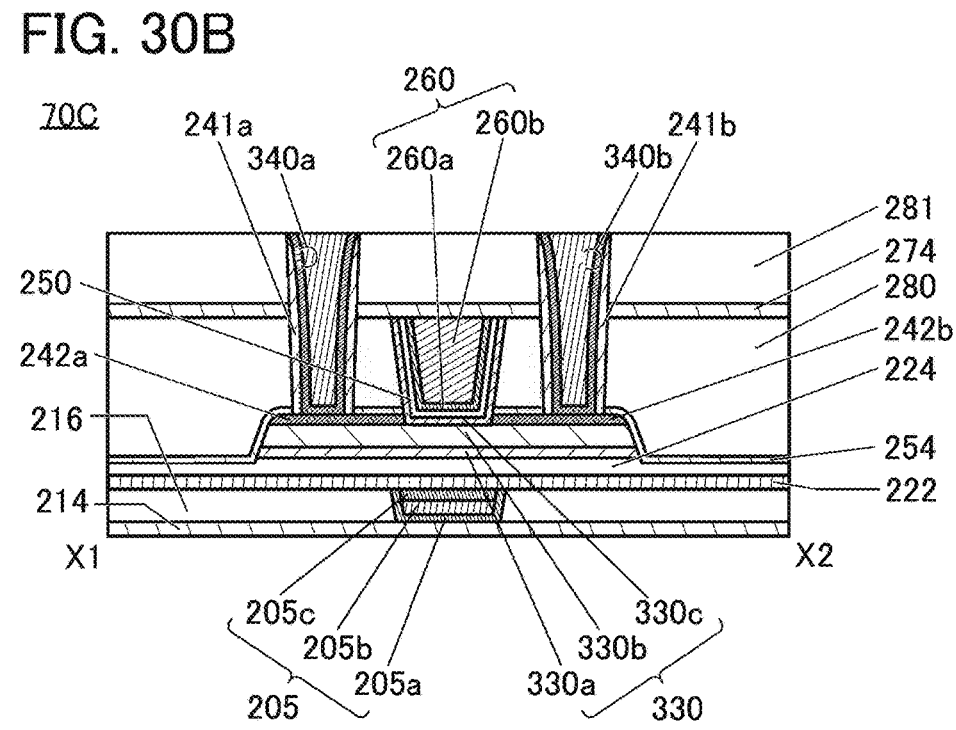

FIG. 30A to FIG. 30C are diagrams illustrating a structure example of a transistor.

Figure 31A:
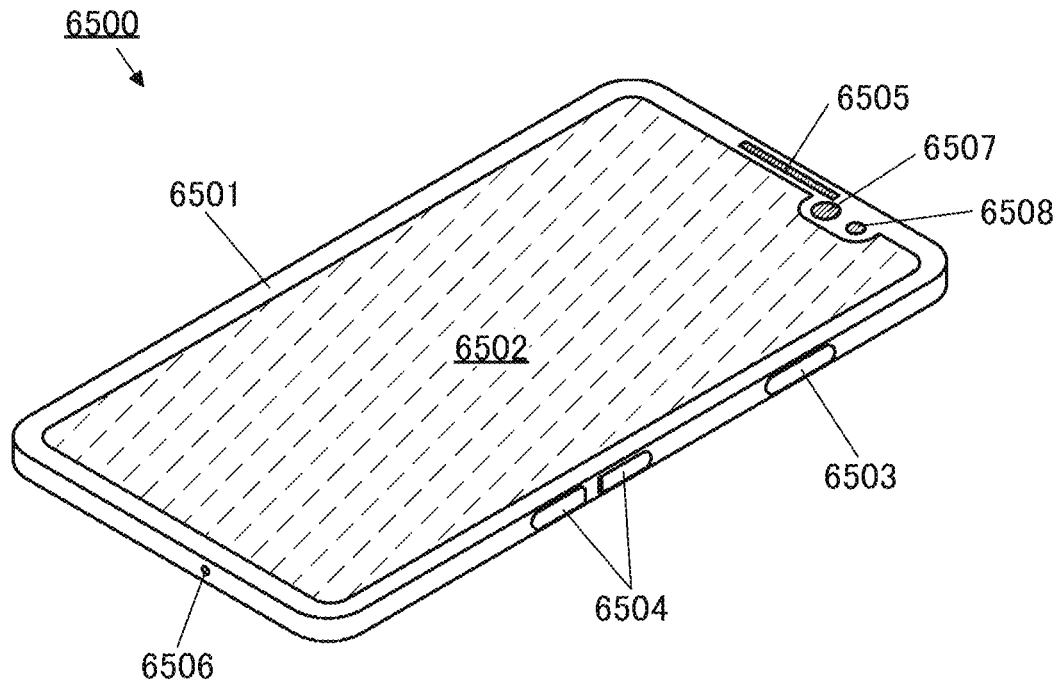
Figure 31B:
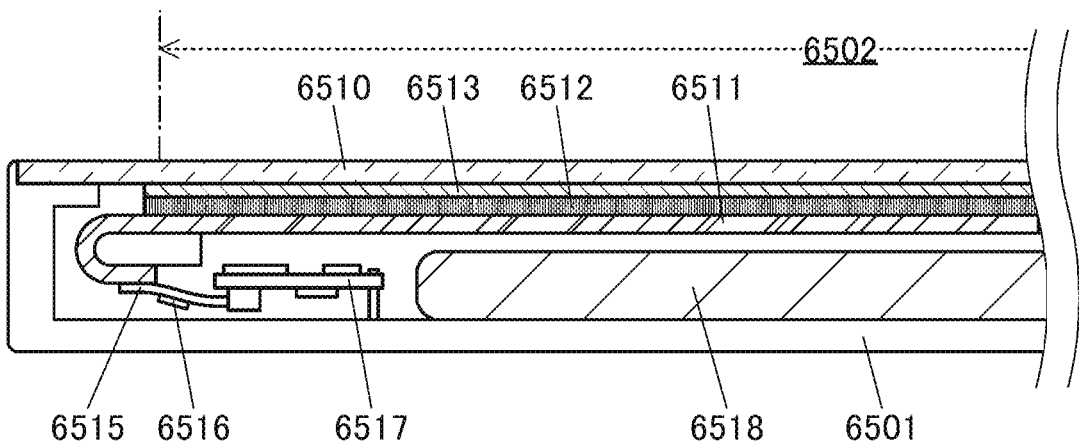

FIG. 31A and FIG. 31B are diagrams illustrating an example of an electronic device.

FIG. 32A to FIG. 32D are diagrams illustrating examples of electronic devices.

FIG. 33A to FIG. 33F are diagrams illustrating examples of electronic devices.

MODE FOR CARRYING OUT THE INVENTION

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting apparatus, a lighting device, an electronic device, and the like themselves may be semiconductor devices or may each include a semiconductor device.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch is controlled to be in an on state or an off state. That is, a switch has a function of controlling whether or not current flows by being in a conduction state (on state) or a non-conduction state (off state).

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, as a "resistor", a circuit element, a wiring, or the like having a resistance value higher than $0\Omega$ can be used, for example. Therefore, in this specification and the like, a "resistor" sometimes includes a wiring having a resistance value, a transistor in which current flows between its source and drain, a diode, and a coil. Thus, the term "resistor" can be replaced with the term such as "resistance", "load", or "region having a resistance value"; conversely, the term "resistance", "load", or "region having a resistance value" can be replaced with the term such as "resistor". The resistance value can be, for example, preferably higher than or equal to 1 m$\Omega$ and lower than or equal to 10$\Omega$, further preferably higher than or equal to 5 m$\Omega$ and lower than or equal to 5$\Omega$, still further preferably higher than or equal to 10 m$\Omega$ and lower than or equal to 1$\Omega$. As another example, the resistance value may be higher than or equal to 1$\Omega$ and lower than or equal to $1\times10^9\Omega$.

In the case where a wiring is used as a resistor, the resistance value is sometimes determined depending on the length of the wiring. Alternatively, a conductor with resistivity different from that of a conductor used as a wiring is sometimes used as a resistor. Alternatively, the resistance value is sometimes determined by doping a semiconductor with an impurity.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 µF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a terminal, a wiring, an electrode, a conductive layer, a conductor, an impurity region, or the like depending on the circuit structure, the device structure, or the like. Furthermore, a terminal, a wiring, or the like can be referred to as a "node".

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer phenomenon (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. For another example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term such as "electrode", "wiring", or "terminal" does not limit the function of a component. For example, an "electrode" is used as part of a wiring in some cases, and vice versa. Furthermore, for example, the term "electrode" or "wiring" also includes the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" depending on the case, for example.

In this specification and the like, the term such as "wiring", "signal line", or "power supply line" can be interchanged with each other depending on the case or the situation. For example, the term "wiring" can be changed into the term "signal line" in some cases. As another example, the term "wiring" can be changed into the term "power supply line" or the like in some cases. Conversely, the term such as "signal line" or "power supply line" can be changed into the term "wiring" in some cases. The term "power supply line" or the like can be changed into the term "signal line" or the like in some cases. Conversely, the term "signal line" or the like can be changed into the term "power supply line" or the like in some cases. Moreover, the term "potential" that is applied to a wiring can sometimes be changed into the term such as "signal" depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples include hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch has a function of controlling whether current flows or not by being in a conduction state (an on state) or a non-conduction state (an off state). Alternatively, a switch has a function of selecting and changing a current path. For example, an electrical switch or a mechanical switch can be used. That is, a switch can be any element capable of controlling current, and is not limited to a particular element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to $-10°$ and less than or equal to $10°$. Thus, the case where the angle is greater than or equal to $-5°$ and less than or equal to $5°$ is also included. In addition, "approximately parallel" or "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Thus, the case where the angle is greater than or equal to $85°$ and less than or equal to $95°$ is also included. Furthermore, "approximately perpendicular" or "substantially perpendicular" indicates a state where two straight lines are placed at an angle greater than or equal to $60°$ and less than or equal to $120°$.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when a metal oxide is used in a channel formation region of a transistor that has at least one of an amplifying function, a rectifying function, and a switching function, the metal oxide can be referred to as a metal oxide semiconductor. Furthermore, when an "OS transistor" is described, it can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be interpreted as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the drawings in some cases. Furthermore, hatching or the like is omitted for easy understanding of drawings, in some cases.

In the drawings in this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted by the same reference numerals, and in particular need to be distinguished from each other, an identification character such as "A", "a", "_1", "[i]", or "[m,n]" is sometimes added to the end of each reference numeral. For example, a plurality of pixels 230 are described as a pixel 230R, a pixel 230G, and a pixel 230B in some cases. In other words, in the case where matters that are common to the pixel 230R, the pixel 230G, and the pixel 230B are described or in the case where the pixels do not need to be distinguished from one another, "pixel 230" is simply used, in some cases.

In this specification and the like, a device formed using a metal mask or an FMM (fine metal mask, high-resolution metal mask) is sometimes referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (e.g., blue (B), green (G), and red (R)) are separately formed or separately patterned may be referred to as an SBS (Side By Side) structure. In this specification and the like, a light-emitting device capable of emitting white light is sometimes referred to as a white-light-emitting device. Note that a combination of white-light-emitting devices with coloring layers (e.g., color filters) enables a full-color display device.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more of light-emitting layers are selected such that their emission colors are complementary to each other. For example, when the emission color of a first light-emitting layer and the emission color of a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made such that light from light-emitting layers of the light-emitting units can be combined to be white light. Note that a structure for obtaining white light emission is similar to that in the case of a single structure. In the device having a tandem structure, it is suitable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Embodiment 1

A display device 100 of one embodiment of the present invention will be described with reference to drawings.
<<Structure Example>>

Figures 1A, 1B, 1C:
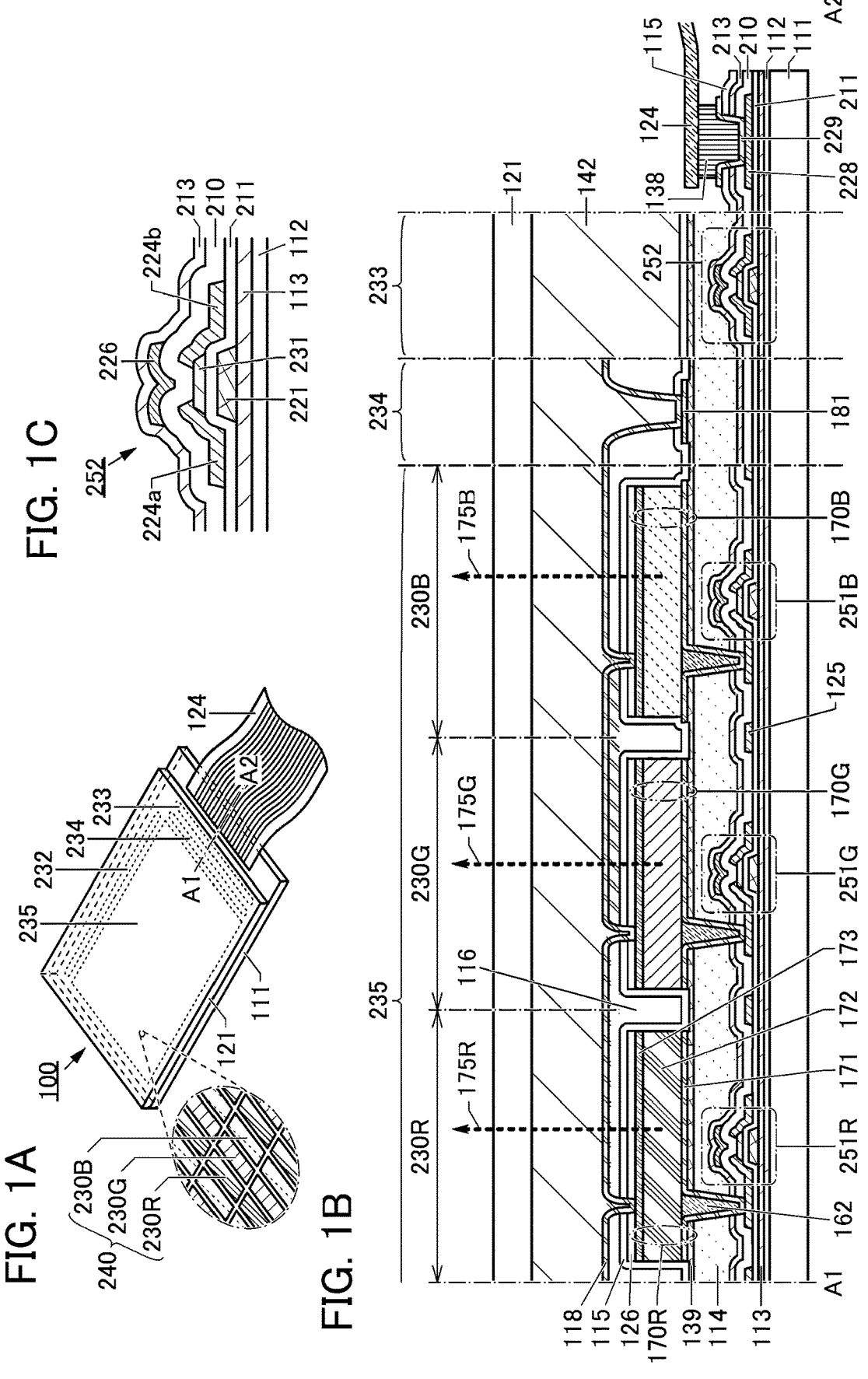
FIG. 1A to FIG. 1C are diagrams illustrating a structure example of a display device.

FIG. 1A is a schematic perspective view of the display device 100. The display device 100 has a structure in which a substrate 111 and a substrate 121 are attached to each other. The display device 100 includes a display region 235, a peripheral circuit region 232, a peripheral circuit region 233, a cathode contact region 234, and the like. FIG. 1A illustrates an example in which an FPC 124 is mounted on the display device 100. Thus, the structure illustrated in FIG. 1A can be regarded as a display module including the display device 100 and the FPC 124.

The peripheral circuit region 232 and the peripheral circuit region 233 include circuits for supplying signals to the display region 235. The circuits included in the peripheral circuit region 232 and the peripheral circuit region 233 are collectively referred to as "peripheral driver circuit" in some cases. Examples of the circuits included in the peripheral driver circuit include a scan line driver circuit and a signal line driver circuit.

Part or the whole of the peripheral driver circuit may be mounted as an IC (integrated circuit). For example, an IC including part or the whole of the peripheral driver circuit may be provided over the substrate 111 by a COG (Chip On Glass) method, a COF (Chip on Film) method, or the like. The IC may be mounted on the FPC 124 by a COF method or the like.

A signal and power to be supplied to the display region 235, the peripheral circuit region 232, and the peripheral circuit region 233 are input from the outside through the FPC 124.

FIG. 1A also illustrates an enlarged view of part of the display region 235. In the display region 235, a plurality of pixels 240 are arranged in a matrix. The pixels 240 each include a pixel 230R, a pixel 230G, and a pixel 230B. As described above, in the case where matters that are common to the pixel 230R, the pixel 230G, and the pixel 230B are described or in the case where these three pixels do not need to be distinguished from each other, "pixel 230" is simply used in this specification and the like, in some cases.
[Cross-Sectional Structure Example]

FIG. 1B is a cross-sectional view of a portion indicated by the dashed-dotted line A1-A2 in FIG. 1A. FIG. 1B illustrates cross sections of part of the display region 235, part of the cathode contact region 234, part of the peripheral circuit region 233, and part of a region including the FPC 124.

The pixel 230R, the pixel 230G, and the pixel 230B each include a light-emitting element 170 as a display element. The light-emitting element 170 includes an electrode 171 functioning as an anode, an EL layer 172, and an electrode 173 functioning as a cathode. In FIG. 1B, the light-emitting element 170 included in the pixel 230R is illustrated as a light-emitting element 170R, the light-emitting element 170 included in the pixel 230G is illustrated as a light-emitting element 170G, and the light-emitting element 170 included in the pixel 230B is illustrated as a light-emitting element 170B.

Note that in this specification and the like, the electrode 171, the EL layer 172, and the electrode 173 included in the light-emitting element 170R are referred to as an electrode 171R, an EL layer 172R, and an electrode 173R, respectively, in some cases. The electrode 171, the EL layer 172, and the electrode 173 included in the light-emitting element 170G are referred to as an electrode 171G, an EL layer 172G, and an electrode 173G, respectively, in some cases. The electrode 171, the EL layer 172, and the electrode 173 included in the light-emitting element 170B are referred to as an electrode 171B, an EL layer 172B, and an electrode 173B, respectively, in some cases.

The light-emitting element 170R has a function of emitting light 175R. The light-emitting element 170G has a function of emitting light 175G. The light-emitting element 170B has a function of emitting light 175B. The light 175R is red light, the light 175G is green light, and the light 175B is blue light, for example.

The pixel 230R, the pixel 230G, and the pixel 230B each include a transistor 251 for driving the display element. The transistor 251 is a transistor controlling current flowing to the light-emitting element 170 (also referred to as a driving transistor).

The peripheral circuit region 232 and the peripheral circuit region 233 each include a plurality of transistors. FIG. 1B illustrates a transistor 252 as an example of the transistors included in the peripheral circuit region 233.

The display device 100 includes the transistor 251, the transistor 252, the light-emitting element 170, and the like between the substrate 111 and the substrate 121. The substrate 111 and the substrate 121 overlap with each other with an adhesive layer 142 therebetween.

As the adhesive layer 142, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component resin may be used. An adhesive sheet or the like may be used.

The transistor 251 and the transistor 252 are each provided over the substrate 111 with an insulating layer 112 and an insulating layer 113 therebetween. The transistor 251 and the transistor 252 are covered with an insulating layer 210 and an insulating layer 213. An insulating layer 114 is provided over the insulating layer 213. The insulating layer 114 preferably has a function of a planarization layer. Note that "planarization layer" refers to a layer having a surface whose unevenness due to the formation surface is reduced. An insulating layer 139 is provided over the insulating layer 114.

The number of insulating layers covering the transistors is not limited and may be one or two or more. A material through which impurities such as water and hydrogen do not easily diffuse is preferably used for at least one of the insulating layers covering the transistors. Thus, such an insulating layer can function as a barrier film. Such a structure can effectively inhibit diffusion of the impurities into the transistors from the outside, and can achieve a highly reliable display device.

FIG. 1C is an enlarged view of the transistor 252. Note that the transistor 251 can have a structure similar to that of the transistor 252.

In the pixel 230, the electrode 171 is provided over the insulating layer 139. The electrode 171 is electrically connected to one of a source and a drain of the transistor 251 in an opening portion provided in the insulating layer 114 and the insulating layer 139. The opening portion is filled with a layer 162. Filling the opening portion with the layer 162 can reduce a level difference caused by the opening portion, thereby increasing the planarity of the EL layer 172 and the electrode 173. Thus, it is preferable that the top surface of the layer 162 and the top surface of the electrode 171 be aligned or substantially aligned with each other.

The EL layer 172 is provided over the electrode 171, and the electrode 173 is provided over the EL layer 172. The electrode 173 has a region overlapping with the electrode 171 with the EL layer 172 therebetween. A protective layer 126 is provided over the electrode 173. Furthermore, an insulating layer 115 covering the light-emitting element 170 and the protective layer 126 is provided. The insulating layer 115 preferably covers the side surface of the light-emitting element 170. The insulating layer 115 is preferably formed using a material through which hydrogen and moisture do not easily pass.

An insulating layer 116 is provided over the insulating layer 115. The insulating layer 116 preferably has a function of a planarization layer. A conductive layer 118 is provided over the insulating layer 116. The conductive layer 118 is electrically connected to the electrode 173. Note that the conductive layer 118 is electrically connected to a plurality of the electrodes 173 and functions as a common electrode. The conductive layer 118 is electrically connected to an electrode 181 in the cathode contact region 234.

The conductive layer 118 also functions as an auxiliary conductive layer of the electrode 173. Providing the conductive layer 118 reduces a potential variation of the electrodes 173 in the entire display region 235 and enables uniform emission intensity to be obtained. Consequently, the display quality of the display device can be improved. The conductive layer 118 is electrically connected to the electrode 181. A constant potential is supplied to the electrode 181. Thus, the constant potential is supplied to the electrode 173 through the conductive layer 118.

The display device 100 illustrated in FIG. 1B includes an electrode 228 and an electrode 229. The electrode 228 is provided over an insulating layer 211. The electrode 228 is electrically connected to the peripheral driver circuit. The electrode 229 is electrically connected to the electrode 228 through an opening portion provided in the insulating layer 210. The FPC 124 is electrically connected to the electrode 229 through a connection layer 138.

As the connection layer 138, an anisotropic conductive film (ACF), an anisotropic conductive paste (ACP), or the like can be used.

The light-emitting element 170 is, for example, a top-emission light-emitting element. In the case where the light-emitting element 170 is a top-emission light-emitting element, the electrode 171 has a function of reflecting visible light and the electrode 173 has a function of transmitting visible light. Thus, the light 175 is emitted from the electrode 173 side. In the case where the conductive layer 118 is provided to cover the light-emitting element 170, the conductive layer 118 also has a function of transmitting visible light.

The EL layer 172 includes at least a light-emitting layer. The EL layer 172 may further include, as a layer other than the light-emitting layer, a layer containing a substance with a high hole-injection property, a substance with a high hole-transport property, a hole-blocking material, an electron-blocking material, a substance with a high electron-transport property, a substance with a high electron-injection property, a substance with a bipolar property (a substance with a high electron-transport property and a high hole-transport property), or the like.

The emission color of the light-emitting element 170 can be white, red, green, blue, cyan, magenta, yellow, or the like depending on the material of the EL layer 172.

As a method for achieving color display, there are a method in which the light-emitting element 170 whose emission color is white is combined with a coloring layer (color filter) and a method in which the light-emitting elements 170 with different emission colors are provided in the respective pixels. The former method is more productive than the latter method. By contrast, the latter method, which requires separate formation of the EL layer 172 pixel by pixel, is less productive than the former method. However, the latter method can provide higher color purity of the emission color than the former method. In the latter method, the color purity can be further increased when the light-emitting element 170 has a microcavity structure.

Either a low molecular compound or a high molecular compound can be used for the EL layer 172, and an inorganic compound may also be contained. The layers included in the EL layer 172 can each be formed by a method such as an evaporation method (including a vacuum evaporation method), a transfer method, a printing method, an inkjet method, or a coating method.

The EL layer 172 may contain an inorganic compound such as quantum dots. For example, when used for the light-emitting layer, the quantum dots can function as a light-emitting material.

Color display can be achieved when the luminance of the light 175 (the light 175R, the light 175G, and the light 175B) is controlled for each pixel. The emission color hues combined to achieve color display may be not only a combination of red, green, and blue but also a combination of yellow, cyan, and magenta. The emission color hues to be combined with each other may be set as appropriate in accordance with the purpose, the uses, or the like.

[Substrate]

There is no particular limitation on a material used for the substrate 111 and the substrate 121. The material is determined in accordance with the purpose in consideration of whether it has a light-transmitting property, heat resistance high enough to withstand heat treatment, or the like. For example, a glass substrate of barium borosilicate glass, aluminoborosilicate glass, or the like; a ceramic substrate; a quartz substrate; a sapphire substrate; or the like can be used. Alternatively, a semiconductor substrate, a flexible substrate, an attachment film, a base film, or the like may be used.

Examples of the semiconductor substrate include a semiconductor substrate using silicon, germanium, or the like as a material and a compound semiconductor substrate using silicon carbide, silicon germanium, gallium arsenide, indium phosphide, zinc oxide, or gallium oxide as a material. For the semiconductor substrate, a single crystal semiconductor or a polycrystalline semiconductor may be used.

In order to increase the flexibility of the display device 100, a flexible substrate, an attachment film, a base film, or the like may be used as the substrate 111 and the substrate 121.

As the materials of the flexible substrate, the attachment film, the base film, and the like, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used.

When the above-described material is used for the substrate, a lightweight display device can be provided. Furthermore, when the above-described material is used for the substrate, a shock-resistant display device can be provided. Moreover, when the above-described material is used for the substrate, a display device that is less likely to be broken can be provided.

The flexible substrate used as the substrate 111 and the substrate 121 preferably has a lower coefficient of linear expansion because deformation due to an environment is inhibited. For the flexible substrate used as the substrate 111 and the substrate 121, for example, a material whose coefficient of linear expansion is lower than or equal to $1\times10^{-3}$/K, lower than or equal to $5\times10^{-5}$/K, or lower than or equal to $1\times10^{-5}$/K is used. In particular, aramid is suitable for the flexible substrate because of its low coefficient of linear expansion.

[Conductive Layer]

As a conductive material that can be used for the gate, the source, and the drain of the transistor and conductive layers such as various wirings and electrodes included in the display device, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing the above metal element as a component; an alloy containing the above metal elements in combination; or the like can be used. Alternatively, a semiconductor typified by polycrystalline silicon containing an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

As the conductive material that can be used for the conductive layer, a conductive material containing oxygen, such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added, can be used. Moreover, a conductive material containing nitrogen, such as titanium nitride, tantalum nitride, or tungsten nitride, can be used. In addition, a stacked-layer structure in which a conductive material containing oxygen, a conductive material containing nitrogen, and a material containing the above-described metal element are combined as appropriate can be used.

The conductive material that can be used for the conductive layer may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure including a titanium layer, an aluminum layer stacked over the titanium layer, and a titanium layer formed thereover can be given. An aluminum alloy containing one or more elements selected from titanium, tantalum, tungsten, molybdenum, chromium, neodymium, and scandium may be used as the conductive material.

In the case where the light-emitting element 170 is a top-emission light-emitting element, the electrode 171 is preferably formed using a conductive material that efficiently reflects light emitted from the EL layer 172. Note that the structure of the electrode 171 is not limited to a single-layer structure and may be a stacked-layer structure of a plurality of layers. For example, in the case where the electrode 171 is used as an anode, a layer in contact with the EL layer 172 may be a layer with a light-transmitting property containing an indium tin oxide or the like, and a layer having high reflectance (e.g., aluminum, an alloy containing aluminum, or silver) may be provided in contact with the layer.

As a conductive material that reflects visible light, for example, a metal material such as aluminum, gold, platinum, silver, nickel, tungsten, chromium, molybdenum, iron, cobalt, copper, or palladium or an alloy containing these metal materials can be used. Lanthanum, neodymium, germanium, or the like may be added to the above metal material and/or alloy. Alternatively, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium may be used. An alloy containing silver and copper is preferable because of its high heat resistance. Furthermore, a metal film or an alloy film may be stacked with a metal oxide film. For example, when a metal film or a metal oxide film is stacked to be in contact with an aluminum alloy film, oxidation of the aluminum alloy film can be inhibited. Other examples of the metal film or the metal oxide film include titanium and titanium oxide. Alternatively, as described above, a conductive film with a light-transmitting property and a film containing a metal material may be stacked. For example, a stacked-layer film of silver and an indium tin oxide or a stacked-layer film of an indium tin oxide (ITO) and an alloy of silver and magnesium can be used.

As a conductive material with a light-transmitting property, a conductive oxide such as indium oxide, indium tin oxide, indium zinc oxide, zinc oxide, or zinc oxide to which gallium is added, or graphene can be used. Alternatively, as the conductive material with a light-transmitting property, an oxide conductor can be used. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (e.g., titanium nitride) or the like may be used. Note that in the case of using the metal material or the alloy material (or the nitride thereof), the thickness is set small enough to have a light-transmitting property. A stacked-layer film of the above materials can be used as a conductive layer. For example, a stacked-layer film of an indium tin oxide and an alloy of silver and magnesium, or the like is preferably used for increased conductivity. They can also be used for conductive layers such as a variety of wirings and electrodes that constitute the display device, and conductive layers (conductive layers functioning as a pixel electrode or a common electrode) included in the display element.

Here, an oxide conductor, which is one kind of metal oxide, is described. In this specification and the like, an oxide conductor may be referred to as OC (Oxide Conductor). The oxide conductor is obtained in the following manner, for example: oxygen vacancies are formed in a metal oxide, and then hydrogen is added to the oxygen vacancies, so that a donor level is formed in the vicinity of the conduction band. As a result, the conductivity of the metal oxide is increased, so that the metal oxide becomes a conductor. The metal oxide having become a conductor can be referred to as an oxide conductor. Oxide semiconductors generally have a visible-light-transmitting property because of their large energy gap. Meanwhile, an oxide conductor is a metal oxide having a donor level in the vicinity of the conduction band. Therefore, the influence of absorption due to the donor level is small in the oxide conductor, and the oxide conductor has a visible-light-transmitting property comparable to that of an oxide semiconductor.

[Insulating Layer]

For each of the insulating layers, a single layer or a stack layer of materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. A material in which a plurality of materials selected from an oxide material, a nitride material, an oxynitride material, and a nitride oxide material are mixed may be used.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

It is particularly preferable that the insulating layer 113 and the insulating layer 213 be formed using an insulating material through which impurities do not easily pass. For example, a single layer or a stacked layer of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Examples of the insulating material through which impurities do not easily pass include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities do not easily pass is used for the insulating layer 113, impurity diffusion from the substrate 111 side can be inhibited, and the reliability of the transistor can be improved. When the insulating material through which impurities do not easily pass is used for the insulating layer 213, impurity diffusion from the insulating layer 114 side can be inhibited, and the reliability of the transistor can be improved.

The insulating layer that can function as a planarization layer can be formed using an organic material having heat resistance, such as polyimide, an acrylic resin, a benzocyclobutene-based resin, polyamide, or an epoxy resin. Other than the above organic materials, it is also possible to use a low dielectric constant material (a low-k material), a siloxane-based resin, PSG (phosphosilicate glass), BPSG (borophosphosilicate glass), or the like. Note that a plurality of insulating layers formed of these materials may be stacked.

Note that the siloxane-based resin corresponds to a resin including a Si—O—Si bond formed using a siloxane-based material as a starting material. In the siloxane-based resin, an organic group (e.g., an alkyl group or an aryl group), a fluoro group, or the like may be used as a substituent. In addition, the organic group may include a fluoro group.

CMP treatment may be performed on a surface of the insulating layer or the like. By the CMP treatment, unevenness of the sample surface can be reduced, and coverage with an insulating layer and a conductive layer to be formed later can be increased.

[Transistor]

There is no particular limitation on the structure of the transistor included in the display device of one embodiment of the present invention. For example, a planar transistor may be used, or a staggered transistor may be used. Alternatively, the transistor structure may be either a top-gate structure or a bottom-gate structure. Gate electrodes may be provided above and below a channel.

A transistor included in a peripheral driver circuit and a transistor included in a pixel circuit may have the same structure or different structures. All the transistors included in the peripheral driver circuit may have the same structure or may use the combination of two or more kinds of structures. Similarly, all the transistors included in the pixel circuit may have the same structure or may use the combination of two or more kinds of structures.

[Semiconductor Material]

There is no particular limitation on the crystallinity of a semiconductor material used for the semiconductor layer of the transistor. Either an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be inhibited.

For example, silicon, germanium, or the like can be used as a semiconductor material used for the semiconductor layer of the transistor. Alternatively, a compound semiconductor such as silicon carbide, gallium arsenide, a metal oxide, or a nitride semiconductor, an organic semiconductor, or the like can be used.

For example, polycrystalline silicon (polysilicon), amorphous silicon, or the like can be used as a semiconductor material used for the transistor. Furthermore, an oxide semiconductor, which is a kind of metal oxide, can be used as a semiconductor material used for the transistor.

<Metal Oxide>

Here, a metal oxide that can be used as an oxide semiconductor is described.

The metal oxide that can be used as an oxide semiconductor preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, an element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M.

Note that in this specification and the like, a metal oxide containing nitrogen is also collectively referred to as a metal oxide in some cases. A metal oxide containing nitrogen may be called a metal oxynitride.

<Classification of Crystal Structures>

First, the classification of the crystal structures of an oxide semiconductor will be described with reference to FIG. 23A. FIG. 23A is a diagram showing the classification of crystal structures of an oxide semiconductor, typically IGZO (a metal oxide containing In, Ga, and Zn).

As shown in FIG. 23A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. Moreover, the term "Crystal" includes single crystal and poly crystal.

Note that the structures in the thick frame in FIG. 23A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 23B shows an XRD spectrum, which is obtained by GIXD (Grazing-Incidence XRD) measurement, of a CAAC-IGZO film classified into "Crystalline". The horizontal axis represents $2\theta$ [deg.], and the vertical axis represents Intensity [a.u.]. Note that a GIXD method is also referred to as a thin film method or a Seemann-Bohlin method. The XRD spectrum that is shown in FIG. 23B and obtained by GIXD measurement may be hereinafter simply referred to as an XRD spectrum in this specification. The CAAC-IGZO film in FIG. 23B has a composition in the neighborhood of In:Ga:Zn=4:2:3 [atomic ratio]. The CAAC-IGZO film in FIG. 23B has a thickness of 500 nm.

As shown in FIG. 23B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 23B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 23C shows a diffraction pattern of the CAAC-IGZO film. FIG. 23C shows a diffraction pattern obtained by NBED in which an electron beam is incident in the direction parallel to the substrate. The CAAC-IGZO film in FIG. 23C has a composition in the neighborhood of In:Ga:Zn=4:2:3 [atomic ratio]. In the nanobeam electron diffraction method, electron diffraction is performed with a probe diameter of 1 nm.

As shown in FIG. 23C, a plurality of spots indicating c-axis alignment are observed in the diffraction pattern of the CAAC-IGZO film.

<Structure of Oxide Semiconductor>

Oxide semiconductors might be classified in a manner different from that in FIG. 23A when classified in terms of the crystal structure. Oxide semiconductors are classified into a single crystal oxide semiconductor and a non-singlecrystal oxide semiconductor, for example. Examples of the non-single-crystal oxide semiconductor include the above-described CAAC-OS and nc-OS. Other examples of the non-single-crystal oxide semiconductor include a polycrys-talline oxide semiconductor, an amorphous-like oxide semi-conductor (a-like OS), and an amorphous oxide semicon-ductor.

Here, the CAAC-OS, the nc-OS, and the a-like OS will be described in detail.

[CAAC-OS]

The CAAC-OS is an oxide semiconductor that has a plurality of crystal regions each of which has c-axis align-ment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrange-ment, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. There-fore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analy-sis by out-of-plane XRD measurement with an XRD appa-ratus using θ/2θ scanning, for example, a peak indicating c-axis alignment is detected at 2θ of 31° or around 31°. Note that the position of the peak indicating c-axis alignment (the value of 2θ) may change depending on the kind, composi-tion, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semicon-ductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing pro-cess (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD mea-surement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<Structure of Oxide Semiconductor>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current ($I_{on}$), a high field-effect mobility ($\mu$), and excellent switching operation can be achieved.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be obtained. In addition, a transistor having high reliability can be obtained.

An oxide semiconductor having a low carrier concentration is preferably used for a channel formation region of the transistor. For example, the carrier concentration in an oxide semiconductor in the channel formation region is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of an interface with the channel formation region of the oxide semiconductor (the concentrations obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor that is obtained by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor that is obtained by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the channel formation region of the oxide semiconductor is preferably reduced as much as possible. Specifically, the hydrogen concentration in the channel formation region of the oxide semiconductor that is obtained by SIMS is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for a channel formation region of a transistor, stable electrical characteristics can be given.

<Other Semiconductor Materials>

A semiconductor material that can be used for a semiconductor layer of a transistor is not limited to the above metal oxides. A semiconductor material that has a band gap (a semiconductor material that is not a zero-gap semiconductor) may be used for the semiconductor layer. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For a semiconductor layer of a transistor, transition metal chalcogenide functioning as a semiconductor is preferably used, for example. Specific examples of the transition metal chalcogenide that can be used for the semiconductor layer include molybdenum sulfide (typically MoS$_2$), molybdenum selenide (typically MoSe$_2$), molybdenum telluride (typically MoTe$_2$), tungsten sulfide (typically WS$_2$), tungsten selenide (typically WSe$_2$), tungsten telluride (typically WTe$_2$), hafnium sulfide (typically HfS$_2$), hafnium selenide (typically HfSe$_2$), zirconium sulfide (typically ZrS$_2$), and zirconium selenide (typically ZrSe$_2$).

Modification Example 1

Figure 2:
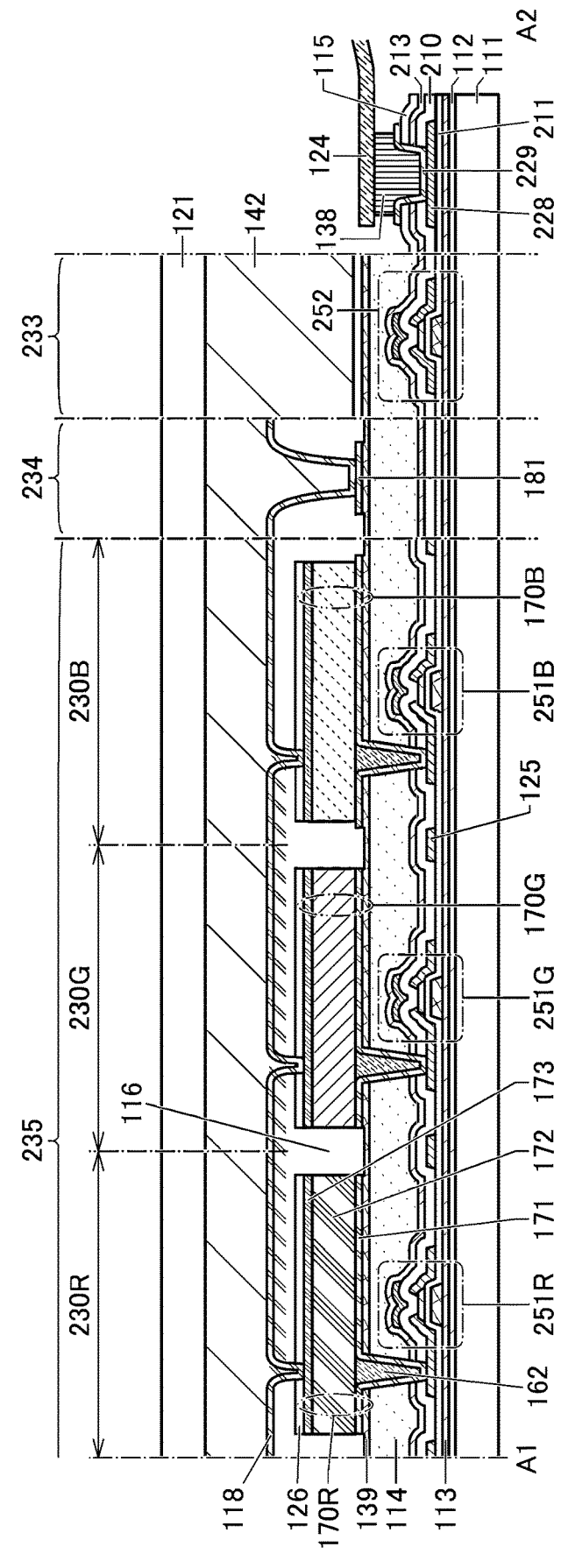
FIG. 2 is a diagram illustrating a structure example of a display device.

FIG. 2 is a schematic cross-sectional view of a display device 100A, which is a modification example of the display device 100. The display device 100A is different from the display device 100 in not including the insulating layer 115. For example, when the insulating layer 116 is formed using a material through which hydrogen and moisture do not easily pass, the formation of the insulating layer 115 can be omitted.

Modification Example 2

Figure 3:
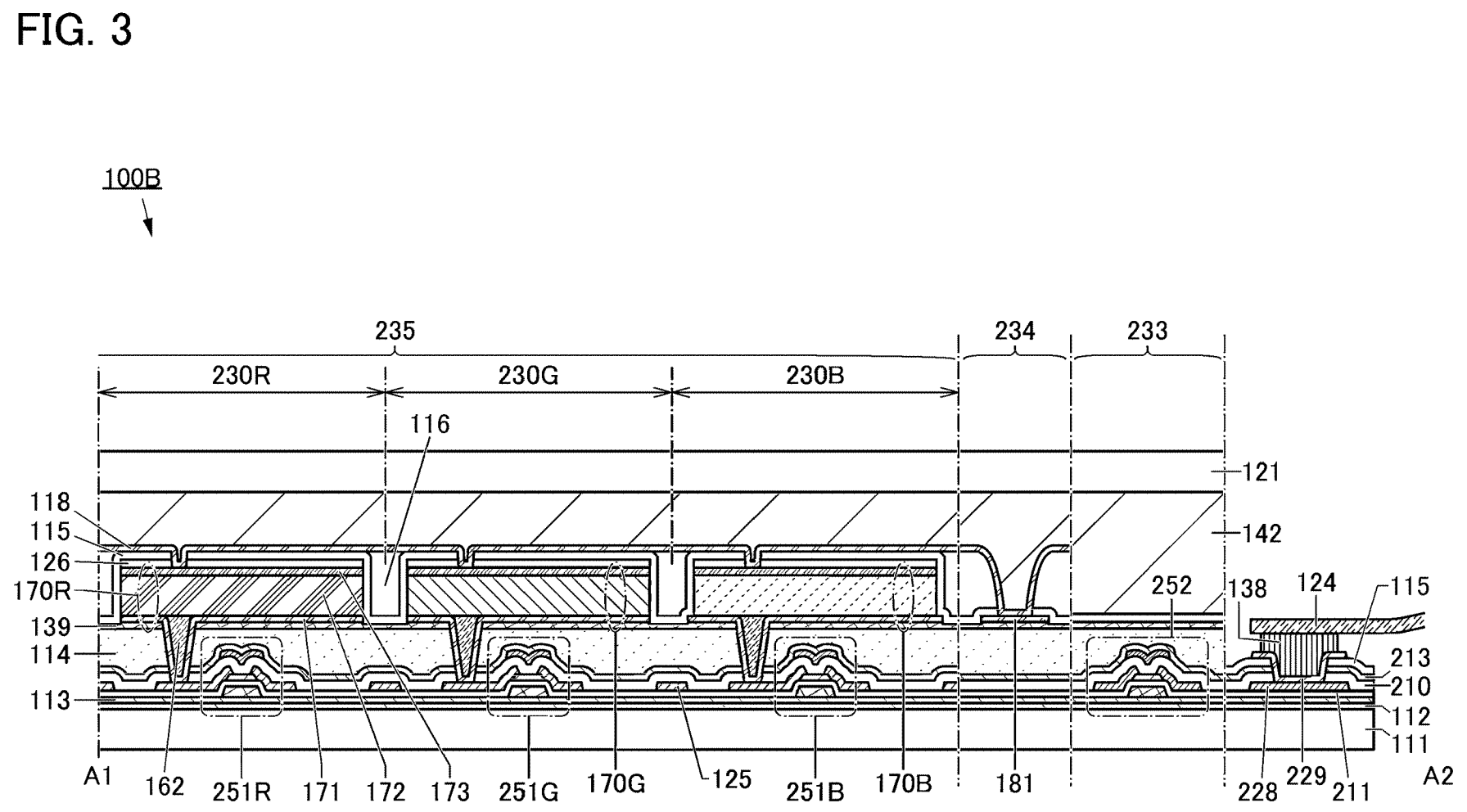

FIG. 3 is a schematic cross-sectional view of a display device 100B, which is a modification example of the display device 100. The display device 100B is different from the display device 100 in that the insulating layer 116 in a region overlapping with the light-emitting element 170 is removed and the top surface of the insulating layer 116 and the top surface of the insulating layer 115 are aligned or substantially aligned with each other. Such a structure can be obtained by performing anisotropic etching treatment by a dry etching method or the like after the formation of the insulating layer 116.

In the display device 100B illustrated in FIG. 3, the insulating layer 116 in the region overlapping with the light-emitting element 170 is removed, and the conductive layer 118 and the insulating layer 115 are in contact with each other in the region. Removing the insulating layer 116 in the region overlapping with the light-emitting element 170 can reduce the thickness of the display device 100B. In addition, the weight of the display device 100B can be reduced.

Modification Example 3

Figure 4:
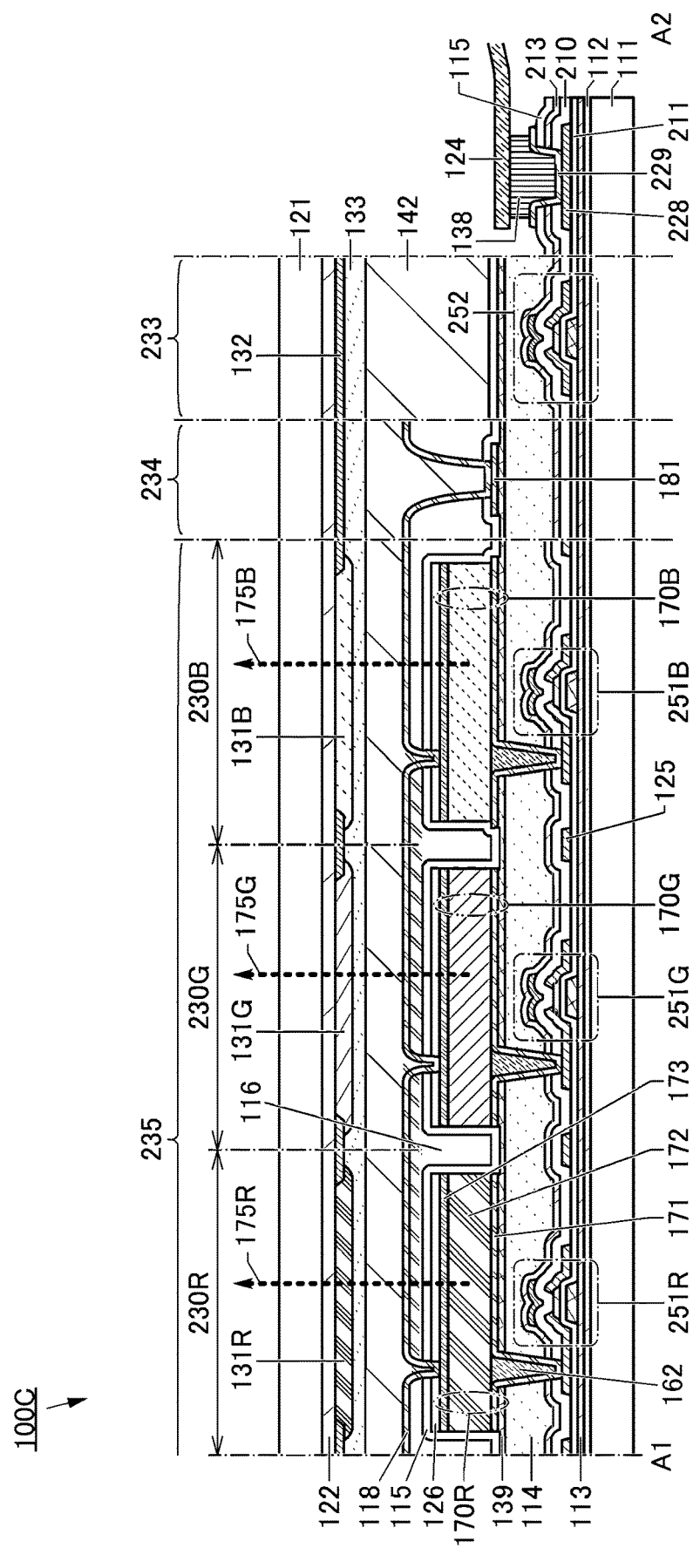
FIG. 4 is a diagram illustrating a structure example of a display device.

FIG. 4 illustrates a cross section of a display device 100C, which is a modification example of the display device 100.

In the display device 100C, the substrate 121 is provided with an insulating layer 122, a coloring layer 131 (a coloring layer 131R, a coloring layer 131G, and a coloring layer 131B), a light-blocking layer 132, an insulating layer 133, and the like. The insulating layer 133 may have a function of a planarization layer.

The coloring layer 131R has a function of transmitting a red color gamut, the coloring layer 131G has a function of transmitting a green color gamut, and the coloring layer 131B has a function of transmitting a blue color gamut. In the case of providing the coloring layer 131 and the light-blocking layer 132, a region where the coloring layer 131 and the light-blocking layer 132 overlap with each other is formed in a peripheral portion of the coloring layer 131.

The coloring layer 131R has a region overlapping with the light-emitting element 170R, the coloring layer 131G has a region overlapping with the light-emitting element 170G, and the coloring layer 131B has a region overlapping with the light-emitting element 170B. When the coloring layer 131 and the light-emitting element 170 are provided to overlap with each other, the color purity of the light 175 can be increased.

Modification Example 4

Figure 5:
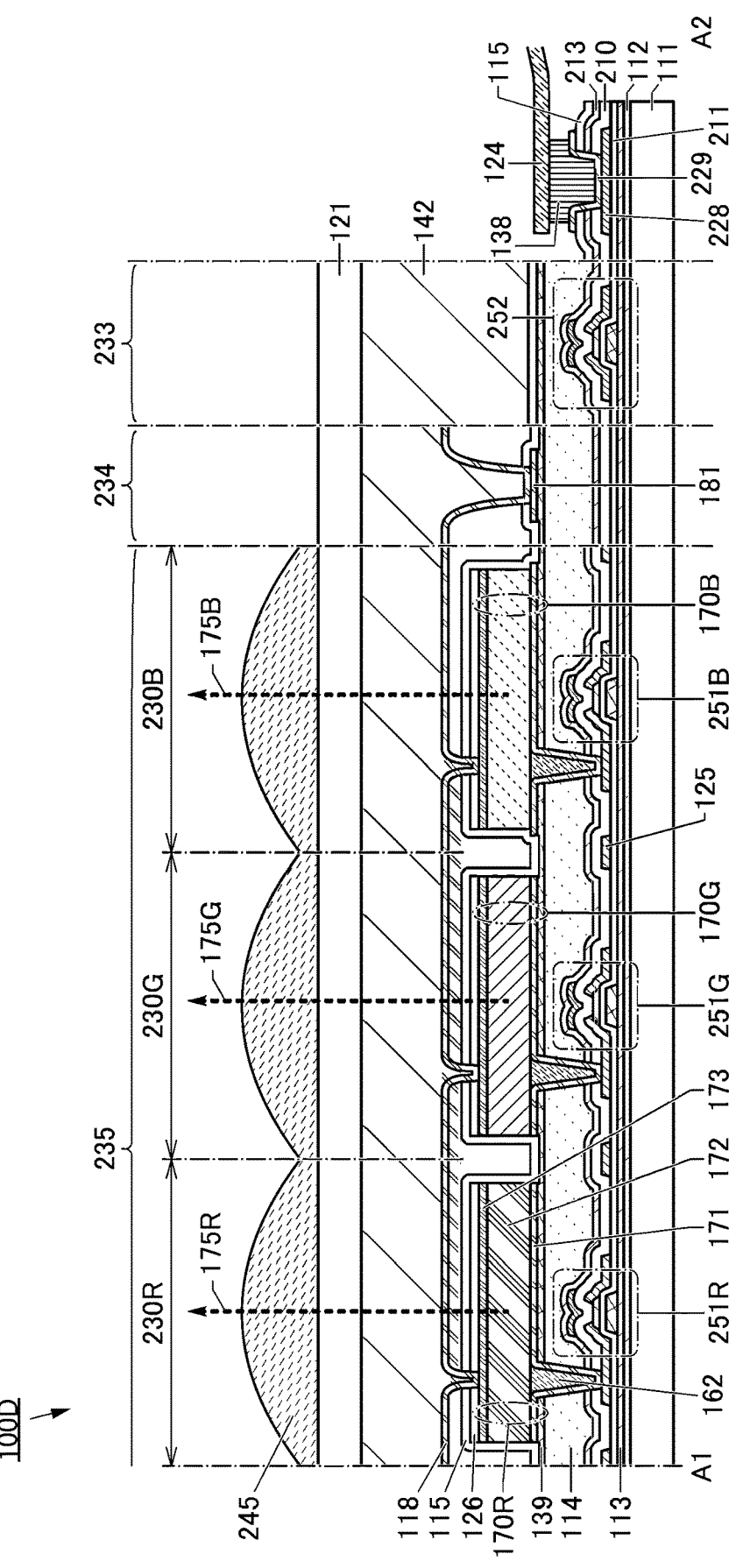
FIG. 5 is a diagram illustrating a structure example of a display device.

FIG. 5 illustrates a cross section of a display device 100D, which is a modification example of the display device 100. The display device 100D is different from the display device 100 in that a microlens array 245 is provided over the substrate 121. The microlens array 245 includes a plurality of microlenses, and the microlenses are provided to overlap with the pixel 230. The light 175 emitted from the light-emitting element 170 is condensed by the microlens array 245. This can increase the light extraction efficiency of the display device.

Modification Example 5

Figure 6:
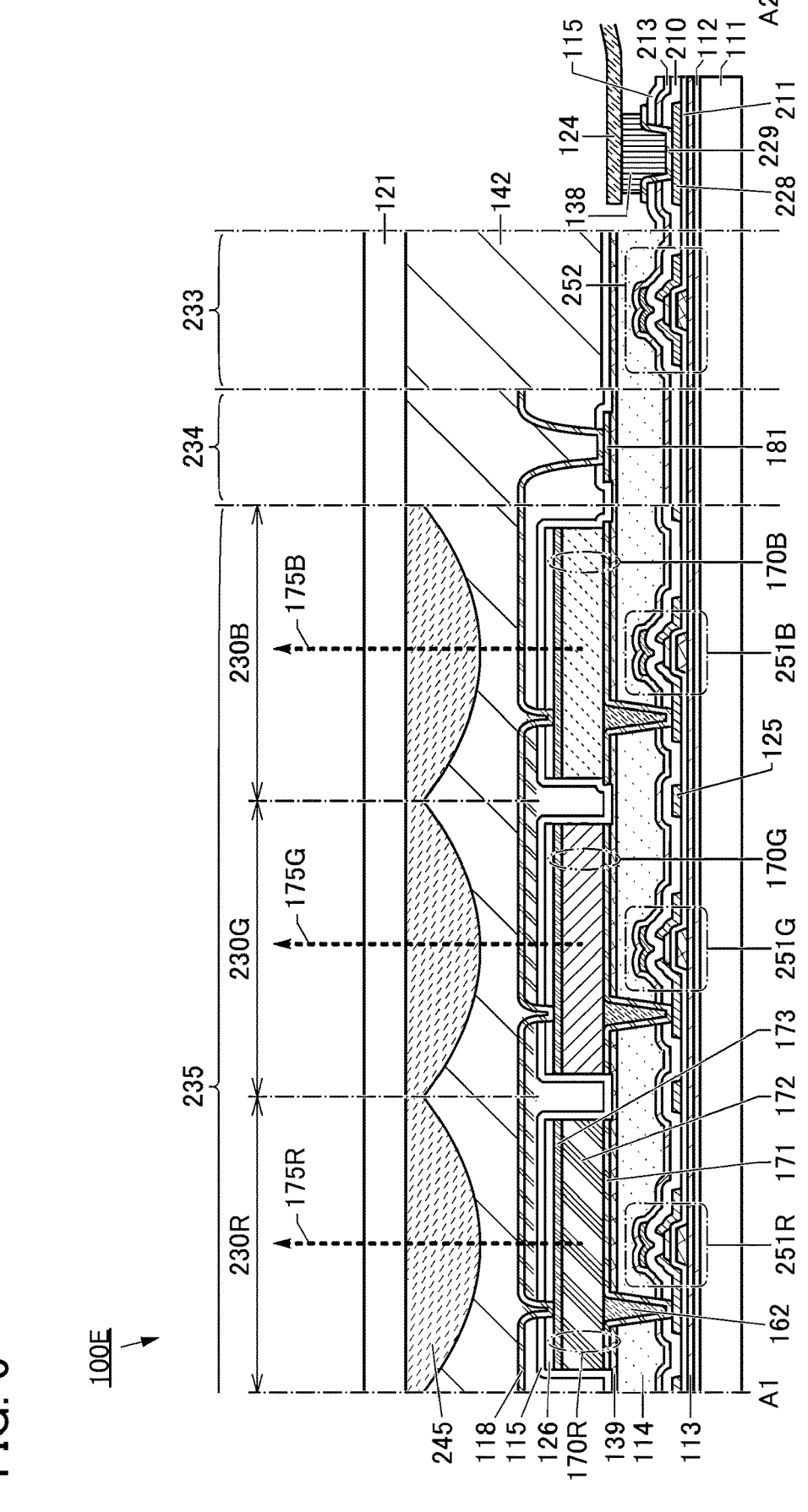
FIG. 6 is a diagram illustrating a structure example of a display device.

FIG. 6 illustrates a cross section of a display device 100E, which is a modification example of the display device 100D. The microlens array 245 may be provided between the substrate 121 and the adhesive layer 142. In the case of the structure illustrated in FIG. 6, the refractive index of the microlens array 245 is preferably higher than the refractive index of the adhesive layer 142.

Modification Example 6

Figure 7:
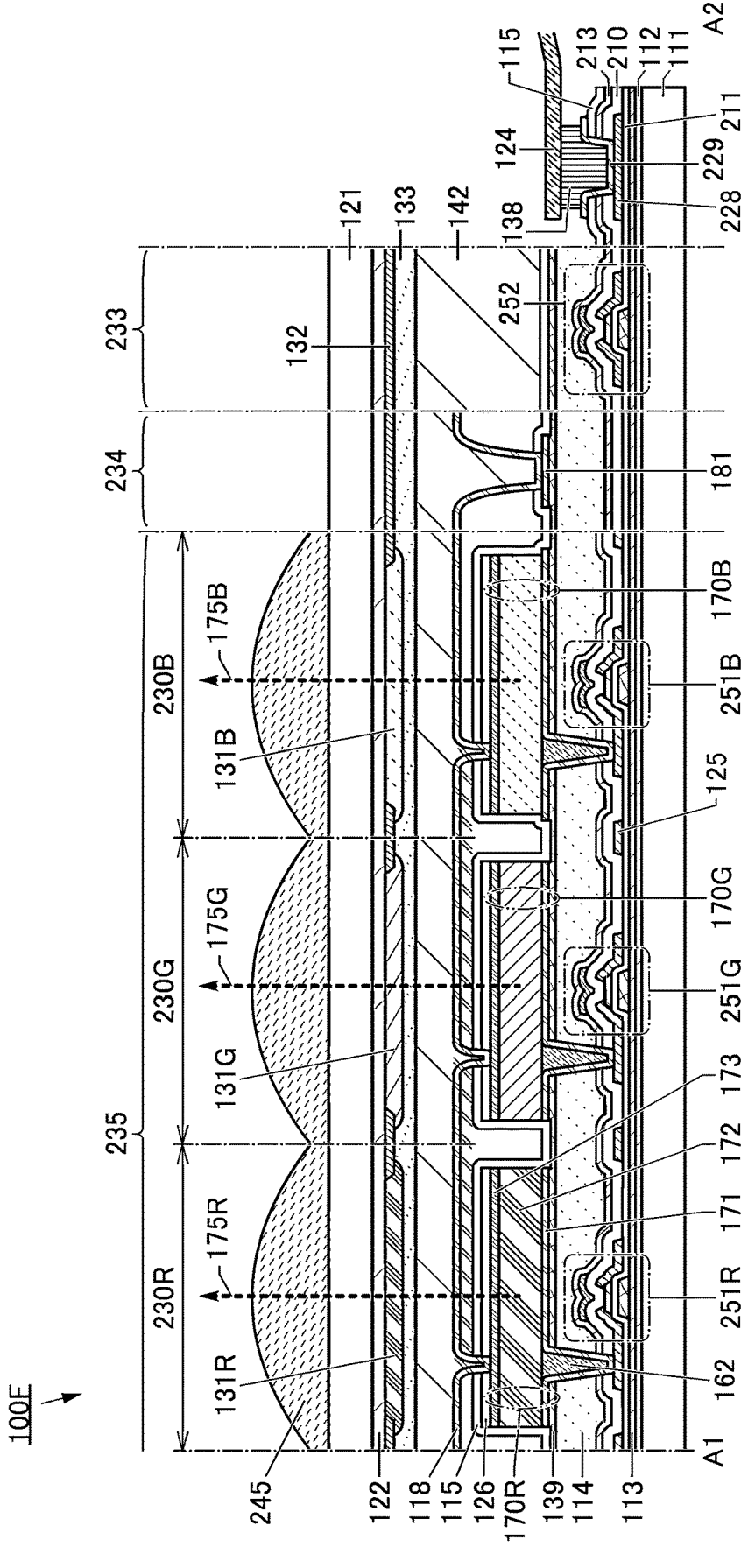
FIG. 7 is a diagram illustrating a structure example of a display device.

FIG. 7 illustrates a cross section of a display device 100F, which is a modification example of the display device 100. The display device 100F has a structure in which the display device 100C and the display device 100D are combined. The use of both the coloring layer 131 and the microlens array 245 can achieve a display device with higher display quality.

Modification Example 7

Figure 8:
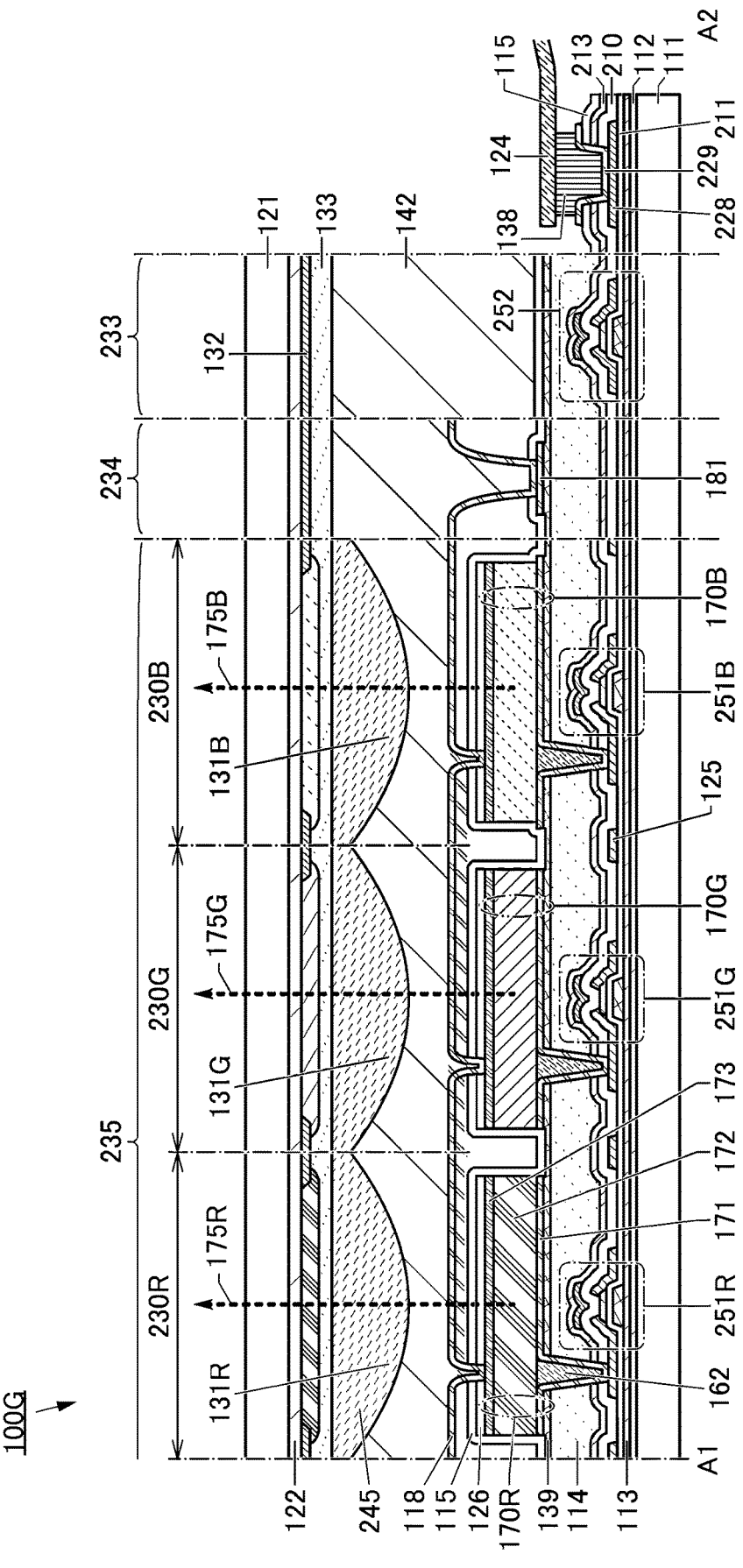
FIG. 8 is a diagram illustrating a structure example of a display device.

FIG. 8 illustrates a cross section of a display device 100G, which is a modification example of the display device 100. The display device 100G has a structure in which the display device 100C and the display device 100E are combined. The use of both the coloring layer 131 and the microlens array 245 can achieve a display device with higher display quality.

Modification Example 8

Figure 9:
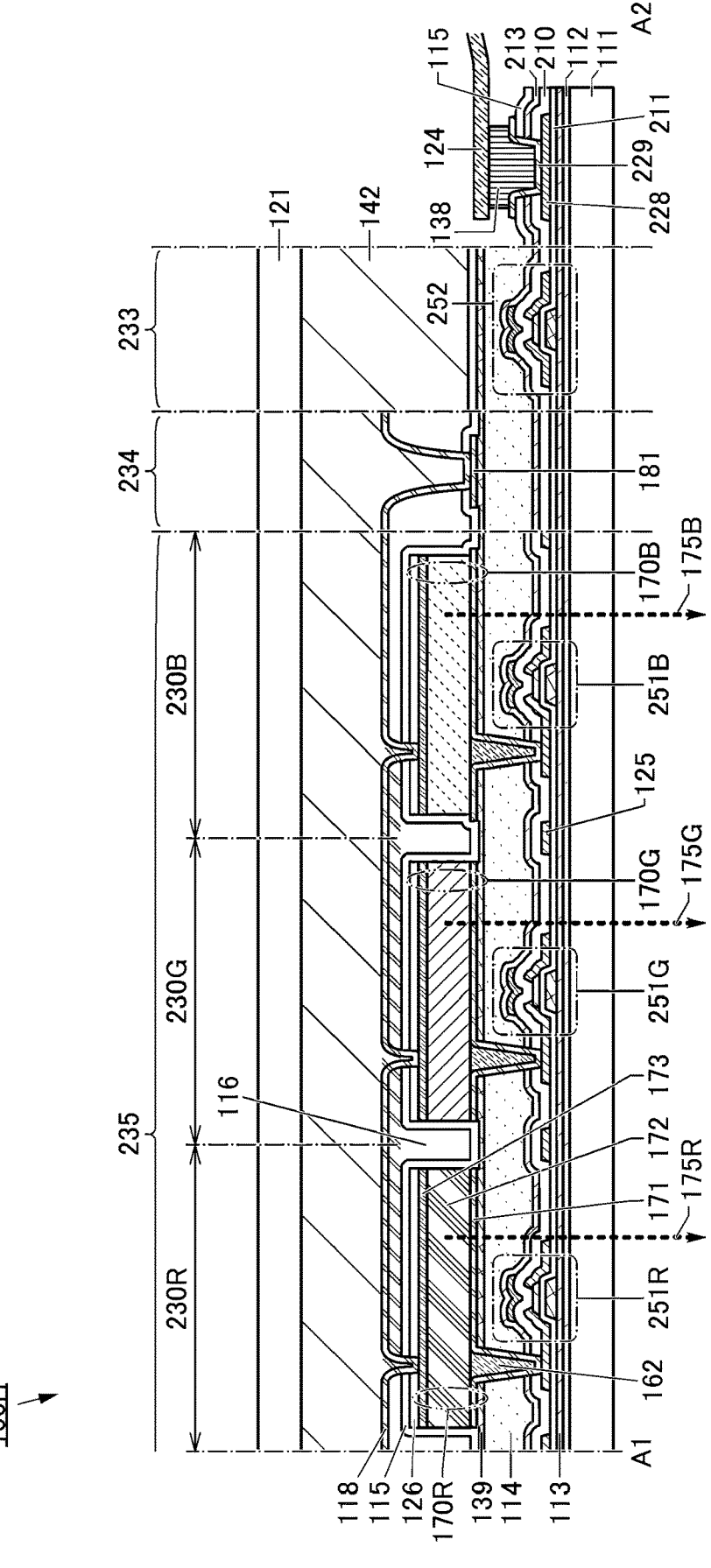
FIG. 9 is a diagram illustrating a structure example of a display device.

The display device 100 is not limited to a top-emission display device and may be a bottom-emission display device. FIG. 9 illustrates a cross section of a display device 100H, which is a modification example of the display device 100. The display device 100H is a bottom-emission display device including the light-emitting element 170 with a bottom-emission structure.

The light-emitting element 170 with a bottom-emission structure includes the electrode 171 formed using a conductive material that transmits visible light and the electrode 173 formed using a conductive material that reflects visible light.

Note that the light-emitting element 170 can be a light-emitting element with a dual-emission structure. In the case where the light-emitting element 170 is a light-emitting element with a dual-emission structure, both the electrode 171 and the electrode 173 are formed using a conductive material that transmits visible light.

Modification Example 9

Figure 10:
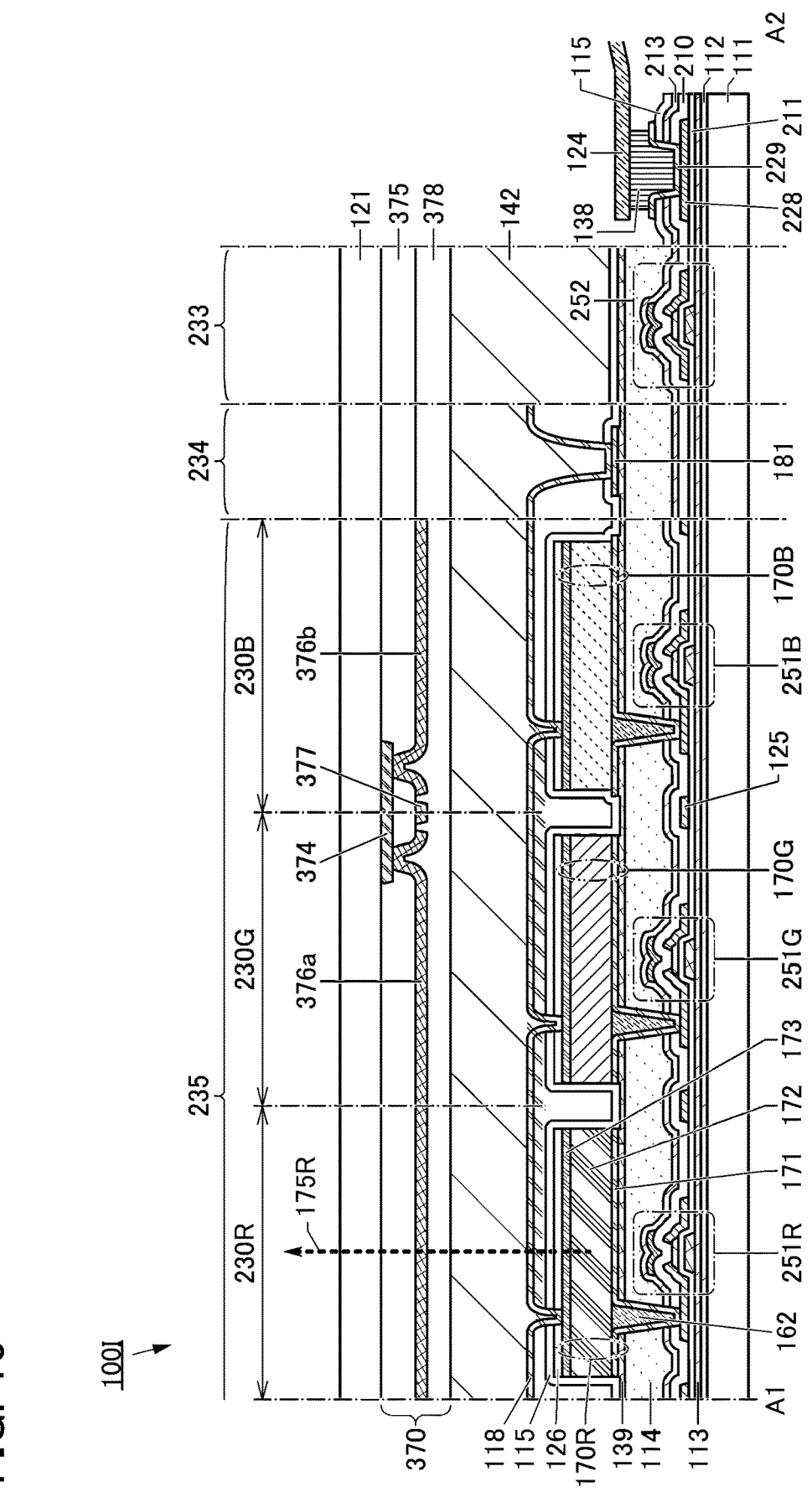
FIG. 10 is a diagram illustrating a structure example of a display device.

FIG. 10 illustrates a cross section of a display device 100I, which is a modification example of the display device 100. The display device 100I includes a touch sensor 370 between the substrate 121 and the adhesive layer 142. In this embodiment, the touch sensor 370 includes a conductive layer 374, an insulating layer 375, a conductive layer 376a, a conductive layer 376b, a conductive layer 377, and an insulating layer 378.

The conductive layer 376a, the conductive layer 376b, and the conductive layer 377 are each preferably formed using a conductive material with a light-transmitting property. However, a conductive material with a light-transmitting property generally has resistivity higher than that of a conductive material that does not have a light-transmitting property (a conductive material with a light-blocking property). Thus, the conductive layer 376a, the conductive layer 376b, and the conductive layer 377 are formed using a metal material having low resistivity in some cases to increase the size and resolution of the touch sensor.

In the case where the conductive layer 376a, the conductive layer 376b, and the conductive layer 377 are each formed using a metal material, the reflection of external light is preferably reduced. Although a metal material generally has a high reflectance, a metal can be darkened by being reduced in reflectance by oxidation treatment or the like.

The conductive layer 376a, the conductive layer 376b, and the conductive layer 377 may each be formed using a stack including a metal layer and a layer having a low reflectance (also referred to as a "dark-colored layer"). The dark-colored layer has a high resistivity; thus, the stack including the metal layer and the dark-colored layer is preferable. Examples of the dark-colored layer include a layer containing copper oxide and a layer containing copper chloride or tellurium chloride. Alternatively, the dark-colored layer may be formed using a metal microparticle such as an Ag particle, an Ag fiber, or a Cu particle, a carbon nanoparticle such as a carbon nanotube (CNT) or graphene, a conductive high molecule such as PEDOT, polyaniline, or polypyrrole, or the like.

As the touch sensor 370, for example, an optical touch sensor using a photoelectric conversion element as well as a resistive touch sensor or a capacitive touch sensor may be used. Examples of the capacitive touch sensor include a surface capacitive touch sensor and a projected capacitive touch sensor. Examples of the projected capacitive touch sensor include a self-capacitive touch sensor and a mutual-capacitive touch sensor, which differ mainly in the driving method. The use of a mutual-capacitive touch sensor is preferable because multiple points can be sensed simultaneously.

Note that other components are similar to those of the display device 100; thus, the detailed description thereof is omitted.

The touch sensor may be provided outside the substrate 121. For example, a sheet-like touch sensor may be provided to overlap with the display region 235.

<<Example of Fabrication Method>>

An example of a fabrication method of the display device 100 will be described with reference to drawings. In this embodiment, the display region 235 and the cathode contact region 234 are focused on in the description of the fabrication method.

Note that insulating layers, semiconductor layer, conductive layers for forming electrodes and wirings, and the like that constitute the display device can be formed by a sputtering method, a chemical vapor deposition (CVD) method, a vacuum evaporation method, a pulsed laser deposition (PLD) method, an atomic layer deposition (ALD) method, a plasma ALD (PEALD: Plasma Enhanced ALD) method, or the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, the insulating layers, the semiconductor layer, the conductive layers for forming electrodes and wirings, and the like that constitute the display device may be formed by a method such as spin coating, dipping, spray coating, ink-jetting, dispensing, screen printing, offset printing, slit coating, roll coating, curtain coating, and knife coating.

A PECVD method can provide a high-quality film at a relatively low temperature. With the use of a deposition method that does not use plasma at the time of deposition, such as an MOCVD method, an ALD method, or a thermal CVD method, damage is not easily caused on a surface where the film is formed. For example, a wiring, an electrode, an element (a transistor, a capacitor, or the like), or the like included in a semiconductor device might be charged up by receiving charge from plasma. In this case, accumulated charge might break the wiring, the electrode, the element, or the like included in the semiconductor device. By contrast, in the case of a deposition method that does not use plasma, such plasma damage is not caused; thus, the yield of semiconductor devices can be increased. Moreover, since plasma damage during deposition is not caused, a film with few defects can be obtained.

Unlike a deposition method in which particles ejected from a target or the like are deposited, a CVD method and an ALD method are deposition methods in which a film is formed by reaction at a surface of an object to be processed. Thus, the CVD method and the ALD method are deposition methods that enable good step coverage almost regardless of the shape of an object to be processed. In particular, the ALD method enables excellent step coverage and excellent thickness uniformity and thus is suitably used to cover a surface of an opening portion with a high aspect ratio, for example. Meanwhile, the ALD method has a comparatively low deposition rate, and thus is preferably used in combination with another deposition method with a high deposition rate, such as the CVD method, in some cases.

When a CVD method or an ALD method is used, the composition of a film to be obtained can be controlled with the flow rate ratio of source gases. For example, by the CVD method and the ALD method, a film with a certain composition can be formed depending on the flow rate ratio of the source gases. Moreover, for example, by the CVD method and the ALD method, a film whose composition is continuously changed can be formed by changing the flow rate ratio of the source gases during deposition. In the case of forming a film while changing the flow rate ratio of the source gases, as compared with the case of forming a film with the use of a plurality of deposition chambers, the time taken for the deposition can be shortened because the time taken for transfer and pressure adjustment is omitted. Thus, the productivity of the semiconductor device can be increased in some cases.

Note that in the case of forming a film by an ALD method, a gas that does not contain chlorine is preferably used as a material gas.

Furthermore, in the case where an oxide semiconductor is formed by a sputtering method, a chamber of a sputtering apparatus is preferably evacuated to a high vacuum (to the degree of approximately $5\times10^{-7}$ Pa to $1\times10^{-4}$ Pa) by an adsorption vacuum evacuation pump such as a cryopump so that water and the like acting as impurities for the oxide semiconductor are removed as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa. The deposition temperature is preferably higher than or equal to RT and lower than or equal to 500° C., further preferably higher than or equal to RT and lower than or equal to 300° C., still further preferably higher than or equal to RT and lower than or equal to 200° C.

In addition, increasing the purity of a sputtering gas is necessary. For example, as an oxygen gas or an argon gas used for a sputtering gas, a gas that is highly purified to have a dew point of −40° C. or lower, preferably −80° C. or lower, further preferably −100° C. or lower, still further preferably −120° C. or lower is used, whereby entry of moisture or the like into the oxide semiconductor film can be inhibited as much as possible.

In the case where the insulating layers, the conductive layers, the semiconductor layer, and the like are formed by a sputtering method using a sputtering gas containing oxygen, oxygen can be supplied to a layer over which these layers are formed. As the amount of oxygen contained in the sputtering gas increases, the amount of oxygen supplied to the layer over which these layers are formed tends to increase.

When the layers (thin films) that constitute the display device are processed, a photolithography method or the like can be used. Alternatively, island-shaped layers may be formed by a deposition method using a blocking mask. Alternatively, a nanoimprinting method, a sandblasting method, a lift-off method, or the like may be used for the processing of the layers. As a photolithography method, a method in which a resist mask is formed over a layer (thin film) to be processed, part of the layer (thin film) is selected and removed by using the resist mask as a mask, and the resist mask is removed, and a method in which a photosensitive layer is formed, and then the layer is exposed to light and developed to be processed into a desired shape are given.

In the case of using light in the photolithography method, an i-line (a wavelength of 365 nm), a g-line (a wavelength of 436 nm), and an h-line (a wavelength of 405 nm), or combined light of them can be used for light exposure.

Besides, ultraviolet light, KrF laser light, ArF laser light, or the like can also be used. Light exposure may be performed by liquid immersion light exposure technique. Furthermore, as the light used for the light exposure, extreme ultraviolet (EUV) light, X-rays, or the like may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For removal (etching) of the layers (thin films), a dry etching method, a wet etching method, or the like can be used. The etching methods may be used in combination.

The display device 100 is fabricated by combining an element substrate 151 (see FIG. 22A) and the substrate 121.

[Element Substrate 151]

An example of a fabrication method of the element substrate 151 will be described.

[Step 1]

The insulating layer 112 and the insulating layer 113 are formed over the substrate 111 (see FIG. 11A). The insulating layer 112 and the insulating layer 113 may each be a stack of a plurality of insulating layers.

As the insulating layer 112 and the insulating layer 113, an inorganic insulating film such as a silicon nitride film, a silicon oxynitride film, a silicon oxide film, a silicon nitride oxide film, an aluminum oxide film, or an aluminum nitride film can be used, for example. An inorganic insulating film such as a hafnium oxide film, an yttrium oxide film, a zirconium oxide film, a gallium oxide film, a tantalum oxide film, a magnesium oxide film, a lanthanum oxide film, a cerium oxide film, or a neodymium oxide film may also be used. A stack including two or more of the above insulating films may also be used. For at least one of the insulating layer 112 and the insulating layer 113, a material through which impurities such as hydrogen and water do not easily pass is preferably used.

An inorganic insulating film is preferably formed at high temperatures because the film can have higher density and a higher barrier property as the deposition temperature becomes higher. The substrate temperature at the time of depositing the inorganic insulating film is preferably higher than or equal to room temperature (25° C.) and lower than or equal to 350° C., further preferably higher than or equal to 100° C. and lower than or equal to 300° C.

[Step 2]

Then, an electrode 221 is formed over the insulating layer 113. The electrode 221 can be formed in the following manner: a conductive film is formed, a resist mask is formed, the conductive film is etched, and the resist mask is removed.

[Step 3]

Next, the insulating layer 211 is formed over the insulating layer 113 and the electrode 221. For the insulating layer 211, a material similar to that for the insulating layer 112 or the insulating layer 113 can be used. The insulating layer 211 may be a stack of a plurality of insulating layers.

In the case where an oxide semiconductor is used for a semiconductor layer 231, an insulating layer including a region in contact with the semiconductor layer 231 is preferably an insulating layer from which oxygen is released by heating (hereinafter, also referred to as "an insulating layer containing excess oxygen"). Therefore, in the case where an oxide semiconductor is used for the semiconductor layer 231, the insulating layer 211 is preferably the insulating layer containing excess oxygen.

Note that in this specification and the like, oxygen released from a layer by heating is referred to as "excess oxygen". In the insulating layer containing excess oxygen, the amount of released oxygen converted into oxygen atoms is sometimes $1.0 \times 10^{18}$ atoms/cm³ or more, $1.0 \times 10^{19}$ atoms/cm³ or more, or $1.0 \times 10^{20}$ atoms/cm³ or more in TDS analysis performed with heat treatment where the surface temperature of the insulating layer is higher than or equal to 100° C. and lower than or equal to 700° C., preferably higher than or equal to 100° C. and lower than or equal to 500° C.

[Step 4]

Next, the semiconductor layer 231 is formed. In this embodiment, an oxide semiconductor layer is formed as the semiconductor layer 231. The oxide semiconductor layer can be formed in the following manner: after an oxide semiconductor film is formed, a resist mask is formed, the oxide semiconductor film is etched, and then the resist mask is removed.

The substrate temperature at the time of forming the oxide semiconductor film is preferably lower than or equal to 350° C., further preferably higher than or equal to room temperature and lower than or equal to 200° C., still further preferably higher than or equal to room temperature and lower than or equal to 130° C.

The oxide semiconductor film can be formed by a sputtering method using one or both of an inert gas and an oxygen gas as a sputtering gas, for example. Note that there is no particular limitation on the flow rate ratio of an oxygen gas (the partial pressure of oxygen) at the time of forming the oxide semiconductor film. However, to obtain a transistor having high field-effect mobility, the flow rate ratio of oxygen (the partial pressure of oxygen) at the time of forming the oxide semiconductor film is preferably higher than or equal to 0% and lower than or equal to 30%, further preferably higher than or equal to 5% and lower than or equal to 30%, still further preferably higher than or equal to 7% and lower than or equal to 15%.

The oxide semiconductor film preferably contains at least indium or zinc. In particular, indium and zinc are preferably contained.

An oxide semiconductor preferably has an energy gap of 2 eV or more, further preferably 2.5 eV or more, still further preferably 3 eV or more. The use of such an oxide semiconductor having a wide energy gap can reduce the off-state current of the transistor.

A semiconductor material having an energy gap of 2.5 eV or more is particularly preferable because of its high visible light transmittance.

The oxide semiconductor film can be formed by a sputtering method. Alternatively, a PLD method, a PECVD method, a thermal CVD method, an ALD method, or a vacuum evaporation method may be used, for example.

[Step 5]

Next, an electrode 224a, an electrode 224b, and a wiring 125 are formed (see FIG. 11B). The electrode 224a, the electrode 224b, and the wiring 125 can be formed in the following manner: a conductive film is formed, a resist mask is formed, the conductive film is etched, and then the resist mask is removed. Each of the electrode 224a and the electrode 224b is electrically connected to the semiconductor layer 231.

Note that during the formation of the electrode 224a and the electrode 224b, part of the semiconductor layer 231 that is not covered with the resist mask might be reduced in thickness by etching.

[Step 6]

Then, the insulating layer 210 is formed. An oxide insulating layer, such as a silicon oxide layer or a silicon oxynitride layer, formed in an oxygen-containing atmosphere is preferably used as the insulating layer 210. Forming the oxide insulating layer in an oxygen-containing atmosphere enables the insulating layer to contain excess oxygen.

[Step 7]

Then, an electrode 226 is formed over the insulating layer 210. The electrode 226 includes a region overlapping with the semiconductor layer 231. In the above manner, the transistor 251 can be formed. Although not illustrated, the transistor 252 is formed in a similar manner.

[Step 8]

Next, the insulating layer 213 is formed (see FIG. 11C). The insulating layer 213 is preferably formed using an insulating material through which oxygen does not easily diffuse or pass, such as silicon nitride.

In the case where the insulating layer 210 is an insulating layer containing excess oxygen, heat treatment is performed with an insulating film through which oxygen does not easily diffuse or pass is stacked thereover, whereby oxygen can be efficiently supplied to the oxide semiconductor layer. As a result, oxygen vacancies in the oxide semiconductor layer can be filled and defects at the interface between the oxide semiconductor layer and the insulating layer 210 can be repaired, leading to a reduction in defect levels. Accordingly, a transistor with extremely high reliability can be obtained. The use of such a transistor in a display device can increase the reliability of the display device.

[Step 9]

Next, the insulating layer 114 is formed. The insulating layer 114 preferably functions as a planarization layer.

[Step 10]

Next, the insulating layer 139 is formed. The insulating layer 139 is a layer having a surface where the display element is to be formed later. The insulating layer 139 functions as an etching stopper at the time when parts of the electrode 171, the EL layer 172, and the electrode 173 are etched in a later step.

In particular, the insulating layer 139 is formed using a material that is unlikely to be etched at the time of the etching treatment of the electrode 173. In the case where the electrode 173 is etched by a dry etching method or mainly by a dry etching method, the insulating layer 139 is preferably provided. Providing the insulating layer 139 can increase the process design flexibility, thereby increasing the productivity and the reliability.

[Step 11]

Next, an opening 161 that reaches the electrode 224a is formed by removing parts of the insulating layer 139, the insulating layer 114, the insulating layer 213, and the insulating layer 210.

[Step 12]

Figures 12A, 12B, 12C:
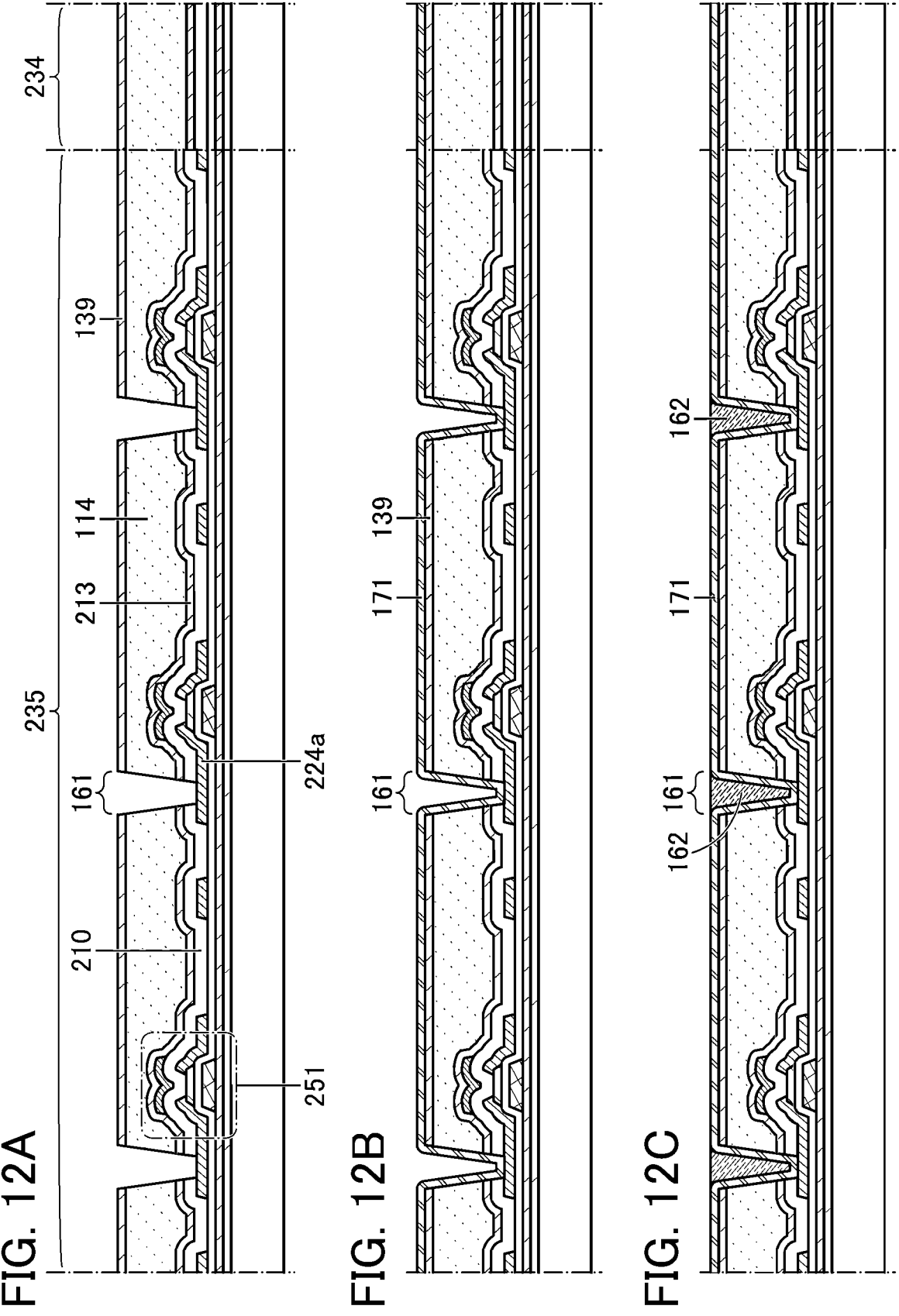
FIG. 12A to FIG. 12C are diagrams illustrating an example of a method for fabricating a display device.

Next, the electrode 171 is formed over the insulating layer 139 (see FIG. 12B). The electrode 171 is formed using a conductive material reflecting visible light. In the case where the electrode 171 is used as an anode, the electrode 171 has a stacked-layer structure of ITO and silver, for example. Alternatively, a stacked-layer structure in which silver is interposed between two layers of ITO can be employed, for example.

[Step 13]

Next, the layer 162 is provided in the opening 161 so as to fill the opening 161. Providing the layer 162 in the opening 161 can reduce the top surface unevenness and thus can increase the coverage with the insulating layers, the conductive layers, and the like formed later. Thus, it is preferable that the top surface of the layer 162 and the top surface of the electrode 171 be aligned or substantially aligned with each other.

Examples of a material used for the layer 162 include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the layer 162. The photoresist used as the layer 162 may be a positive photoresist or a negative photoresist.

[Step 14]

Figures 13A, 13B:
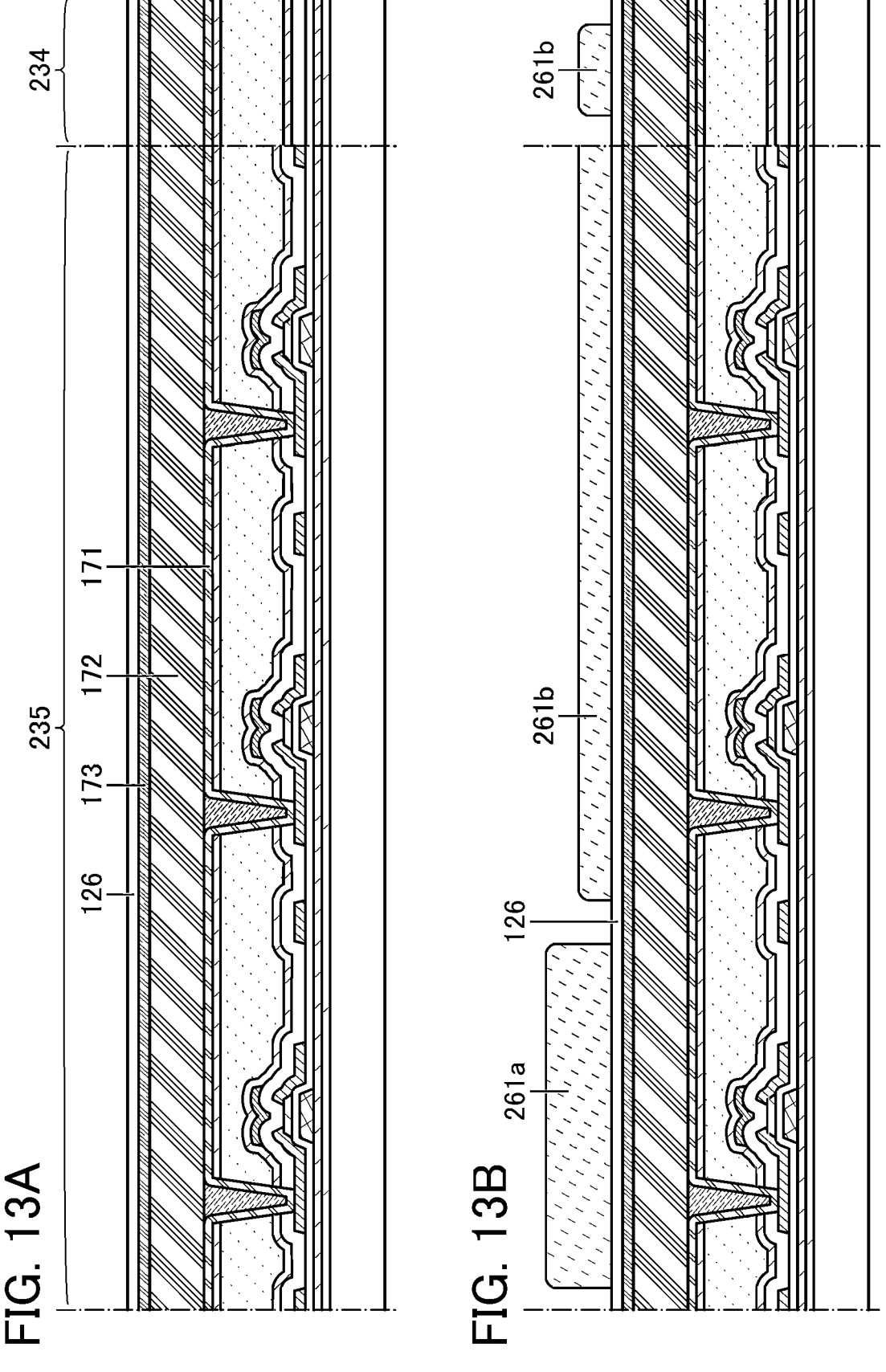
FIG. 13A and FIG. 13B are diagrams illustrating an example of a method for fabricating a display device.

Next, the EL layer 172 is formed (see FIG. 13A). In this step, the EL layer 172 is formed using an organic EL material containing a red-light-emitting material. The EL layer 172 can be formed by a method such as an evaporation method, a coating method, a printing method, or a discharge method. Steps performed after the formation of the EL layer 172 are preferably performed such that the temperature applied to the EL layer 172 is lower than or equal to the upper temperature limit of the EL layer 172.

[Step 15]

Next, the electrode 173 is formed. The electrode 173 is formed using a conductive material transmitting visible light. In the case where the electrode 173 is used as a cathode, the electrode 173 has a stacked-layer structure of lithium fluoride and ITO, which is a conductive material having a light-transmitting property, for example.

[Step 16]

Next, the protective layer 126 is formed. The protective layer 126 is formed using a material transmitting visible light. For the protective layer 126, a material such as silicon oxide, silicon nitride, aluminum oxide, or an oxide semiconductor can be used, for example. The protective layer 126 may have a single-layer structure or a stacked-layer structure. For example, the protective layer 126 may have a stacked-layer structure of aluminum oxide and silicon nitride, or a stacked-layer structure of aluminum oxide and an oxide semiconductor (e.g., IGZO).

The protective layer 126 can be formed by, for example, a sputtering method, an ALD method (including a thermal ALD method and a PEALD method), or a vacuum evaporation method. The protective layer 126 is preferably formed by a formation method that causes less damage to the EL layer therebelow. Accordingly, the protective layer 126 is preferably formed by an ALD method or a vacuum evaporation method rather than a sputtering method. In the case where the protective layer 126 has a stacked-layer structure of a plurality of layers, a layer in contact with the electrode 173 may be formed by an ALD method and the other layers may be formed by a sputtering method.

[Step 17]

Next, a resist mask 261 is formed using a multi-tone mask over the protective layer 126 (see FIG. 13B).

Here, a multi-tone mask will be described with reference to FIG. 24. A multi-tone mask is a mask capable of light exposure of three levels to provide an exposed portion, a half-exposed portion, and an unexposed portion, and is a light-exposure mask through which light is transmitted to have a plurality of intensities. One-time light exposure and development process allows a resist mask including regions with a plurality (typically, two kinds) of thicknesses to be formed. Accordingly, the use of a multi-tone mask can reduce the number of light-exposure masks (photomasks).

Typical examples of a multi-tone mask include a gray-tone mask 304 illustrated in FIG. 24A1 and a half-tone mask 314 illustrated in FIG. 24B1.

As illustrated in FIG. 24A1, the gray-tone mask 304 includes a light-transmitting substrate 301, and a light-blocking portion 302 and a diffraction grating 303 that are formed thereon. The light transmittance of the light-blocking portion 302 is 0%. By contrast, in the diffraction grating 303, a gap in a light-transmitting portion in a slit form, a dot form, a mesh form, or the like is adjusted to be less than or equal to the resolution limit of light used for the light exposure; thus, the light transmittance can be controlled. The diffraction grating 303 can have regularly-arranged slits, dots, or meshes, or irregularly-arranged slits, dots, or meshes.

As the light-transmitting substrate 301, a light-transmitting substrate such as a quartz substrate can be used. The light-blocking portion 302 and the diffraction grating 303 can be formed using a light-blocking material that absorbs light, such as chromium or chromium oxide.

In the case where the gray-tone mask 304 is irradiated with light for light exposure, the light transmittance of the light-blocking portion 302 is 0% and the light transmittance of a region where neither the light-blocking portion 302 nor the diffraction grating 303 is provided is 100%, as shown in FIG. 24A2. The light transmittance of the diffraction grating 303 can be adjusted in the range from 10 to 70%. The light transmittance of the diffraction grating 303 can be adjusted by adjusting the interval and pitch of slits, dots, or meshes of the diffraction grating.

As illustrated in FIG. 24B1, the half-tone mask 314 includes a light-transmitting substrate 311, and a semi-transmissive portion 312 and a light-blocking portion 313 that are formed thereon. The semi-transmissive portion 312 can be formed using MoSiN, MoSi, MoSiO, MoSiON, CrSi, or the like. The light-blocking portion 313 can be formed using a light-blocking material that absorbs light, such as chromium or chromium oxide.

In the case where the half-tone mask 314 is irradiated with light for light exposure, the light transmittance of the light-blocking portion 313 is 0% and the light transmittance of a region where neither the light-blocking portion 313 nor the semi-transmissive portion 312 is provided is 100%, as shown in FIG. 24B2. The light transmittance of the semi-transmissive portion 312 can be adjusted in the range from 10 to 70%. The light transmittance of the semi-transmissive portion 312 can be adjusted by the material used for the semi-transmissive portion 312.

The resist mask 261 formed using a multi-tone mask is a resist mask including a plurality of regions with different thicknesses; in this embodiment, the resist mask 261 includes two regions of a thick region and a thin region. In this embodiment, the thick region of the resist mask 261 is referred to as a resist mask 261*a* and the thin region thereof is referred to as a resist mask 261*b*.

In this step, the resist mask 261 in a region to be the light-emitting element 170R in a later step (the resist mask 261*a*) is formed thickly, and the resist mask 261 in the other region (the resist mask 261*b*) is formed thinly.

[Step 18]

Next, parts of the protective layer 126, the electrode 173, the EL layer 172, and the electrode 171 are selectively removed using the resist mask 261 (the resist mask 261*a* and the resist mask 261*b*) as a mask (see FIG. 14A). The protective layer 126, the electrode 173, the EL layer 172, and the electrode 171 are etched by a dry etching method, a wet etching method, or the like. These etching methods may be used in combination. Note that an exposed part of the insulating layer 139 is sometimes etched at the time of etching the electrode 171.

Through this step, the light-emitting element 170R is formed. In FIG. 14A, the electrode 171, the EL layer 172, and the electrode 173 included in the light-emitting element 170R are illustrated as the electrode 171R, the EL layer 172R, and the electrode 173R. In addition, the protective layer 126 overlapping with the light-emitting element 170R is illustrated as a protective layer 126R.

When the light-emitting element 170R is seen from above, the shapes of the protective layer 126R, the electrode 173R, the EL layer 172R, and the electrode 171R are substantially the same. In addition, the side surfaces of the protective layer 126R, the electrode 173R, the EL layer 172R, and the electrode 171R are substantially aligned with each other. During the etching of the electrode 173R, the EL layer 172R, and the electrode 171R, the protective layer 126R functions as a mask. Thus, such a process can be called self-alignment patterning. The same applies to the light-emitting element 170G and the light-emitting element 170B described later.

Parts of the protective layer 126, the electrode 173, the EL layer 172, and the electrode 171 that overlap with the cathode contact region 234 are also selectively removed. In the cathode contact region 234, part of the electrode 171 is selectively removed so that the electrode 181 is formed.

[Step 19]

Next, the thickness of the resist mask 261*a* is reduced by ashing treatment using oxygen plasma, for example. At this time, the resist mask 261*b* that is thinner than the resist mask 261*a* is removed, so that the protective layer 126 in a region covered with the resist mask 261*b* is exposed (see FIG. 14B).

When the resist mask in the region to be the light-emitting element 170R is formed thickly in Step 17 of forming a resist mask, the resist mask 261 over the light-emitting element 170R (the resist mask 261*a*) remains. Note that through this step, the protective layer 126 adjacent to the outer portion of the resist mask 261*a* is sometimes exposed.

[Step 20]

Next, the region where the protective layer 126 is exposed in the previous step and the electrode 173 and the EL layer 172 that overlap with the region are removed, so that the electrode 171 and the electrode 181 that overlap with the region are exposed (see FIG. 15A).

At this time, the peripheral portions of the protective layer 126R, the electrode 173R, and the EL layer 172R are also removed in some cases. Thus, the end portion of the electrode 171R sometimes extends beyond the end portions of the protective layer 126R, the electrode 173R, and the EL layer 172R.

[Step 21]

Then, the resist mask 261*a* is removed. The resist mask 261*a* may be removed by a dry etching method or a wet etching method. For example, the resist mask 261*a* may be removed by ashing treatment using oxygen plasma, or the resist mask 261*a* may be removed using a stripping solution or the like.

[Step 22]

Next, the EL layer 172 is formed (see FIG. 15B). The formation of the EL layer 172 is performed in a manner similar to Step 14. Note that in this step, the EL layer 172 is formed using an organic EL material containing a green-light-emitting material.

[Step 23]

Next, the electrode 173 is formed. The formation of the electrode 173 is performed in a manner similar to Step 15.

[Step 24]

Next, the protective layer 126 is formed. The formation of the protective layer 126 is performed in a manner similar to Step 16.

[Step 25]

Next, the resist mask 261 is formed using a multi-tone mask over the protective layer 126 (see FIG. 16A). The formation of the resist mask 261 is performed in a manner similar to Step 17. Note that in this step, the resist mask in a region to be the light-emitting element 170G in a later step (the resist mask 261$a$) is formed thickly, and the resist mask 261 in the other region (the resist mask 261$b$) is formed thinly.

[Step 26]

Next, parts of the protective layer 126, the electrode 173, the EL layer 172, and the electrode 171 are selectively removed using the resist mask 261 as a mask (see FIG. 16B). The etching of the protective layer 126, the electrode 173, the EL layer 172, and the electrode 171 is performed in a manner similar to Step 18.

Through this step, the light-emitting element 170G is formed. In FIG. 16B, the electrode 171, the EL layer 172, and the electrode 173 included in the light-emitting element 170G are illustrated as the electrode 171G, the EL layer 172G, and the electrode 173G. In addition, the protective layer 126 overlapping with the light-emitting element 170G is illustrated as a protective layer 126G.

Through this step, the end portions of the electrode 171R are etched, so that the end portions of the protective layer 126R, the electrode 173R, the EL layer 172R, and the electrode 171R are sometimes aligned or substantially aligned with each other.

[Step 27]

Next, the thickness of the resist mask 261$a$ is reduced by ashing treatment using oxygen plasma, for example, as in Step 19. At this time, the resist mask 261$b$ is removed, so that the protective layer 126 in a region covered with the resist mask 261$b$ is exposed (see FIG. 17A).

When the resist mask in the region to be the light-emitting element 170G is formed thickly in Step 25 of forming a resist mask, the resist mask 261 over the light-emitting element 170G (the resist mask 261$a$) remains. Note that through this step, the protective layer 126 adjacent to the outer portion of the resist mask 261$a$ is sometimes exposed.

[Step 28]

Next, the region where the protective layer 126 is exposed in the previous step and the electrode 173 and the EL layer 172 that overlap with the region are removed, so that the electrode 171 and the electrode 181 that overlap with the region are exposed. The electrode 173 and the EL layer 172 that overlap with the region are removed under the conditions where the protective layer 126R is not removed.

At this time, the peripheral portions of the protective layer 126G, the electrode 173G, and the EL layer 172G are also removed in some cases. Thus, the end portion of the electrode 171G sometimes extends beyond the end portions of the protective layer 126G, the electrode 173G, and the EL layer 172G.

[Step 29]

Then, the resist mask 261$a$ is removed. The resist mask 261$a$ may be removed by a dry etching method or a wet etching method. For example, the resist mask 261$a$ may be removed by ashing treatment using oxygen plasma, or the resist mask 261$a$ may be removed using a stripping solution or the like.

[Step 30]

Next, the EL layer 172 is formed (see FIG. 18A). The formation of the EL layer 172 is performed in a manner similar to Step 14 or Step 22. Note that in this step, the EL layer 172 is formed using an organic EL material containing a blue-light-emitting material.

[Step 31]

Next, the electrode 173 is formed. The formation of the electrode 173 is performed in a manner similar to Step 15 or Step 23.

[Step 32]

Next, the protective layer 126 is formed. The formation of the protective layer 126 is performed in a manner similar to Step 16 or Step 24.

[Step 33]

Next, the resist mask 261 is formed using a multi-tone mask over the protective layer 126 (see FIG. 18B). The formation of the resist mask 261 is performed in a manner similar to Step 17 or Step 25. Note that in this step, the resist mask in a region to be the light-emitting element 170B in a later step (the resist mask 261$a$) is formed thickly, and the resist mask 261 in the other region (the resist mask 261$b$) is formed thinly.

[Step 34]

Next, parts of the protective layer 126, the electrode 173, the EL layer 172, and the electrode 171 are selectively removed using the resist mask 261 as a mask (see FIG. 19A). The etching of the protective layer 126, the electrode 173, the EL layer 172, and the electrode 171 is performed in a manner similar to Step 18 or Step 26.

Through this step, the light-emitting element 170B is formed. In FIG. 19A, the electrode 171, the EL layer 172, and the electrode 173 included in the light-emitting element 170B are illustrated as the electrode 171B, the EL layer 172B, and the electrode 173B. In addition, the protective layer 126 overlapping with the light-emitting element 170B is illustrated as a protective layer 126B.

Through this step, the end portions of the electrode 171G are etched, so that the end portions of the protective layer 126G, the electrode 173G, the EL layer 172G, and the electrode 171G are sometimes aligned or substantially aligned with each other.

[Step 35]

Next, the thickness of the resist mask 261$a$ is reduced by ashing treatment using oxygen plasma, for example, as in Step 19 or Step 27. At this time, the resist mask 261$b$ is removed, so that the protective layer 126 in a region covered with the resist mask 261$b$ is exposed (see FIG. 19B).

When the resist mask in the region to be the light-emitting element 170B is formed thickly in Step 33 of forming a resist mask, the resist mask 261 over the light-emitting element 170B (the resist mask 261$a$) remains. Note that through this step, the protective layer 126 adjacent to the outer portion of the resist mask 261$a$ is sometimes exposed.

[Step 36]

Next, the region where the protective layer 126 is exposed in the previous step and the electrode 173 and the EL layer 172 that overlap with the region are removed, so that the electrode 171 and the electrode 181 that overlap with the region are exposed (see FIG. 20A). The electrode 173 and the EL layer 172 that overlap with the region are removed under the conditions where the protective layer 126R and the protective layer 126G are not removed.

At this time, the peripheral portions of the protective layer 126B, the electrode 173B, and the EL layer 172B are also removed in some cases. Thus, the end portion of the electrode 171B sometimes extends beyond the end portions of the protective layer 126B, the electrode 173B, and the EL layer 172B.

[Step 37]

Then, the resist mask 261a is removed. The resist mask 261a may be removed by a dry etching method or a wet etching method. For example, the resist mask 261a may be removed by ashing treatment using oxygen plasma, or the resist mask 261a may be removed using a stripping solution or the like.

[Step 38]

Then, the insulating layer 115 is formed (see FIG. 20B). As described above, the insulating layer 115 preferably covers the side surface of the light-emitting element 170. The insulating layer 115 is preferably formed using a material through which hydrogen and moisture do not easily pass. For example, aluminum oxide is formed as the insulating layer 115 by an ALD method.

[Step 39]

Next, the insulating layer 116 is formed over the insulating layer 115 (see FIG. 21A). The insulating layer 116 preferably has a function of a planarization layer. In the case where light from the light-emitting element 170 is emitted from the insulating layer 116 side to the outside, a light-transmitting material is used for the insulating layer 116. Furthermore, the use of a photosensitive material for the insulating layer 116 allows an opening portion to be formed without using a resist mask in a later step.

In this embodiment, a photosensitive acrylic resin or photosensitive polyimide is used for the insulating layer 116.

[Step 40]

Next, an opening 163 is formed in each of a region overlapping with the light-emitting element 170 and a region overlapping with the electrode 181 (see FIG. 21B). As described above, with the use of a photosensitive material for the insulating layer 116, the openings 163 can be formed in the insulating layer 116 without using a resist mask. Specifically, opening portions are formed in the insulating layer 116, and the insulating layer 115 and the protective layer 126 in regions overlapping with the opening portions are removed using the insulating layer 116 as a mask.

Thus, the electrode 173 is exposed at the bottom portions of the openings 163 in the display region 235. In addition, the electrode 181 is exposed at the bottom portion of the opening 163 in the cathode contact region 234.

[Step 41]

Next, the conductive layer 118 is formed. In the case where the conductive layer 118 is provided to cover the light-emitting element 170 and light from the light-emitting element 170 is emitted from the conductive layer 118 side to the outside, a light-transmitting material is used for the conductive layer 118. In this embodiment, ITO is used for the conductive layer 118.

In the case where the conductive layer 118 covers only part of the light-emitting element 170, a material that does not have a light-transmitting property may be used for the conductive layer 118.

In the display region 235, the conductive layer 118 and the electrode 173 are electrically connected to each other in the openings 163. In the cathode contact region 234, the conductive layer 118 and the electrode 181 are electrically connected to each other in the opening 163. Thus, the electrode 173 is electrically connected to the electrode 181 through the conductive layer 118.

In the above manner, the element substrate 151 can be fabricated (see FIG. 22A). In the description in this embodiment, the order of fabricating the light-emitting elements functioning as display elements is as follows: the light-emitting element 170R, the light-emitting element 170G, and the light-emitting element 170B. Note that the method for fabricating the display device of one embodiment of the present invention is not limited thereto. The light-emitting elements may be fabricated, for example, in the order of the light-emitting element 170B, the light-emitting element 170G, and the light-emitting element 170R or in the order of the light-emitting element 170G, the light-emitting element 170B, and the light-emitting element 170R.

[Display Device 100]

Next, a method for fabricating the display device 100 using the element substrate 151 and the substrate 121 will be described.

The element substrate 151 is attached to the substrate 121 with the adhesive layer 142 therebetween. Note that in the case where the coloring layer 131 is formed on the substrate 121 as in the display device 100C, the attachment is performed such that a light-emitting region of the light-emitting element 170 overlaps with the coloring layer 131.

Through the above steps, the display device 100 can be fabricated (see FIG. 1B and FIG. 22B).

According to one embodiment of the present invention, the light-emitting element 170 can be formed by a photolithography method without using a metal mask. Thus, the display device of one embodiment of the present invention has an MML structure. The use of a photolithography method achieves a display device with high resolution, which is difficult to obtain in the case of using a metal mask.

Using a multi-tone mask at the time of forming a resist mask by a photolithography method can reduce the number of photomasks to be used. Accordingly, the productivity of the display device can be improved.

This embodiment can be implemented in an appropriate combination with the structures described in the other embodiments and the like.

Embodiment 2

In this embodiment, specific structure examples of the display device 100 will be described. FIG. 25A is a block diagram illustrating the display device 100. As described in Embodiment 1, the display device 100 includes the display region 235, the peripheral circuit region 232, and the peripheral circuit region 233.

A circuit included in the peripheral circuit region 232 functions as, for example, a scan line driver circuit. A circuit included in the peripheral circuit region 232 functions as, for example, a signal line driver circuit. Note that some sort of circuit may be provided at a position facing the peripheral circuit region 232 with the display region 235 therebetween. Some sort of circuit may be provided at a position facing the peripheral circuit region 233 with the display region 235 therebetween. As described above, the circuits included in the peripheral circuit region 232 and the peripheral circuit region 233 are collectively referred to as a "peripheral driver circuit" in some cases.

Any of various circuits such as a shift register, a level shifter, an inverter, a latch, an analog switch, and a logic circuit can be used as the peripheral driver circuit. In the peripheral driver circuit, a transistor, a capacitor, and the like can be used. A transistor included in the peripheral driver circuit can be formed in the same steps as the transistors included in the pixels 230.

The display device 100 includes m wirings 236 which are arranged substantially parallel to each other and whose potentials are controlled by the circuits included in the peripheral circuit region 232, and n wirings 237 which are arranged substantially parallel to each other and whose potentials are controlled by the circuits included in the peripheral circuit region 233.

The display region 235 includes the plurality of pixels 230 arranged in a matrix. Full-color display can be achieved by making the pixel 230 that controls red light, the pixel 230 that controls green light, and the pixel 230 that controls blue light collectively function as one pixel 240 and by controlling the amount of light (emission luminance) emitted from each pixel 230. Thus, the three pixels 230 each function as a subpixel. That is, three subpixels control the emission amount or the like of red light, green light, and blue light (see FIG. 25B1). The light colors controlled by the three subpixels are not limited to a combination of red (R), green (G), and blue (B) and may be cyan (C), magenta (M), and yellow (Y) (see FIG. 25B2).

Alternatively, the three pixels 230 constituting one pixel 240 may be arranged in a delta pattern (see FIG. 25B3). Specifically, arrangement may be employed in which a line connecting the center points of the three pixels 230 constituting one pixel 240 forms a triangle.

The areas of the three subpixels (pixels 230) are not necessarily equal to each other. In the case where the emission efficiency, the reliability, and the like are different depending on emission colors, the areas of the subpixels may be different depending on emission colors (see FIG. 25B4). Note that the arrangement of the subpixels illustrated in FIG. 25B4 may be called "S stripe arrangement".

Four subpixels may collectively function as one pixel. For example, a subpixel that controls white light may be added to the three subpixels that control red light, green light, and blue light (see FIG. 25B5). The addition of the subpixel that controls white light can increase the luminance of a display region. Alternatively, a subpixel that controls yellow light may be added to the three subpixels that control red light, green light, and blue light (see FIG. 25B6). Alternatively, a subpixel that controls white light may be added to the three subpixels that control cyan light, magenta light, and yellow light (see FIG. 25B7).

When the number of subpixels functioning as one pixel is increased and subpixels that control light of red, green, blue, cyan, magenta, yellow, and the like are used in an appropriate combination, the reproducibility of halftones can be increased. Thus, display quality can be increased.

The display device of one embodiment of the present invention can reproduce the color gamut of various standards. For example, the display device of one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display devices used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to as Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

Using the pixels 240 arranged in a matrix of 1920×1080, the display device 100 that can perform full-color display with a resolution of what is called full high definition (also referred to as "2K resolution", "2K1K", "2K", or the like) can be obtained. For example, using the pixels 240 arranged in a matrix of 3840×2160, the display device 100 that can perform full-color display with a resolution of what is called ultra high definition (also referred to as "4K resolution", "4K2K", "4K", or the like) can be obtained. For example, using the pixels 240 arranged in a matrix of 7680×4320, the display device 100 that can perform full-color display with a resolution of what is called super high definition (also referred to as "8K resolution", "8K4K", "8K", or the like) can be obtained. By increasing the number of pixels 240, the display device 100 that can perform full-color display with 16K or 32K resolution can also be obtained.

<Circuit Structure Example of Pixel 230>

Figures 26A, 26B, 26C, 26D:
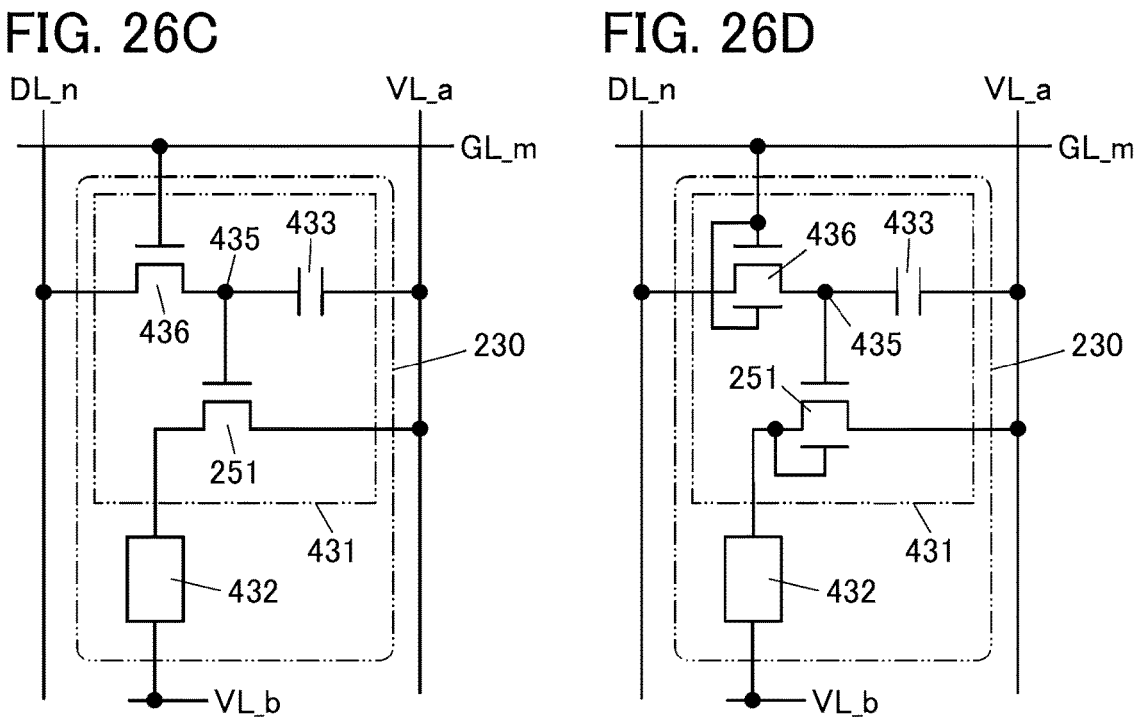

FIG. 26A is a diagram illustrating a circuit structure example of the pixel 230. The pixel 230 includes a pixel circuit 431 and a display element 432.

Each of the wirings 236 is electrically connected to n pixel circuits 431 in a given row among the pixel circuits 431 arranged in m rows and n columns in the display region 235. Each of the wirings 237 is electrically connected to m pixel circuits 431 arranged in a given column among the pixel circuits 431 arranged in m rows and n columns. Note that m and n are each an integer of 1 or more.

The pixel circuit 431 includes a transistor 436, a capacitor 433, the transistor 251, and a transistor 434. The pixel circuit 431 is electrically connected to the display element 432.

One of a source electrode and a drain electrode of the transistor 436 is electrically connected to a wiring to which a data signal (also referred to as "video signal") is supplied (hereinafter, referred to as a signal line DL_n). A gate electrode of the transistor 436 is electrically connected to a wiring to which a gate signal is supplied (hereinafter, referred to as a scan line GL_m). The signal line DL_n and the scan line GL_m correspond to the wiring 237 and the wiring 236, respectively.

The transistor 436 has a function of controlling writing of the data signal to a node 435.

One of a pair of electrodes of the capacitor 433 is electrically connected to the node 435, and the other is electrically connected to a node 437. The other of the source electrode and the drain electrode of the transistor 436 is electrically connected to the node 435.

The capacitor 433 has a function of a storage capacitor for storing data written to the node 435.

One of a source electrode and a drain electrode of the transistor 251 is electrically connected to a potential supply line VL_a, and the other is electrically connected to the node 437. Furthermore, a gate electrode of the transistor 251 is electrically connected to the node 435.

One of a source electrode and a drain electrode of the transistor 434 is electrically connected to a potential supply line VO, and the other is electrically connected to the node 437. Furthermore, a gate electrode of the transistor 434 is electrically connected to the scan line GL_m.

One of an anode and a cathode of the display element 432 is electrically connected to a potential supply line VL_b, and the other is electrically connected to the node 437.

As the display element 432, a light-emitting element such as an organic electroluminescent element (also referred to as an organic EL element) can be used, for example. Note that the display element 432 is not limited thereto; an inorganic EL element formed of an inorganic material may be used, for example. Note that an "organic EL element" and an "inorganic EL element" are collectively referred to as an "EL element" in some cases.

The emission color of the EL element can be white, red, green, blue, cyan, magenta, yellow, or the like depending on the material contained in the EL element.

Examples of a method for achieving color display include a method in which the display element 432 whose emission color is white is combined with a coloring layer and a method in which the display elements 432 with different emission colors are provided in the respective pixels. The former method is more productive than the latter method. By contrast, the latter method, which requires separate formation of the display element 432 pixel by pixel, is less productive than the former method. However, the latter method can provide higher color purity of the emission color than the former method. In the latter method, the color purity can be further increased when the display element 432 has a microcavity structure.

Either a low molecular compound or a high molecular compound can be used for the display element 432, and an inorganic compound may also be contained. The layers included in the display element 432 can each be formed by a method such as an evaporation method (including a vacuum evaporation method), a transfer method, a printing method, an inkjet method, a coating method, or the like.

The display element 432 may contain an inorganic compound such as quantum dots. For example, when used for the light-emitting layer, the quantum dots can function as a light-emitting material.

Note that as a power supply potential, a potential on the relatively high potential side or a potential on the relatively low potential side can be used, for example. A power supply potential on the high potential side is referred to as a high power supply potential (also referred to as "VDD"), and a power supply potential on the low potential side is referred to as a low power supply potential (also referred to as "VSS"). A ground potential can be used as the high power supply potential or the low power supply potential. For example, in the case where the high power supply potential is a ground potential, the low power supply potential is a potential lower than the ground potential, and in the case where the low power supply potential is a ground potential, the high power supply potential is a potential higher than the ground potential.

A high power supply potential VDD is supplied to one of the potential supply line VL_a and the potential supply line VL_b, and a low power supply potential VS S is supplied to the other, for example.

In the display device including the pixel circuit 431, the pixel circuits 431 are sequentially selected row by row by the circuit included in the peripheral driver circuit, whereby the transistors 436 and the transistors 434 are turned on and a data signal is written to the nodes 435.

When the transistors 436 and the transistors 434 are turned off, the pixel circuits 431 in which the data has been written to the nodes 435 are brought into a holding state. Furthermore, the amount of current flowing between the source electrode and the drain electrode of the transistor 251 is controlled in accordance with the potential of the data written to the node 435. The display element 432 emits light with a luminance corresponding to the amount of current flow. This operation is sequentially performed row by row; thus, an image can be displayed.

FIG. 26B illustrates a modification example of the circuit structure of the pixel 230 illustrated in FIG. 26A. In a circuit structure illustrated in FIG. 26B, a gate electrode of the transistor 436 is electrically connected to a line to which a first scan signal is supplied (hereinafter, referred to as a scan line GL1_m). A gate electrode of the transistor 434 is electrically connected to a line to which a second scan signal is supplied (hereinafter, referred to as a scan line GL2_m).

The circuit structure illustrated in FIG. 26B includes a transistor 438 in addition to the components in the circuit structure illustrated in FIG. 26A. One of a source electrode and a drain electrode of the transistor 438 is electrically connected to a potential supply line VO, and the other is electrically connected to the node 435. A gate electrode of the transistor 438 is electrically connected to a line to which a third scan signal is supplied (hereinafter, referred to as a scan line GL3_m).

The scan line GL1_m corresponds to the wiring 236 illustrated in FIG. 25A. Although wirings corresponding to the scan line GL2_m and the scan line GL3_m are not illustrated in FIG. 25A, the scan line GL2_m and the scan line GL3_m are electrically connected to the peripheral circuit region 232.

In the case where the pixel 230 performs black display, for example, both the transistor 434 and the transistor 438 are turned on. This makes the potentials of the source electrode and the gate electrode of the transistor 251 equal to each other. Thus, the gate voltage of the transistor 251 becomes 0 V, so that current flowing through the display element 432 can be interrupted.

Some or all of the transistors included in the pixel circuit 431 may be transistors having back gates. Transistors having back gates are used as the transistors in the circuit structure illustrated in FIG. 26B. An example is illustrated in which the gate and the back gate of each of the transistor 434, the transistor 436, and the transistor 438 are electrically connected to each other. In the example illustrated in FIG. 26B, the back gate of the transistor 251 is electrically connected to the node 437.

FIG. 26C illustrates a modification example of the circuit structure of the pixel 230 illustrated in FIG. 26A. The circuit structure illustrated in FIG. 26C is the circuit structure illustrated in FIG. 26A from which the transistor 434 and the potential supply line VO are removed. The rest of the structure can be understood by referring to the description of the circuit structure illustrated in FIG. 26A. Thus, in order to reduce repeated description, the detailed description of the circuit structure illustrated in FIG. 26C is omitted.

As described above, some or all of the transistors included in the pixel circuit 431 may each be a transistor having a back gate. For example, as illustrated in FIG. 26D, a transistor having a back gate may be used as the transistor 436 and its back gate and gate may be electrically connected to each other. As in the transistor 251 illustrated in FIG. 26D, the back gate and one of the source and the drain of the transistor may be electrically connected to each other.

This embodiment can be implemented in an appropriate combination with the structures described in the other embodiments and the like.

Embodiment 3

In this embodiment, a light-emitting element (also referred to as a light-emitting device) that can be used in the display device of one embodiment of the present invention will be described.

<Structure Example of Light-Emitting Element>

Figure 27A:
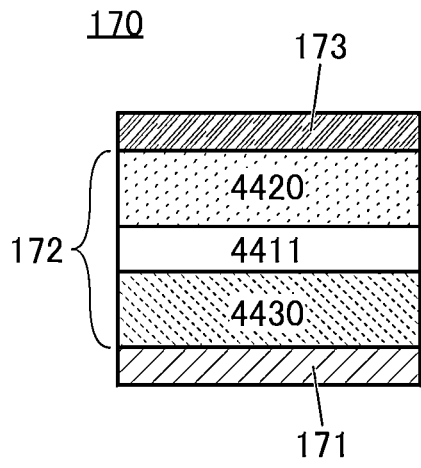

As illustrated in FIG. 27A, the light-emitting element 170 includes the EL layer 172 between a pair of electrodes (the electrode 171 and the electrode 173). The EL layer 172 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 27A is referred to as a single structure in this specification and the like.

Figure 27B:
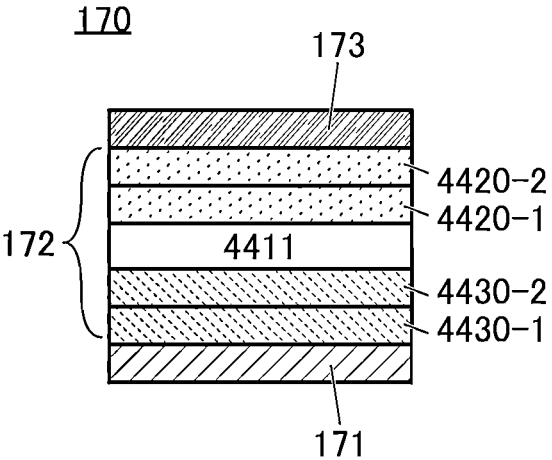

FIG. 27B is a modification example of the EL layer 172 included in the light-emitting element 170 illustrated in FIG. 27A. Specifically, the light-emitting element 170 illustrated in FIG. 27B includes a layer 4430-1 over the electrode 171, a layer 4430-2 over the layer 4430-1, the light-emitting layer 4411 over the layer 4430-2, a layer 4420-1 over the light-emitting layer 4411, a layer 4420-2 over the layer 4420-1, and the electrode 173 over the layer 4420-2. In the case where the electrode 171 is an anode and the electrode 173 is a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the electrode 171 is a cathode and the electrode 173 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 27C:
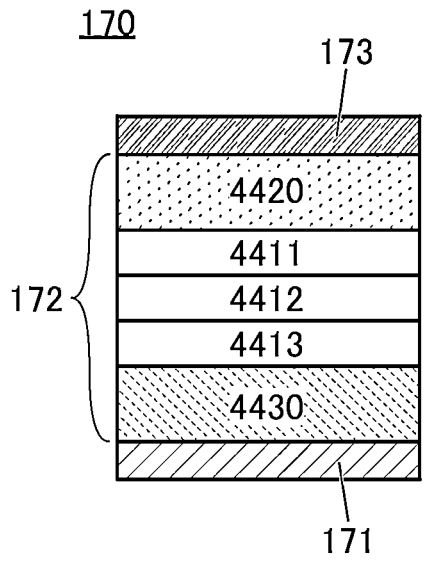

Note that a structure in which a plurality of light-emitting layers (light-emitting layers 4411, 4412, and 4413) are provided between the layer 4420 and the layer 4430 as illustrated in FIG. 27C is another example of the single structure.

Figure 27D:
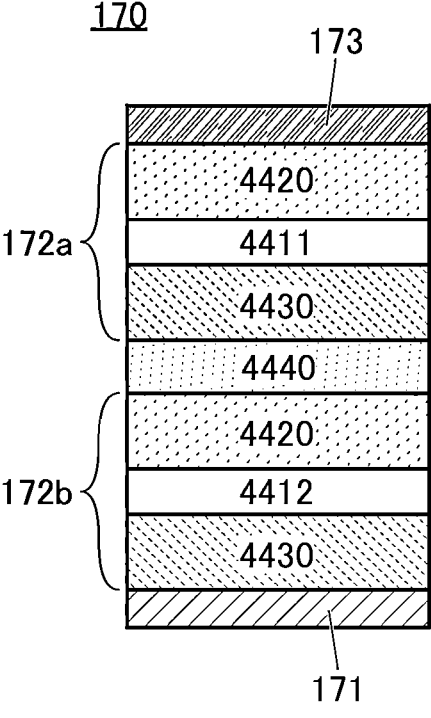

A structure in which a plurality of light-emitting units (an EL layer 172a and an EL layer 172b) are connected in series with an intermediate layer (charge-generation layer) 4440 therebetween as illustrated in FIG. 27D is referred to as a tandem structure or a stack structure in this specification and the like. Note that the tandem structure enables a light-emitting element to emit light with high luminance.

In the case where the light-emitting element 170 has the tandem structure illustrated in FIG. 27D, the EL layer 172a and the EL layer 172b may emit light of the same color. For example, the EL layer 172a and the EL layer 172b may both emit green light. Note that in the case where the display region 235 includes three subpixels of R, G, and B and each of the subpixels includes a light-emitting element, the tandem structure may be employed for the light-emitting element of each of the subpixels. Specifically, the EL layer 172a and the EL layer 172b in the subpixel of R each contain a material capable of emitting red light, the EL layer 172a and the EL layer 172b in the subpixel of G each contain a material capable of emitting green light, and the EL layer 172a and the EL layer 172b in the subpixel of B each contain a material capable of emitting blue light. In other words, the light-emitting layer 4411 and the light-emitting layer 4412 may contain the same material. When the EL layer 172a and the EL layer 172b emit light of the same color, the current density per unit emission luminance can be reduced. Thus, the reliability of the light-emitting element 170 can be increased.

The emission color of the light-emitting element can be red, green, blue, cyan, magenta, yellow, white, or the like depending on the material that constitutes the EL layer 172. Furthermore, the color purity can be further increased when the light-emitting element has a microcavity structure.

The light-emitting layer may contain two or more of light-emitting substances that emit light of R (red), G (green), B (blue), Y (yellow), O (orange), and the like. The light-emitting element that emits white light preferably contains two or more kinds of light-emitting substances in the light-emitting layer. To obtain white light emission, two or more of light-emitting substances are selected such that their emission colors are complementary. For example, when the emission color of a first light-emitting layer and the emission color of a second light-emitting layer have a relationship of complementary colors, it is possible to obtain the light-emitting element that emits white light as a whole. The same applies to a light-emitting element including three or more light-emitting layers.

The light-emitting layer preferably contains two or more of light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

Examples of a light-emitting substance include a substance that emits fluorescent light (a fluorescent material), a substance that emits phosphorescent light (a phosphorescent material), an inorganic compound (a quantum dot material and the like), and a substance that exhibits thermally activated delayed fluorescence (a thermally activated delayed fluorescence (TADF) material). Note that as a TADF material, a material in which a singlet excited state and a triplet excited state are in a thermal equilibrium state may be used. Since such a TADF material enables a short emission lifetime (excitation lifetime), an efficiency decrease of a light-emitting element in a high-luminance region can be inhibited.

This embodiment can be implemented in an appropriate combination with the structures described in the other embodiments and the like.

Embodiment 4

In this embodiment, an example of a structure of a transistor that can be used in the display device of one embodiment of the present invention will be described.

Structure Example 1 of Transistor

A transistor 70A will be described as an example of a structure of a transistor with reference to FIG. 28A, FIG. 28B, and FIG. 28C. FIG. 28A is a top view of the transistor 70A. FIG. 28B is a cross-sectional view of a portion indicated by the dashed-dotted line X1-X2 in FIG. 28A, and FIG. 28C is a cross-sectional view of a portion indicated by the dashed-dotted line Y1-Y2 in FIG. 28A. Note that in FIG. 28A, some components of the transistor 70A (e.g., an insulating layer functioning as a gate insulating layer) are not illustrated for easy understanding of the drawing. Note that the extending direction of the dashed-dotted line X1-X2 may be referred to as a channel length direction, and the extending direction of the dashed-dotted line Y1-Y2 may be referred to as a channel width direction.

The transistor 70A includes a conductive layer 521 over an insulating layer 524; an insulating layer 511 over the insulating layer 524 and the conductive layer 521; a semiconductor layer 531 over the insulating layer 511; a conductive layer 522a over the semiconductor layer 531 and the insulating layer 511; a conductive layer 522b over the semiconductor layer 531 and the insulating layer 511; an insulating layer 512 over the semiconductor layer 531, the conductive layer 522a, and the conductive layer 522b; and a conductive layer 523 over the insulating layer 512. Note that the insulating layer 524 may be a substrate.

For the semiconductor layer 531, a semiconductor material described in the above embodiment can be used, for example. For the semiconductor layer 531, an oxide semiconductor, which is one type of metal oxide, may be used, for example.

The insulating layer 511 and the insulating layer 512 have an opening portion 535. The conductive layer 523 is electrically connected to the conductive layer 521 through the opening portion 535.

Here, the insulating layer 511 functions as a first gate insulating layer of the transistor 70A, and the insulating layer 512 functions as a second gate insulating layer of the transistor 70A. In the transistor 70A, the conductive layer 521 functions as a first gate, the conductive layer 522a functions as one of a source and a drain, and the conductive layer 522b functions as the other of the source and the drain. In the transistor 70A, the conductive layer 523 functions as a second gate.

Note that the transistor 70A is what is called a channel-etched transistor, and has a dual-gate structure.

The transistor 70A can also have a structure in which the conductive layer 523 is not provided. In that case, the transistor 70A is what is called a channel-etched transistor, and has a bottom-gate structure.

As illustrated in FIG. 28B and FIG. 28C, the semiconductor layer 531 is positioned to face the conductive layer 521 and the conductive layer 523, and is sandwiched between two conductive layers functioning as the gates. The length of the conductive layer 523 in the channel length direction and the length of the conductive layer 523 in the channel width direction are longer than the length of the semiconductor layer 531 in the channel length direction and the length of the semiconductor layer 531 in the channel width direction, respectively, and the whole semiconductor layer 531 is covered with the conductive layer 523 with the insulating layer 512 therebetween.

In other words, the conductive layer 521 and the conductive layer 523 are connected to each other in the opening portion 535 provided in the insulating layer 511 and the insulating layer 512, and each have a region located outside a side end portion of the semiconductor layer 531.

With this structure, an S-channel structure in which semiconductor layer 531 included in the transistor 70A is electrically surrounded by electric fields of the conductive layer 521 and the conductive layer 523 can be obtained.

Since the transistor 70A has the s-channel structure, an electric field for inducing a channel can be effectively applied to the semiconductor layer 531 by the conductive layer 521 functioning as the first gate. Thus, the current drive capability of the transistor 70A can be improved and high on-state current characteristics can be obtained. The transistor 70A can be scaled down because the on-state current can be increased.

Furthermore, since the transistor 70A has a structure in which the semiconductor layer 531 is surrounded by the conductive layer 521 functioning as the first gate and the conductive layer 523 functioning as the second gate, the mechanical strength of the transistor 70A can be increased.

<Structure Example 2 of Transistor>

A transistor 70B will be described as an example of a structure of a transistor with reference to FIG. 29A, FIG. 29B, and FIG. 29C. FIG. 29A is a top view of the transistor 70B. FIG. 29B is a cross-sectional view of a portion indicated by the dashed-dotted line X1-X2 in FIG. 29A, and FIG. 29C is a cross-sectional view of a portion indicated by the dashed-dotted line Y1-Y2 in FIG. 29A.

The transistor 70B illustrated in FIG. 29A, FIG. 29B, and FIG. 29C includes the conductive layer 521 over the insulating layer 524, the insulating layer 511 over the conductive layer 521 and the insulating layer 524, the semiconductor layer 531 over the insulating layer 511, the insulating layer 512 over the semiconductor layer 531, the conductive layer 523 over the insulating layer 512, and an insulating layer 515 over the insulating layer 511, the semiconductor layer 531, and the conductive layer 523. Note that the semiconductor layer 531 includes a channel formation region 531i overlapping with the conductive layer 523, a source region 531s in contact with the insulating layer 515, and a drain region 531d in contact with the insulating layer 515. For the semiconductor layer 531, an oxide semiconductor, which is one type of metal oxide, can be used, for example. Note that the semiconductor layer 531 may have a stacked-layer structure of two or more layers.

The insulating layer 515 contains nitrogen or hydrogen. The insulating layer 515 is in contact with the source region 531s and the drain region 531d, so that nitrogen or hydrogen in the insulating layer 515 is added to the source region 531s and the drain region 531d. The source region 531s and the drain region 531d each have a high carrier concentration when nitrogen or hydrogen is added thereto.

The transistor 70B may include the conductive layer 522a electrically connected to the source region 531s through an opening portion 536a provided in the insulating layer 515. The transistor 70B may further include the conductive layer 522b electrically connected to the drain region 531d through an opening portion 536b provided in the insulating layer 515.

The insulating layer 511 functions as the first gate insulating layer, and the insulating layer 512 functions as the second gate insulating layer. The insulating layer 515 functions as a protective insulating layer.

The insulating layer 512 includes an excess oxygen region. When the insulating layer 512 includes an excess oxygen region, excess oxygen can be supplied to the channel formation region 531i included in the semiconductor layer 531. As a result, excess oxygen can compensate for oxygen vacancies that might be formed in the channel formation region 531i, which can provide a highly reliable display device.

Note that to supply excess oxygen to the semiconductor layer 531, excess oxygen may be supplied to the insulating layer 511 formed below the semiconductor layer 531. In that case, excess oxygen contained in the insulating layer 511 might also be supplied to the source region 531s and the drain region 531d included in the semiconductor layer 531. When excess oxygen is supplied to the source region 531s and the drain region 531d, the resistance of the source region 531s and the drain region 531d might be increased.

By contrast, in the structure in which the insulating layer 512 formed over the semiconductor layer 531 contains excess oxygen, excess oxygen can be selectively supplied only to the channel formation region 531*i*. Alternatively, the carrier concentrations of the source region 531*s* and the drain region 531*d* are selectively increased after excess oxygen is supplied to the channel formation region 531*i*, the source region 531*s*, and the drain region 531*d*, in which case an increase in the resistance of the source region 531*s* and the drain region 531*d* can be suppressed.

Furthermore, each of the source region 531*s* and the drain region 531*d* included in the semiconductor layer 531 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and the Group 18 element. Typical examples of the Group 18 element include helium, neon, argon, krypton, and xenon. In the case where one or more of the elements that form oxygen vacancies are contained in the insulating layer 515, the one or more of the elements are diffused from the insulating layer 515 to the source region 531*s* and the drain region 531*d*, and/or added to the source region 531*s* and the drain region 531*d* by impurity addition treatment.

When an impurity element is added to the metal oxide, a bond between a metal element and oxygen in the metal oxide is cut, so that an oxygen vacancy is formed. Alternatively, when an impurity element is added to the metal oxide, oxygen bonded to a metal element in the metal oxide is bonded to the impurity element and the oxygen is released from the metal element, so that an oxygen vacancy is formed. As a result, the carrier concentration of the metal oxide is increased and thus the conductivity thereof becomes higher.

The conductive layer 521 functions as the first gate, the conductive layer 523 functions as the second gate, the conductive layer 522*a* functions as the source, and the conductive layer 522*b* functions as the drain.

As illustrated in FIG. 29C, an opening portion 537 is provided in the insulating layer 511 and the insulating layer 512. The conductive layer 521 is electrically connected to the conductive layer 523 through the opening portion 537. Thus, the conductive layer 521 and the conductive layer 523 are supplied with the same potential. Note that different potentials may be supplied to the conductive layer 521 and the conductive layer 523 without providing the opening portion 537. Alternatively, the conductive layer 521 may be used as a light-blocking film without providing the opening portion 537. For example, light emitted to the channel formation region 531*i* from the bottom can be inhibited when the conductive layer 521 is formed using a light-blocking material.

As illustrated in FIG. 29B and FIG. 29C, the semiconductor layer 531 is positioned to face the conductive layer 521 functioning as the first gate and the conductive layer 523 functioning as the second gate, and is sandwiched between the two conductive layers functioning as the gates.

Like a transistor 70C, the transistor 70B has an S-channel structure. With this structure, the semiconductor layer 531 included in the transistor 70B can be electrically surrounded by electric fields of the conductive layer 521 functioning as the first gate and the conductive layer 523 functioning as the second gate.

Since the transistor 70B has the S-channel structure, an electric field for inducing a channel can be effectively applied to the semiconductor layer 531 by the conductive layer 521 or the conductive layer 523. Thus, the current drive capability of the transistor 70B can be improved and high on-state current characteristics can be obtained. The transistor 70B can be scaled down because the on-state current can be increased. Furthermore, since the transistor 70B has a structure in which the semiconductor layer 531 is surrounded by the conductive layer 521 and the conductive layer 523, the mechanical strength of the transistor 70B can be increased.

The transistor 70B may be called a TGSA (Top Gate Self Align) FET from the position of the conductive layer 523 relative to the semiconductor layer 531 or the formation method of the conductive layer 523.

Although the insulating layer 512 is provided only in a portion overlapping with the conductive layer 523 in the transistor 70B, the structure is not limited thereto, and a structure in which the insulating layer 512 covers the semiconductor layer 531 can be employed. Alternatively, a structure in which the conductive layer 521 is not provided can be employed.

An aluminum oxide layer may be provided between the insulating layer 512 and the conductive layer 523. When an aluminum oxide layer is provided, excess oxygen contained in the insulating layer 512 can be unlikely to be diffused to the conductive layer 523 side.

In the conductive layer 523, at least a region in contact with the insulating layer 512 is preferably formed using a material through which oxygen does not easily diffuse. Examples of such a material include aluminum and molybdenum. For example, the conductive layer 523 may have a stacked-layer structure of two layers in which aluminum is provided on the insulating layer 512 side and titanium is provided thereover. Alternatively, the conductive layer 523 may have a stacked-layer structure of three layers in which molybdenum is provided on the insulating layer 512 side and aluminum and titanium are provided thereover.

<Structure Example 3 of Transistor>

A transistor 70C will be described as an example of a structure of a transistor with reference to FIG. 30A to FIG. 30C.

FIG. 30A is a top view of the transistor 70C. FIG. 30B is a cross-sectional view of a portion indicated by the dashed-dotted line X1-X2 in FIG. 30A and is a cross-sectional view of the transistor 70C in the channel length direction. FIG. 30C is a cross-sectional view of a portion indicated by the dashed-dotted line Y1-Y2 in FIG. 30A and is a cross-sectional view of the transistor 70C in the channel width direction. Note that some components are omitted in the top view of FIG. 30A for clarity of the drawing.

As illustrated in FIG. 30, the transistor 70C includes a metal oxide 330*a* placed over a substrate (not illustrated); a metal oxide 330*b* placed over the metal oxide 330*a*; a conductor 242*a* and a conductor 242*b* that are placed apart from each other over the metal oxide 330*b*; an insulator 280 that is placed over the conductor 242*a* and the conductor 242*b* and has an opening between the conductor 242*a* and the conductor 242*b*; a conductor 260 placed in the opening; an insulator 250 placed between the conductor 260 and each of the metal oxide 330*b*, the conductor 242*a*, the conductor 242*b*, and the insulator 280; and a metal oxide 330*c* placed between the insulator 250 and each of the metal oxide 330*b*, the conductor 242*a*, the conductor 242*b*, and the insulator 280. Here, as illustrated in FIG. 30B and FIG. 30C, preferably, the top surface of the conductor 260 is substantially aligned with the top surfaces of the insulator 250, an insulator 254, the metal oxide 330*c*, and the insulator 280. Hereinafter, the metal oxide 330*a*, the metal oxide 330*b*, and the metal oxide 330*c* may be collectively referred to as a metal oxide 330. The conductor 242*a* and the conductor 242*b* may be collectively referred to as a conductor 242.

In the transistor 70C illustrated in FIG. 30, the side surfaces of the conductor 242*a* and the conductor 242*b* on the conductor 260 side are substantially perpendicular. Note that the transistor 70C illustrated in FIG. 30 is not limited thereto, and the angle formed between the side surfaces and the bottom surfaces of the conductor 242*a* and the conductor 242*b* may be greater than or equal to 10° and less than or equal to 80°, preferably greater than or equal to 30° and less than or equal to 60°. The side surfaces of the conductor 242*a* and the conductor 242*b* that face each other may have a plurality of surfaces.

As illustrated in FIG. 30, the insulator 254 is preferably placed between the insulator 280 and each of an insulator 224, the metal oxide 330*a*, the metal oxide 330*b*, the conductor 242*a*, the conductor 242*b*, and the metal oxide 330*c*. Here, as illustrated in FIG. 30B and FIG. 30C, the insulator 254 is preferably in contact with the side surface of the metal oxide 330*c*, the top surface and the side surface of the conductor 242*a*, the top surface and the side surface of the conductor 242*b*, the side surfaces of the metal oxide 330*a* and the metal oxide 330*b*, and the top surface of the insulator 224.

In the transistor 70C, three layers of the metal oxide 330*a*, the metal oxide 330*b*, and the metal oxide 330*c* are stacked in and around the region where the channel is formed (hereinafter, also referred to as a channel formation region); however, the present invention is not limited thereto. For example, a two-layer structure of the metal oxide 330*b* and the metal oxide 330*c* or a stacked-layer structure of four or more layers may be employed. Although the conductor 260 is illustrated to have a stacked-layer structure of two layers in the transistor 70C, the present invention is not limited thereto. For example, the conductor 260 may have a single-layer structure or a stacked-layer structure of three or more layers. Furthermore, each of the metal oxide 330*a*, the metal oxide 330*b*, and the metal oxide 330*c* may have a stacked-layer structure of two or more layers.

For example, in the case where the metal oxide 330*c* has a stacked-layer structure including a first metal oxide and a second metal oxide over the first metal oxide, it is preferable that the first metal oxide have a composition similar to that of the metal oxide 330*b* and the second metal oxide have a composition similar to that of the metal oxide 330*a*.

Here, the conductor 260 functions as a gate electrode of the transistor, and the conductor 242*a* and the conductor 242*b* function as a source electrode and a drain electrode. As described above, the conductor 260 is formed to be embedded in the opening of the insulator 280 and the region positioned between the conductor 242*a* and the conductor 242*b*. Here, the positions of the conductor 260, the conductor 242*a*, and the conductor 242*b* are selected in a self-aligned manner with respect to the opening of the insulator 280. In other words, in the transistor 70C, the gate electrode can be placed between the source electrode and the drain electrode in a self-aligned manner. Thus, the conductor 260 can be formed without an alignment margin, resulting in a reduction in the area occupied by the transistor 70C. Accordingly, the display device can have higher resolution. In addition, the display device can have a narrow bezel.

As illustrated in FIG. 30, the conductor 260 preferably includes a conductor 260*a* provided on the inner side of the insulator 250 and a conductor 260*b* provided to be embedded on the inner side of the conductor 260*a*.

The transistor 70C preferably includes an insulator 214 placed over the substrate (not illustrated); an insulator 216 placed over the insulator 214; a conductor 205 placed to be embedded in the insulator 216; an insulator 222 placed over the insulator 216 and the conductor 205; and the insulator 224 placed over the insulator 222. The metal oxide 330*a* is preferably placed over the insulator 224.

An insulator 274 and an insulator 281 functioning as interlayer films are preferably placed over the transistor 70C. Here, the insulator 274 is preferably placed in contact with the top surfaces of the conductor 260, the insulator 250, the insulator 254, the metal oxide 330*c*, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of oxygen atoms and oxygen molecules). For example, the insulator 222 and the insulator 254 preferably have a lower oxygen permeability than the insulator 224, the insulator 250, and the insulator 280.

Here, the insulator 224, the metal oxide 330, and the insulator 250 are separated from the insulator 280 and the insulator 281 by the insulator 254 and the insulator 274. This can inhibit entry of impurities such as hydrogen contained in the insulator 280 and the insulator 281 into the insulator 224, the metal oxide 330, and the insulator 250 or excess oxygen into the insulator 224, the metal oxide 330*a*, the metal oxide 330*b*, and the insulator 250.

A conductor 340 (a conductor 340*a* and a conductor 340*b*) that is electrically connected to the transistor 70C and functions as a plug is preferably provided. Note that an insulator 241 (an insulator 241*a* and an insulator 241*b*) is provided in contact with the side surface of the conductor 340 functioning as a plug. In other words, the insulator 241 is provided in contact with the inner wall of an opening in the insulator 254, the insulator 280, the insulator 274, and the insulator 281. In addition, a structure may be employed in which a first conductor of the conductor 340 is provided in contact with the side surface of the insulator 241 and a second conductor of the conductor 340 is provided on the inner side of the first conductor. Here, the top surface of the conductor 340 and the top surface of the insulator 281 can be substantially level with each other. Although the transistor 70C has a structure in which the first conductor of the conductor 340 and the second conductor of the conductor 340 are stacked, the present invention is not limited thereto. For example, the conductor 340 may have a single-layer structure or a stacked-layer structure of three or more layers. In the case where a component has a stacked-layer structure, layers may be distinguished by ordinal numbers corresponding to the formation order.

In the transistor 70C, a metal oxide functioning as an oxide semiconductor (hereinafter, also referred to as an oxide semiconductor) is preferably used as the metal oxide 330 including the channel formation region (the metal oxide 330*a*, the metal oxide 330*b*, and the metal oxide 330*c*). For example, it is preferable to use a metal oxide having a band gap of 2 eV or more, preferably 2.5 eV or more as the metal oxide to be the channel formation region of the metal oxide 330.

The metal oxide preferably contains at least indium (In) or zinc (Zn). In particular, the metal oxide preferably contains indium (In) and zinc (Zn). In addition to them, the element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 30B, the metal oxide 330b in a region that does not overlap with the conductor 242 sometimes has a smaller thickness than the metal oxide 330b in a region that overlaps with the conductor 242. The thin region is formed when part of the top surface of the metal oxide 330b is removed at the time of forming the conductor 242a and the conductor 242b. When a conductive film to be the conductor 242 is deposited, a low-resistance region is sometimes formed on the top surface of the metal oxide 330b in the vicinity of the interface with the conductive film. Removing the low-resistance region positioned between the conductor 242a and the conductor 242b on the top surface of the metal oxide 330b in the above manner can prevent formation of the channel in the region.

According to one embodiment of the present invention, a display device that includes small-size transistors and has high resolution can be provided. A display device that includes a transistor with a high on-state current and has high luminance can be provided. A display device that includes a transistor operating at high speed and thus operates at high speed can be provided. A display device that includes a transistor having stable electrical characteristics and is highly reliable can be provided. A display device that includes a transistor with a low off-state current and has low power consumption can be provided.

The structure of the transistor 70C that can be used in the display device of one embodiment of the present invention is described in detail.

The conductor 205 is placed to include a region that overlaps with the metal oxide 330 and the conductor 260. Furthermore, the conductor 205 is preferably provided to be embedded in the insulator 216.

The conductor 205 includes a conductor 205a, a conductor 205b, and a conductor 205c. The conductor 205a is provided in contact with the bottom surface and a side wall of the opening provided in the insulator 216. The conductor 205b is provided to be embedded in a recessed portion formed in the conductor 205a. Here, the top surface of the conductor 205b is lower in level than the top surface of the conductor 205a and the top surface of the insulator 216. The conductor 205c is provided in contact with the top surface of the conductor 205b and the side surface of the conductor 205a. Here, the top surface of the conductor 205c is substantially level with the top surface of the conductor 205a and the top surface of the insulator 216. That is, the conductor 205b is surrounded by the conductor 205a and the conductor 205c.

For the conductor 205a and the conductor 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom and an oxygen molecule).

When the conductor 205a and the conductor 205c are formed using a conductive material having a function of inhibiting diffusion of hydrogen, impurities such as hydrogen contained in the conductor 205b can be inhibited from diffusing into the metal oxide 330 through the insulator 224 and the like. When the conductor 205a and the conductor 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a is a single layer or a stacked layer using the above conductive materials. For example, titanium nitride is used for the conductor 205a.

For the conductor 205b, a conductive material containing tungsten, copper, or aluminum as its main component is preferably used. For example, tungsten is used for the conductor 205b.

Here, the conductor 260 sometimes functions as a first gate (also referred to as top gate) electrode. The conductor 205 sometimes functions as a second gate (also referred to as bottom gate) electrode. In that case, by changing a potential applied to the conductor 205 not in synchronization with but independently of a potential applied to the conductor 260, $V_{th}$ of the transistor 70C can be controlled. In particular, by applying a negative potential to the conductor 205, $V_{th}$ of the transistor 70C can be higher than 0 V and the off-state current can be made low. Thus, drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 330. In particular, it is preferable that the conductor 205 extend beyond an end portion of the metal oxide 330 that intersects with the channel width direction, as illustrated in FIG. 30C. In other words, the conductor 205 and the conductor 260 preferably overlap with each other with the insulator placed therebetween, in a region outside the side surface of the metal oxide 330 in the channel width direction.

With the above structure, the channel formation region of the metal oxide 330 can be electrically surrounded by an electric field of the conductor 260 functioning as the first gate electrode and an electric field of the conductor 205 functioning as the second gate electrode.

As illustrated in FIG. 30C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits entry of impurities such as water or hydrogen to the transistor 70C from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities do not easily pass). Alternatively, it is preferable to use an insulating material having a function of inhibiting diffusion of oxygen (e.g., at least one of an oxygen atom and an oxygen molecule) (an insulating material through which the oxygen does not easily pass).

For example, aluminum oxide or silicon nitride is preferably used for the insulator 214. Accordingly, it is possible to inhibit diffusion of impurities such as water or hydrogen to the transistor 70C side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 have a function of a gate insulator.

Here, the insulator 224 in contact with the metal oxide 330 preferably releases oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the metal oxide 330, oxygen vacancies in the metal oxide 330 can be reduced, leading to improved reliability of the transistor 70C.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 30C, the insulator 224 is sometimes thinner in a region that overlaps with neither the insulator 254 nor the metal oxide 330b than in the other regions. In the insulator 224, the region that overlaps with neither the insulator 254 nor the metal oxide 330b preferably has a thickness with which the above oxygen can adequately diffuse.

Like the insulator 214 and the like, the insulator 222 preferably functions as a barrier insulating film that inhibits entry of impurities such as water or hydrogen into the transistor 70C from the substrate side. The insulator 222 preferably has a lower hydrogen permeability than the insulator 224, for example. When the insulator 224, the metal oxide 330, the insulator 250, and the like are surrounded by the insulator 222, the insulator 254, and the insulator 274, entry of impurities such as water or hydrogen into the transistor 70C from the outside can be inhibited.

Furthermore, it is preferable that the insulator 222 have a function of inhibiting diffusion of oxygen (e.g., at least one of an oxygen atom and an oxygen molecule) (it is preferable that the oxygen do not easily pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 330 is less likely to diffuse to the substrate side. Moreover, the conductor 205 can be inhibited from reacting with oxygen contained in the insulator 224 or oxygen contained in the metal oxide 330.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 330 and entry of impurities such as hydrogen into the metal oxide 330 from the periphery of the transistor 70C.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing what is called a high-k material, such as aluminum oxide, hafnium oxide, tantalum oxide, zirconium oxide, lead zirconate titanate (PZT), strontium titanate ($SrTiO_3$), or ($Ba,Sr$)$TiO_3$ (BST). With scaling down and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 330 includes the metal oxide 330a, the metal oxide 330b over the metal oxide 330a, and the metal oxide 330c over the metal oxide 330b. Including the metal oxide 330a under the metal oxide 330b makes it possible to inhibit diffusion of impurities into the metal oxide 330b from components formed below the metal oxide 330a. Moreover, including the metal oxide 330c over the metal oxide 330b makes it possible to inhibit diffusion of impurities into the metal oxide 330b from components formed above the metal oxide 330c.

Note that the metal oxide 330 preferably has a stacked-layer structure of a plurality of oxide layers that differ in the atomic ratio of metal atoms. For example, in the case where the metal oxide 330 contains at least indium (In) and the element M, the proportion of the number of atoms of the element M contained in the metal oxide 330a to the number of atoms of all elements that constitute the metal oxide 330a is preferably higher than the proportion of the number of atoms of the element M contained in the metal oxide 330b to the number of atoms of all elements that constitute the metal oxide 330b. In addition, the atomic ratio of the element M to In in the metal oxide 330a is preferably greater than the atomic ratio of the element M to In in the metal oxide 330b. Here, a metal oxide that can be used as the metal oxide 330a or the metal oxide 330b can be used as the metal oxide 330c.

The energy of the conduction band minimum of each of the metal oxide 330a and the metal oxide 330c is preferably higher than the energy of the conduction band minimum of the metal oxide 330*b*. In other words, the electron affinity of each of the metal oxide 330*a* and the metal oxide 330*c* is preferably smaller than the electron affinity of the metal oxide 330*b*. In this case, a metal oxide that can be used as the metal oxide 330*a* is preferably used as the metal oxide 330*c*. Specifically, the proportion of the number of atoms of the element M contained in the metal oxide 330*c* to the number of atoms of all elements that constitute the metal oxide 330*c* is preferably higher than the proportion of the number of atoms of the element M contained in the metal oxide 330*b* to the number of atoms of all elements that constitute the metal oxide 330*b*. In addition, the atomic ratio of the element M to In in the metal oxide 330*c* is preferably greater than the atomic ratio of the element M to In in the metal oxide 330*b*.

Here, the energy level of the conduction band minimum gently changes at junction portions between the metal oxide 330*a*, the metal oxide 330*b*, and the metal oxide 330*c*. In other words, the energy levels of the conduction band minimum at junction portions between the metal oxide 330*a*, the metal oxide 330*b*, and the metal oxide 330*c* continuously vary or are continuously connected. This can be achieved by decreasing the density of defect states in a mixed layer formed at the interface between the metal oxide 330*a* and the metal oxide 330*b* and the interface between the metal oxide 330*b* and the metal oxide 330*c*.

Specifically, when the metal oxide 330*a* and the metal oxide 330*b* or the metal oxide 330*b* and the metal oxide 330*c* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 330*a* and the metal oxide 330*c*, in the case where the metal oxide 330*b* is an In—Ga—Zn oxide. The metal oxide 330*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 330*c* may have a stacked-layer structure of an In—Ga—Zn oxide and an oxide that does not contain In.

Specifically, as the metal oxide 330*a*, a metal oxide with In:Ga:Zn=1:3:4 [atomic ratio] or 1:1:0.5 [atomic ratio] can be used. As the metal oxide 330*b*, a metal oxide with In:Ga:Zn=4:2:3 [atomic ratio] or 3:1:2 [atomic ratio] can be used. As the metal oxide 330*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 330*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 330*b* serves as a main carrier path. When the metal oxide 330*a* and the metal oxide 330*c* have the above structure, the density of defect states at the interface between metal oxide 330*a* and the metal oxide 330*b* and the interface between the metal oxide 330*b* and the metal oxide 330*c* can be made low. This reduces the influence of interface scattering on carrier conduction, and the transistor 70C can have a high on-state current and high frequency characteristics. Note that in the case where the metal oxide 330*c* has a stacked-layer structure, not only the effect of reducing the density of defect states at the interface between the metal oxide 330*b* and the metal oxide 330*c*, but also the effect of inhibiting diffusion of the constituent element contained in the metal oxide 330*c* to the insulator 250 side can be expected. Specifically, the metal oxide 330*c* has a stacked-layer structure in which the upper layer is an oxide that does not contain In, whereby diffusion of In to the insulator 250 side can be inhibited. Since the insulator 250 functions as a gate insulator, the transistor has defects in characteristics when In diffuses. Thus, the metal oxide 330*c* having a stacked-layer structure allows a highly reliable display device to be provided.

The conductor 242 (the conductor 242*a* and the conductor 242*b*) functioning as the source electrode and the drain electrode is provided over the metal oxide 330*b*. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 242 is provided in contact with the metal oxide 330, the oxygen concentration of the metal oxide 330 in the vicinity of the conductor 242 sometimes decreases. In addition, a metal compound layer that contains the metal contained in the conductor 242 and the component of the metal oxide 330 is sometimes formed in the metal oxide 330 in the vicinity of the conductor 242. In such cases, the carrier concentration of the region in the metal oxide 330 in the vicinity of the conductor 242 increases, and the region becomes a low-resistance region.

Here, the region between the conductor 242*a* and the conductor 242*b* is formed to overlap with the opening of the insulator 280. Accordingly, the conductor 260 can be formed in a self-aligned manner between the conductor 242*a* and the conductor 242*b*.

The insulator 250 functions as a gate insulator. The insulator 250 is preferably placed in contact with the top surface of the metal oxide 330*c*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor

260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 is illustrated to have a two-layer structure in FIG. 30, the conductor 260 may have a single-layer structure or a stacked-layer structure of three or more layers.

For the conductor 260a, it is preferable to use the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom and an oxygen molecule).

When the conductor 260a has a function of inhibiting diffusion of oxygen, it is possible to inhibit reduction of the conductivity due to oxidation of the conductor 260b by oxygen contained in the insulator 250. As a conductive material having a function of inhibiting oxygen diffusion, for example, tantalum, tantalum nitride, ruthenium, or ruthenium oxide is preferably used.

A conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 30A and FIG. 30C, the side surface of the metal oxide 330 is covered with the conductor 260 in a region where the metal oxide 330b does not overlap with the conductor 242, that is, the channel formation region of the metal oxide 330. Accordingly, an electric field of the conductor 260 having a function of the first gate electrode is likely to act on the side surface of the metal oxide 330. Thus, the on-state current of the transistor 70C can be increased and the frequency characteristics can be improved.

The insulator 254, like the insulator 214 and the like, preferably functions as a barrier insulating film that inhibits entry of impurities such as water or hydrogen into the transistor 70C from the insulator 280 side. The insulator 254 preferably has a lower hydrogen permeability than the insulator 224, for example. Furthermore, as illustrated in FIG. 30B and FIG. 30C, the insulator 254 is preferably in contact with the side surface of the metal oxide 330c, the top surface and the side surface of the conductor 242a, the top surface and the side surface of the conductor 242b, the side surfaces of the metal oxide 330a and the metal oxide 330b, and the top surface of the insulator 224. Such a structure can inhibit entry of hydrogen contained in the insulator 280 into the metal oxide 330 through the top surfaces or side surfaces of the conductor 242a, the conductor 242b, the metal oxide 330a, the metal oxide 330b, and the insulator 224.

Furthermore, it is preferable that the insulator 254 have a function of inhibiting diffusion of oxygen (e.g., at least one of an oxygen atom and an oxygen molecule) (it is preferable that the oxygen do not easily pass through the insulator 254). For example, the insulator 254 preferably has a lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Thus, oxygen can be supplied from the region to the metal oxide 330 through the insulator 224. Here, with the insulator 254 having a function of inhibiting upward diffusion of oxygen, oxygen can be prevented from diffusing from the metal oxide 330 into the insulator 280. Moreover, with the insulator 222 having a function of inhibiting downward diffusion of oxygen, oxygen can be prevented from diffusing from the metal oxide 330 to the substrate side. In the above manner, oxygen is supplied to the channel formation region of the metal oxide 330. Accordingly, oxygen vacancies in the metal oxide 330 can be reduced, so that the transistor can be inhibited from having normally-on characteristics.

As the insulator 254, an insulator containing an oxide of one or both of aluminum and hafnium is preferably deposited, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 330 are covered with the insulator 254 having a barrier property against hydrogen, whereby the insulator 280 is isolated from the insulator 224, the metal oxide 330, and the insulator 250 by the insulator 254. This can inhibit entry of impurities such as hydrogen from the outside of the transistor 70C, resulting in excellent electrical characteristics and high reliability of the transistor 70C.

The insulator 280 is provided over the insulator 224, the metal oxide 330, and the conductor 242 with the insulator 254 therebetween. The insulator 280 preferably contains, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which are thermally stable, are preferable. In particular, materials such as silicon oxide, silicon oxynitride, and porous silicon oxide are preferably used, in which case a region containing oxygen to be released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 340a and the conductor 340b are placed in openings formed in the insulator 281, the insulator 274, the insulator 280, and the insulator 254. The conductor 340a and the conductor 340b are placed to face each other with the conductor 260 therebetween. Note that the top surfaces of the conductor 340a and the conductor 340b may be level with the top surface of the insulator 281.

The insulator 241a is provided in contact with the inner wall of the opening in the insulator 281, the insulator 274, the insulator 280, and the insulator 254, and the first conductor of the conductor 340a is formed in contact with the side surface of the insulator 241a. The conductor 242a is positioned on at least part of the bottom portion of the opening, and the conductor 340a is in contact with the conductor 242a. Similarly, the insulator 241b is provided in contact with the inner wall of the opening in the insulator 281, the insulator 274, the insulator 280, and the insulator 254, and the first conductor of the conductor 340b is formed in contact with the side surface of the insulator 241b. The conductor 242b is positioned on at least part of the bottom portion of the opening, and the conductor 340b is in contact with the conductor 242b.

The conductor 340a and the conductor 340b are preferably formed using a conductive material containing tungsten, copper, or aluminum as its main component. The conductor 340a and the conductor 340b may each have a stacked-layer structure.

In the case where the conductor 340 has a stacked-layer structure, the aforementioned conductor having a function of inhibiting diffusion of impurities such as water or hydrogen is preferably used as the conductor in contact with the metal oxide 330a, the metal oxide 330b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or a stacked layer. The use of the conductive material can inhibit oxygen added to the insulator 280 from being absorbed by the conductor 340a and the conductor 340b. Moreover, impurities such as water or hydrogen can be inhibited from entering the metal oxide 330 through the conductor 340a and the conductor 340b from a layer above the insulator 281.

As the insulator 241a and the insulator 241b, for example, the insulator that can be used as the insulator 254 or the like can be used. Since the insulator 241a and the insulator 241b are provided in contact with the insulator 254, impurities such as water or hydrogen in the insulator 280 or the like can be inhibited from entering the metal oxide 330 through the conductor 340a and the conductor 340b. Furthermore, oxygen contained in the insulator 280 can be inhibited from being absorbed by the conductor 340a and the conductor 340b.

Although not illustrated, a conductor functioning as a wiring may be placed in contact with the top surface of the conductor 340a and the top surface of the conductor 340b. For the conductor functioning as a wiring, a conductive material containing tungsten, copper, or aluminum as its main component is preferably used. Furthermore, the conductor may have a stacked-layer structure and may be a stack of titanium or titanium nitride and the above conductive material, for example. The conductor may be formed to be embedded in an opening provided in an insulator.

This embodiment can be implemented in an appropriate combination with the structures described in the other embodiments and the like.

Embodiment 5

In this embodiment, electronic devices of one embodiment of the present invention will be described with reference to FIG. 31 to FIG. 33.

An electronic device of this embodiment includes the display device of one embodiment of the present invention in a display portion. The display device of one embodiment of the present invention can be used for a display portion of a variety of electronic devices.

Examples of electronic devices include a digital camera, a digital video camera, a digital photo frame, a mobile phone, a portable game machine, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, the display device of one embodiment of the present invention can have a high resolution, and thus can be suitably used for an electronic device having a relatively small display portion. Examples of such an electronic device include a watch-type or a bracelet-type information terminal device (wearable device), and a wearable device worn on a head, such as a device for VR (Virtual Reality) such as a head-mounted display, a glasses-type device for AR (Augmented Reality), and a device for MR (Mixed Reality).

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display device of one embodiment of the present invention is preferably higher than or equal to 100 ppi, preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the use of such a display device with high definition and/or high resolution, the electronic device can have higher realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

An electronic device 6500 illustrated in FIG. 31A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

FIG. 31B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

FIG. 32A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 32A can be performed with an operation switch provided in the housing 7101 and a separate remote controller 7111.

Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 32B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 32C and FIG. 32D illustrate examples of digital signage.

Digital signage 7300 illustrated in FIG. 32C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 32D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 32C and FIG. 32D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 32C and FIG. 32D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 33A to FIG. 33F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 33A to FIG. 33F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a recording medium (an external recording medium or a recording medium incorporated in the camera), a function of displaying the taken image on the display portion, or the like.

The electronic devices illustrated in FIG. 33A to FIG. 33F will be described in detail below.

FIG. 33A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 33A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 33B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 33C is a perspective view illustrating a watch-type portable information terminal 9200. For example, the portable information terminal 9200 can be used as a Smartwatch (registered trademark). The display surface of the display portion 9001 is curved, and an image can be displayed along the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 33D to FIG. 33F are perspective views illustrating a foldable portable information terminal 9201. FIG. 33D is a perspective view of an opened state of the portable information terminal 9201, FIG. 33F is a perspective view of a folded state thereof, and FIG. 33E is a perspective view of a state in the middle of change from one of FIG. 33D and FIG. 33F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be implemented in an appropriate combination with the structures described in the other embodiments and the like.

REFERENCE NUMERALS

100: display device, 111: substrate, 112: insulating layer, 113: insulating layer, 114: insulating layer, 115: insulating layer, 116: insulating layer, 118: conductive layer, 121: substrate, 122: insulating layer, 124: FPC, 125: wiring, 126: protective layer

The invention claimed is:

1. A method for fabricating a display device comprising a first light-emitting element, a second light-emitting element, and a third light-emitting element, the method comprising:
   a first step of forming the first light-emitting element;
   a second step of forming the second light-emitting element; and
   a third step of forming the third light-emitting element,
   wherein the first step comprises:
       sequentially forming an anode, a first electroluminescent (EL) layer, a first cathode, and a first layer in order;
       forming a first resist mask over the first layer;
       selectively removing parts of the anode, the first EL layer, the first cathode, and the first layer;
       removing part of the first resist mask;
       selectively removing other parts of the first EL layer, the first cathode, and the first layer; and
       removing other remaining parts of the first resist mask,
   wherein the second step comprises:
       sequentially forming a second EL layer, a second cathode, and a second layer in order over the anode;
       forming a second resist mask over the second layer;
       selectively removing parts of the anode, the second EL layer, the second cathode, and the second layer;
       removing part of the second resist mask;
       selectively removing other parts of the second EL layer, the second cathode, and the second layer; and
       removing other remaining parts of the second resist mask, and
   wherein the third step comprises:
       sequentially forming a third EL layer, a third cathode, and a third layer in order over the anode;
       forming a third resist mask over the third layer;
       selectively removing parts of the anode, the third EL layer, the third cathode, and the third layer;
       removing part of the third resist mask;
       selectively removing other parts of the third EL layer, the third cathode, and the third layer; and
       removing other remaining parts of the third resist mask.

2. The method for fabricating the display device, according to claim 1, wherein each of the first, second, and third resist masks is formed using a multi-tone mask.

3. The method for fabricating the display device, according to claim 1, wherein the second EL layer, the second cathode, and the second layer are formed to cover the first light-emitting element in the second step.

4. The method for fabricating the display device, according to claim 1, wherein the third EL layer, the third cathode, and the third layer are formed to cover the first light-emitting element and the second light-emitting element in the third step.

5. The method for fabricating the display device, according to claim 1, wherein the first, second, and third EL layers each comprise an organic EL material.

6. The method for fabricating the display device, according to claim 1, further comprising a step of forming a fourth layer covering the first light-emitting element, the second light-emitting element, and the third light-emitting element after the first to first, second, and third steps are finished.

7. The method for fabricating the display device, according to claim 1, further comprising a step of forming a first conductive layer electrically connected to each of the first cathode, the second cathode, and the third cathode.

* * * * *